United States Patent
Omura et al.

(10) Patent No.: US 6,323,717 B1
(45) Date of Patent: Nov. 27, 2001

(54) SEMICONDUCTOR DEVICE, DRIVE METHOD, AND DRIVE APPARATUS

(75) Inventors: Ichiro Omura, Yokohama; Suzuo Saito, Tokorozawa; Hiromichi Ohashi, Yokohama; Tomokazu Domon, Yokosuka; Koichi Sugiyama, Yokohama, all of (JP); Simon Eicher, Zurich (CH); Tsuneo Ogura, Kamakura (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/312,718

(22) Filed: May 17, 1999

(30) Foreign Application Priority Data

May 18, 1998 (JP) .................................................. 10-135696
Dec. 25, 1998 (JP) .................................................. 10-371641

(51) Int. Cl.$^7$ ........................................................ H02M 1/08
(52) U.S. Cl. ........................ 327/434; 327/435; 327/436; 327/403
(58) Field of Search .................................... 327/392, 403, 327/405, 473, 489, 427, 434, 435, 436, 108, 112

(56) References Cited

U.S. PATENT DOCUMENTS

| | | | |
|---|---|---|---|
| 4,356,408 | * 10/1982 | Glennon ............................. | 327/405 |
| 4,616,142 | * 10/1986 | Upadhyay et al. ................. | 327/405 |
| 5,341,004 | * 8/1994 | Furuhata et al. ................... | 257/139 |
| 5,398,318 | * 3/1995 | Hiraishi et al. ..................... | 326/82 |
| 5,608,237 | * 3/1997 | Aizawa et al. ..................... | 257/132 |
| 5,832,305 | * 11/1998 | Briggs et al. ...................... | 710/51 |
| 5,894,149 | * 4/1999 | Uenishi et al. .................... | 257/331 |
| 5,953,490 | * 9/1999 | Wiklund et al. ................... | 318/138 |

FOREIGN PATENT DOCUMENTS 195 43 702    5/1997  (DE) .

OTHER PUBLICATIONS

I. Omura, et al., Integrated Systems Laboratory, pps. 2066–2069, "IGBT Instability Due to Negative Gate Capacitance," Sep. 8, 1997.
I. Omura, et al., IEEE Electron Device Letters, vol. 18, No. 12, pps. 622–624, "IGBT Negative Gate Capacitance and Related Instability Effects," Dec. 1997.
I. Omura, et al., IEEE Transactions on Electron Devices, vol. 46, No. 1, pps. 237–244, "Oscillation Effects in IGBT's Related to Negative Capacitance Phenomena," Jan. 1999.
S. Linder, et al., ABB Semiconductors AG, pps 1117–1124, "A New Range of Reverse Conducting Gate–Commutated Thyristors for High–Voltage, Medium Power Applications," Sep. 8, 1997.
A. Nakagawa, et al., IEDM, pps. 150–153, "Experimental and Numerical Study of Non–Latch–Up Bipolar–Mode MOSFET Characteristics," 1985.

* cited by examiner

*Primary Examiner*—Tuan T. Lam
(74) *Attorney, Agent, or Firm*—Oblon, Spivak, McClelland, Maier & Neustadt, P.C.

(57) ABSTRACT

According to this invention, there is provided a drive apparatus for a power device having high- and low-voltage main electrodes and a control electrode, including a circuit for decreasing a voltage of the control electrode to a voltage of the control electrode which is not higher than a threshold voltage of the power device before a voltage between the high- and low-voltage main electrodes enters an overshoot region in a case where the power device is to be turned off. Therefore, electron injection can be stopped before the voltage between the main electrodes rises, the stability of the current density can be improved, and current concentration, oscillation, and the like can be prevented to improve reliability.

21 Claims, 58 Drawing Sheets

V1: GATE VOLTAGE 5V/div
V2: INDUCTANCE VOLTAGE 50V/div
H: 100ns/div

SEMICONDUCTOR DEVICE, DRIVE METHOD, AND DRIVE APPARATUS

BACKGROUND OF THE INVENTION

The present invention relates to a semiconductor device used to control high power and a drive method and drive apparatus.

Recently, IGBTs (Insulated Gate Bipolar Transistors) and IEGTs (Injection Enhanced Gate Transistors) have received a great deal of attention as power control semiconductor devices. These IGBT and IEGT are bipolar devices with MOS structures, and have the high-speed switching characteristics of the power MOSFET and the high-breakdown voltage, short-turn-on time characteristics of the bipolar transistor. For this reason, the IGBT and IEGT can be applied to power converters such as an inverter. The IGBT will be exemplified.

FIG. 1 is a circuit diagram showing the arrangement of a general inverter. High-side IGBT1 and low-side IGBT2, which respectively have reflux diodes D1 and D2 and gate resistances RG1 and RG2, are series-connected to a power supply voltage Vcc.

As for low-side IGBT2, a gate voltage of ±15V is applied to IGBT2 from a gate drive circuit (not shown) via the gate resistance RG2 to flow (ON) or cut off (OFF) a collector current Ic flowing through IGBT2 in correspondence with the gate signal. For example, if a positive gate signal is applied to a gate G of IGBT2, the collector current Ic flows to turn on IGBT2; if a negative gate signal is applied, the collector current Ic is cut off to turn off IGBT2.

When the gate signal changes from negative to positive, IGBT2 is turned on. IGBT2 shifts from the OFF state to the ON state to flow the collector current Ic. When the gate signal changes from positive to negative, IGBT2 is turned off. IGBT2 shifts from the ON state to the OFF state to cut off the collector current Ic.

FIG. 2 is a waveform chart showing an example of the turn-off waveform of the IGBT. FIG. 3 is a sectional view showing the structure of the IGBT for explaining turn-off operation. As shown in FIG. 3, the IGBT is constituted by forming a heavily doped p-type emitter layer 2 on one surface of a lightly doped n-type base layer 1 and forming a collector electrode 3 on the p-type emitter layer 2.

A p-type base layer 4 is selectively formed on the other surface of the n-type base layer 1, and a heavily doped n-type source layer 5 is formed on the surface of the p-type base layer 4. A gate electrode 7 is formed on the p-type base layer 4 between the n-type source and base layers 5 and 1 via a gate oxide film 6. An emitter electrode 8 is formed on the n-type source layer 5 and p-type base layer 4.

In this IGBT, if the gate signal supplied from the gate drive circuit changes from +15V to −15V, a gate voltage $V_G$ of IGBT2 connected to the gate drive circuit via the RB first falls to a given value (time t1) and keeps this value for a while (time t2). In this specification, this constant $V_G$ period (time t1 to t2) is called a mirror time in the MOSFET mode. During the mirror time in the MOSFET mode, a collector voltage $V_{CE}$ rises to about 15V.

After that, in the IGBT, a depletion layer having a high electric field starts extending from below the gate oxide film 6 and p-type base layer 4 into the n-type base layer 1, and the collector voltage $V_{CE}$ abruptly rises (from time t2). At the same time, the gate voltage $V_G$ starts gradually falling but is still higher than a threshold voltage Vth of the IBGT.

If the collector voltage is clamped by the diode, the collector current Ic is commutated to the diode (D1 in FIG. 1) and cut off. At the same time, the gate current also abruptly falls (time t3), and the gate voltage $V_G$ falls to the threshold voltage Vth or less (from time t3). In this specification, the period (time t2 to t3) required to reach the threshold voltage Vth of the IGBT after the gate voltage $V_G$ starts falling is called a mirror time in the IGBT mode.

This switching method is used in all current IGBTs. The switching method is advantageous in small drive force of the gate drive circuit and switching control-lability by the gate resistance RG. Particularly, this method is most easily, widely used in low-resistance, small-capacity IGBTs. Conventionally, RG is generally set large in order to stably operate devices such as the IGBT, which is adopted in all device applications at present.

However, the present inventors have studied to find that this switching method poses serious problems in stability upon switching. FIG. 3 shows carriers inside the device in the mirror time in the IGBT mode, in addition to the structure of the IGBT. Since the gate voltage $V_G$ is higher than the threshold voltage Vth, electrons are still injected (e− in FIG. 3), while holes flow from the collector side (h+ in FIG. 3). Thus, both holes and electrons exist in the high electric field (depletion layer). The presence of both holes and electrons degrades stability. Note that the broken line in FIG. 3 represents that the n-type base layer 1 above the broken line is in a high electric field and accumulated carriers remain in the n-type base layer 1 below the broken line.

For example, a space charge density ρ in the high electric field is given by equation (1) using a donor density $N_D$ in the n-type base layer 1, a hole density p in the high electric field, and an electron density n in the high electric field:

$$\rho=q(N_D+p-n) \quad (1)$$

A voltage applied to the IGBT is obtained by dividing the integrated value of the space charge density ρ in the high electric field by a silicon permittivity $\epsilon_{Si}$.

A current density J is given by equation (2) using an electronic current density Jn in the high electric field, a hole current density Jp in the high electric field, and a carrier saturation rate vs (about $10^7$ cm/s):

$$J=Jn+Jp=q\cdot vs(p+n) \quad (2)$$

In this case, it should be noted that holes and electrons have opposite charge polarities and cancel each other, i.e., are represented by the difference (p−n) as for the space charge density ρ, like equation (1), whereas holes and electrons have the same elementary electric charges and can be represented by the sum (p+n) of the hole and electron densities as for the current density J in the high electric field, like equation (2).

This shows that even if the electric field distribution inside the device keeps a constant value under conditions such as the collector voltage $V_{CE}$, the current density is not determined in one-to-one correspondence but has a high degree of freedom, i.e., the current density cannot be made constant.

Further, if the collector voltage $V_{CE}$ and collector current Ic are positively fed back to the gate, the current density varies to make the stability of the current density J more unstable, and the current concentrates to destruct the device.

Next, various problems arising when the current capacity and breakdown voltage of one IGBT increase along with a larger capacity of the IGBT will be explained.

In recent years, since the current capacity of the IGBT increases, a plurality of IGBT chips are parallel-connected in one IGBT package (one device). For example, 4 to 6 chips are parallel-connected in the package for a 1,700-V, 400-A IGBT, about 6 chips are parallel-connected for a 2,000-V, 400-A IGBT, and 20 to 24 chips are parallel-connected for a 3.3-kV, 1,200-A IGBT. Each chip generally has a size of about 7 to 15 mm square. Connecting a larger number of chips increases the package size.

FIG. 4 is a circuit diagram showing the arrangement of IGBT1 and IGBT2 for two chips or devices that are parallel-connected. Gates G1 and G2 of the IGBT1 and IGBT2 are combined into one via corresponding gate resistances RG1 and RG2, and this gate is properly connected to a gate drive circuit via a resistance (not shown).

FIG. 5 shows the turn-off waveform of this circuit. The difference between the gate voltages $V_{G1}$ and $V_{G2}$ of the two IGBT1 and IGBT2 increases in the mirror time in the IGBT mode to make collector currents Ic1 and Ic2 greatly different and nonuniform between the two IGBT1 and IGBT2.

Such nonuniform current between the IGBT1 and IGBT2 does not pose any problem as far as one IGBT can cut off a double current. However, if a larger number of chips are parallel-connected, a current of several ten times compared to the ON state may flow upon switching one IGBT, and may destroy the device.

FIG. 6 schematically shows the carrier and electric field inside the device in the mirror time in the IGBT mode. Since the collector voltage VCE is shared in parallel connection, the two IGBT1 and IGBT2 have almost the same electric field distribution in the n-type base layer. Therefore, their space charge densities ρ are substantially equal to each other, but the internal current densities J may become greatly different.

That is, although feedback from the collector flows electrons and holes in a large amount through one IGBT1 and in a small amount through the other IGBT2, the difference between the numbers of holes and electrons may be the same in IGBT1 and IGBT2.

Another example of the cause of nonuniform current is oscillation. FIG. 7 is a waveform chart showing an example of oscillation. In this phenomenon, even if the current becomes nonuniform between chips or parallel devices inside the package, no nonuniform current can be observed by measurement outside the package.

For this reason, the nonuniform current phenomenon has not been known so far. However, the present inventors have simulated to clear up the cause, as described above, and reproduces this phenomenon.

For example, the present inventors observed by simulation turn-off behavior in the arrangement in which the two IGBT1 and IGBT2 were parallel-connected, as shown in FIG. 8A. If 0.5-V very small spike noise 4 ns in width was mixed in the gate voltage of one IGBT2 250 ns after turn-off operation as shown in FIG. 8B, unbalance between the two IGBTs widened over time after 250 ns to generate nonuniform current and a oscillation phenomenon, as shown in FIG. 9.

Even if the application time of spike noise shifted to 150-ns time, nonuniform current and the oscillation phenomenon similarly appeared after 250 ns (the mirror time in the IGBT mode).

The same problem arises as not only nonuniform current in parallel connection but also nonuniform shared voltages $V_{CE1}$ to $V_{CEn}$ upon switching when IGBT1 to IGBTn are series-connected, as shown in FIGS. 10 to 12.

As described above, the semiconductor device drive method suffers an unstable current density, current concentration, and the like for one IGBT (one chip).

When a plurality of IGBTs are parallel-connected, current concentration, the oscillation phenomenon, and the like occur to greatly degrade the device characteristics, and particularly, the cut-off current.

When a plurality of IGBTs are series-connected, the shared voltages become nonuniform.

BRIEF SUMMARY OF THE INVENTION

The present invention has been made in consideration of the above situation, and has as its object to provide a semiconductor device capable of improving the stability of the current density and preventing current concentration, oscillation, and the like to improve reliability, and a drive method and drive apparatus.

To achieve the above object, according to the first aspect of the present invention, there is provided a drive apparatus for a power device having high- and low-voltage main electrodes and a control electrode, comprising a circuit for decreasing a voltage of the control electrode to a voltage of the control electrode which is not higher than a threshold voltage of the power device before a voltage between the high- and low-voltage main electrodes enters an overshoot region in a case where the power device is to be turned off.

According to the first aspect of the present invention, the voltage of the control electrode is decreased to the threshold voltage of the power device or less before the voltage between the high- and low-voltage main electrodes enters the overshoot region in a case where the power device is to be turned off. Therefore, electron injection can be stopped before the voltage between the main electrodes rises, the stability of the current density can be improved, and current concentration, oscillation, and the like can be prevented to improve reliability.

According to the second aspect of the present invention, there is provided a drive apparatus for a plurality of power devices each of which has high- and low-voltage main electrode and control electrode, the plurality of power devices being parallel-connected to each other, the drive apparatus comprising gate drive circuits which are respectively arranged in a plurality of device units respectively including a part of the plurality of power devices, and supply drive signals to the control electrodes of the power devices in corresponding device units.

According to the second aspect of the present invention, the gate drive circuits are respectively arranged in units of a plurality of device units respectively including a plurality of power devices, and supply drive signals to the control electrodes of the power devices in corresponding device units. The parasitic inductance of wiring can be reduced to easily, reliably obtain the same effects as the effects of the first aspect.

According to the third aspect of the present invention, there is provided module having a plurality of bipolar device chips each of which has high- and low-voltage main electrode and insulated gate control electrode, the plurality of bipolar device chips being parallel-connected to each other, the module comprising:

an insulating board arranged between the bipolar device chips;

a gate wiring pattern printed on the insulating board; and a gate wiring line for electrically connecting the gate wiring pattern and the control electrode.

According to the third aspect, the gate wiring pattern is formed at the gap of the chip layout via the insulating board, and the gate wiring pattern and control electrode are connected by the gate wiring line. This structure can reduce the resistance and inductance with respect to the gates of all chips to uniformly operate many chips.

Note that turn-off operation in the present invention means turn-off operation in normal operation (rated operation).

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION (First Embodiment)

Figure 2:
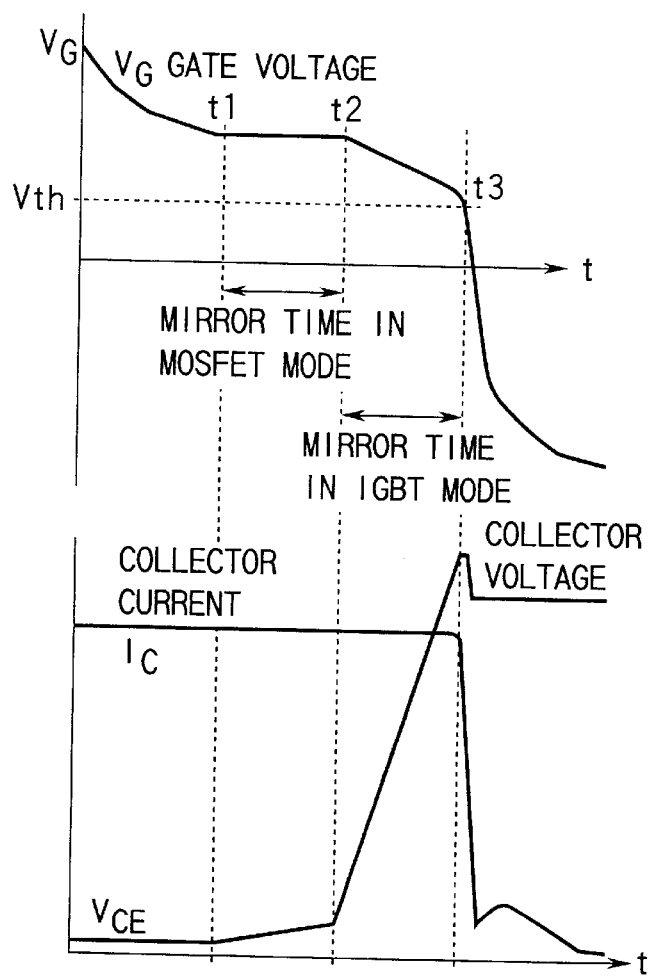
FIG. 2 is a waveform chart showing an example of the turn-off waveform of a conventional IGBT.
Figure 3:
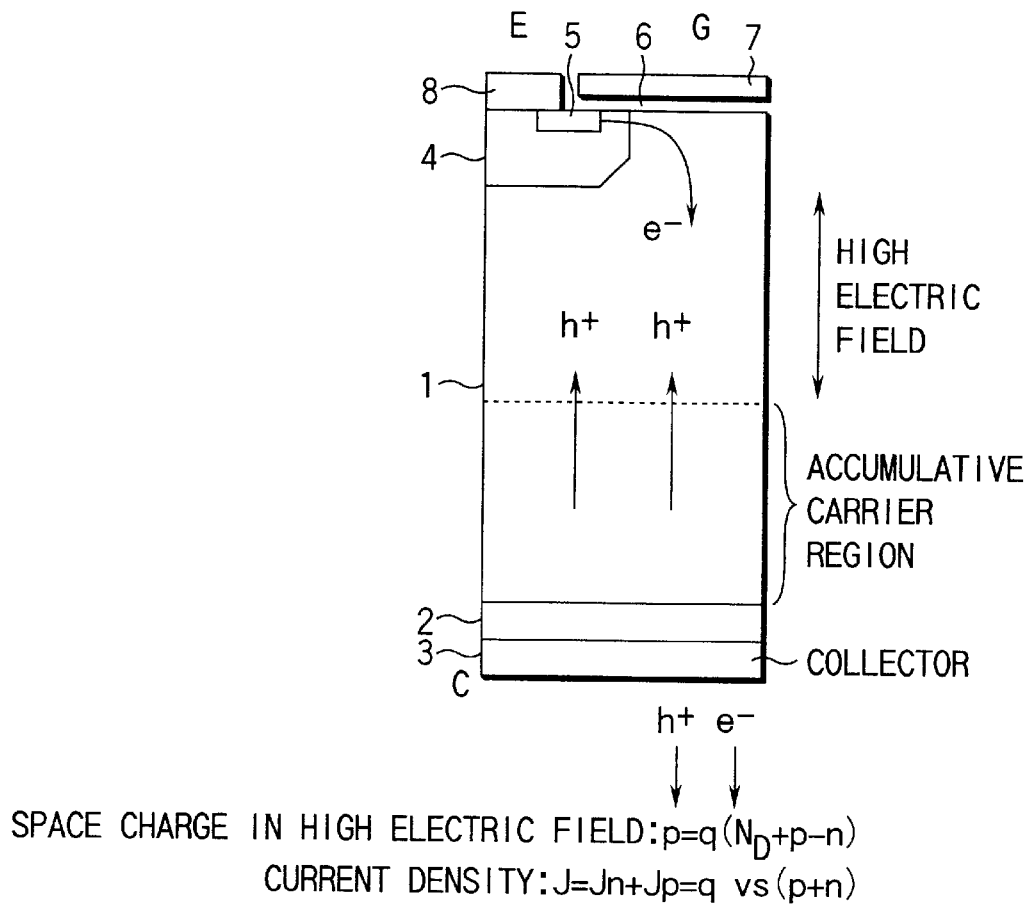
FIG. 3 is a sectional view showing the structure of the IGBT for explaining conventional turn-off operation.
Figure 4:
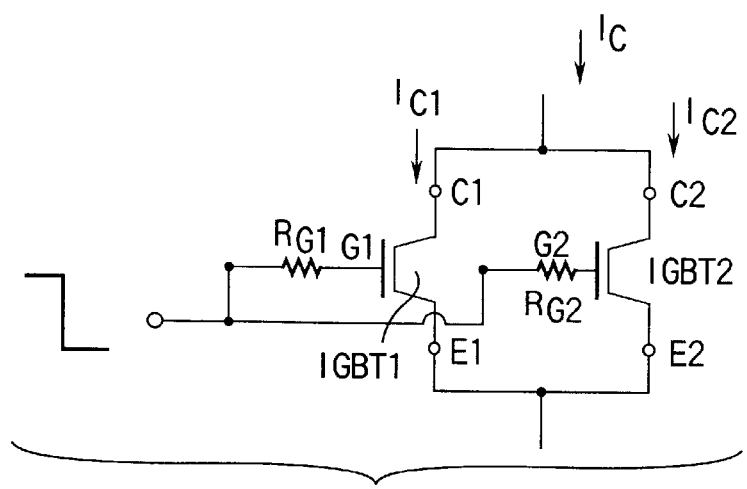
FIG. 4 is a circuit diagram showing the arrangement of two conventional IGBTs parallel-connected.
Figure 5:
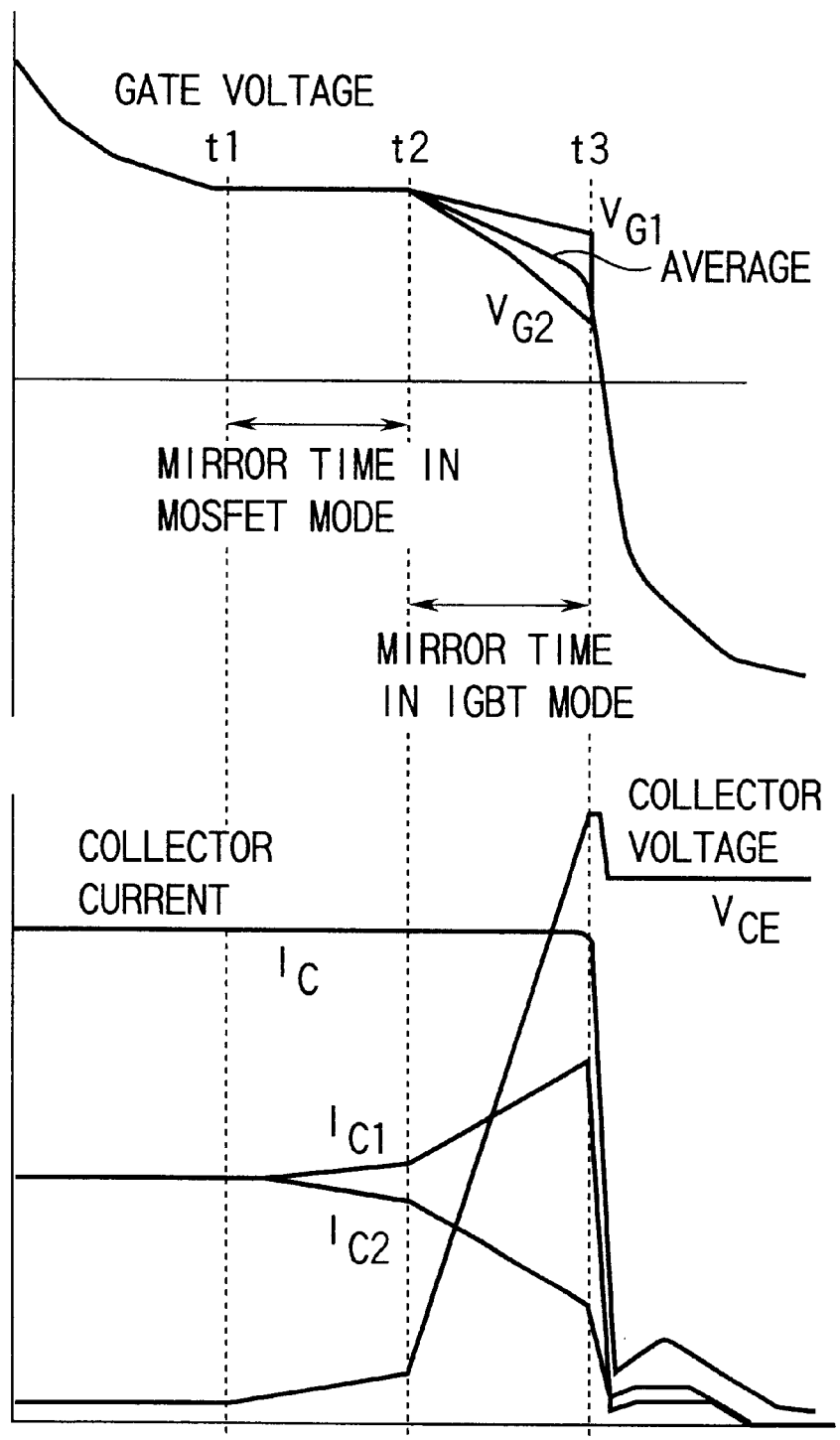
FIG. 5 is a waveform chart showing a turn-off waveform in the conventional circuit in FIG. 4.
Figure 6:
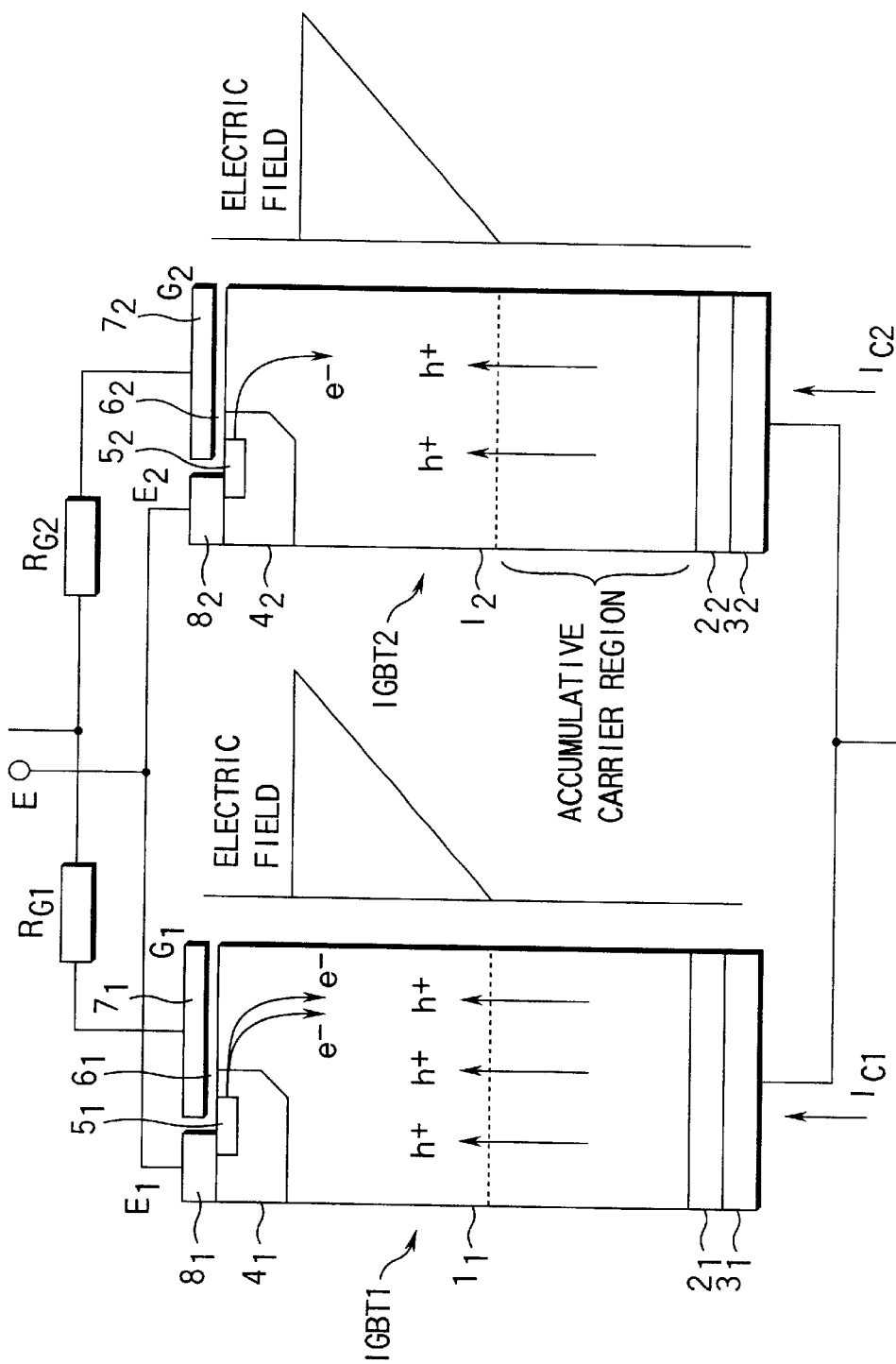
FIG. 6 is a sectional view showing the internal state of the conventional device.
Figure 7:
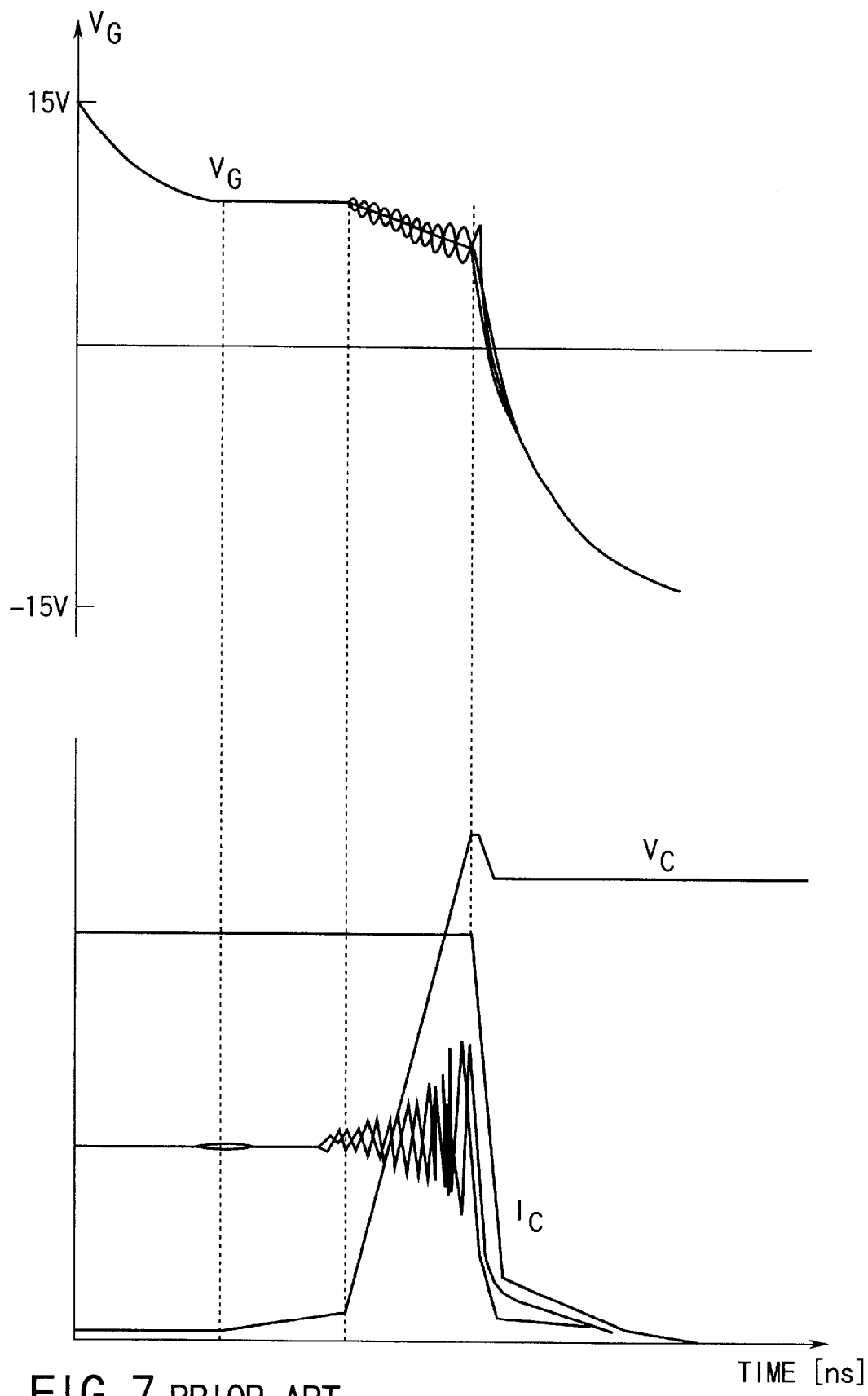
FIG. 7 is a waveform chart showing an example of conventional oscillation.
Figure 8A:
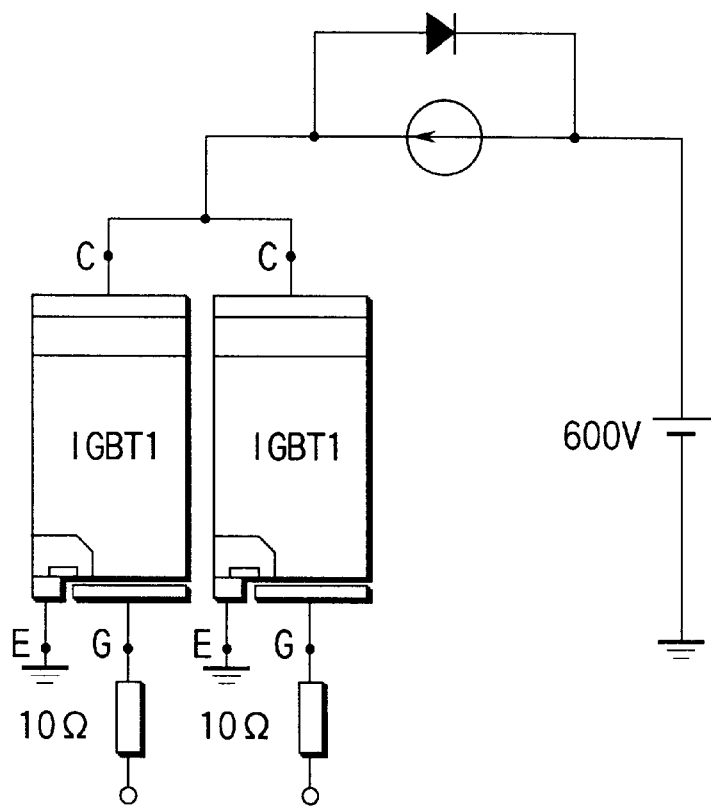
FIG. 8A is a view showing the simulation arrangement of conventional parallel connection.
Figure 8B:
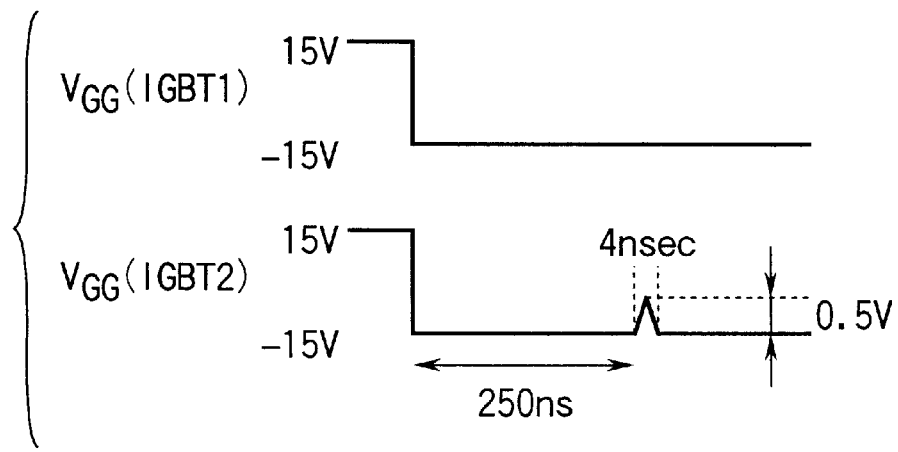
FIG. 8B is a view showing a voltage waveform being applied to the IGBTs of the simulation arrangement.
Figure 9:
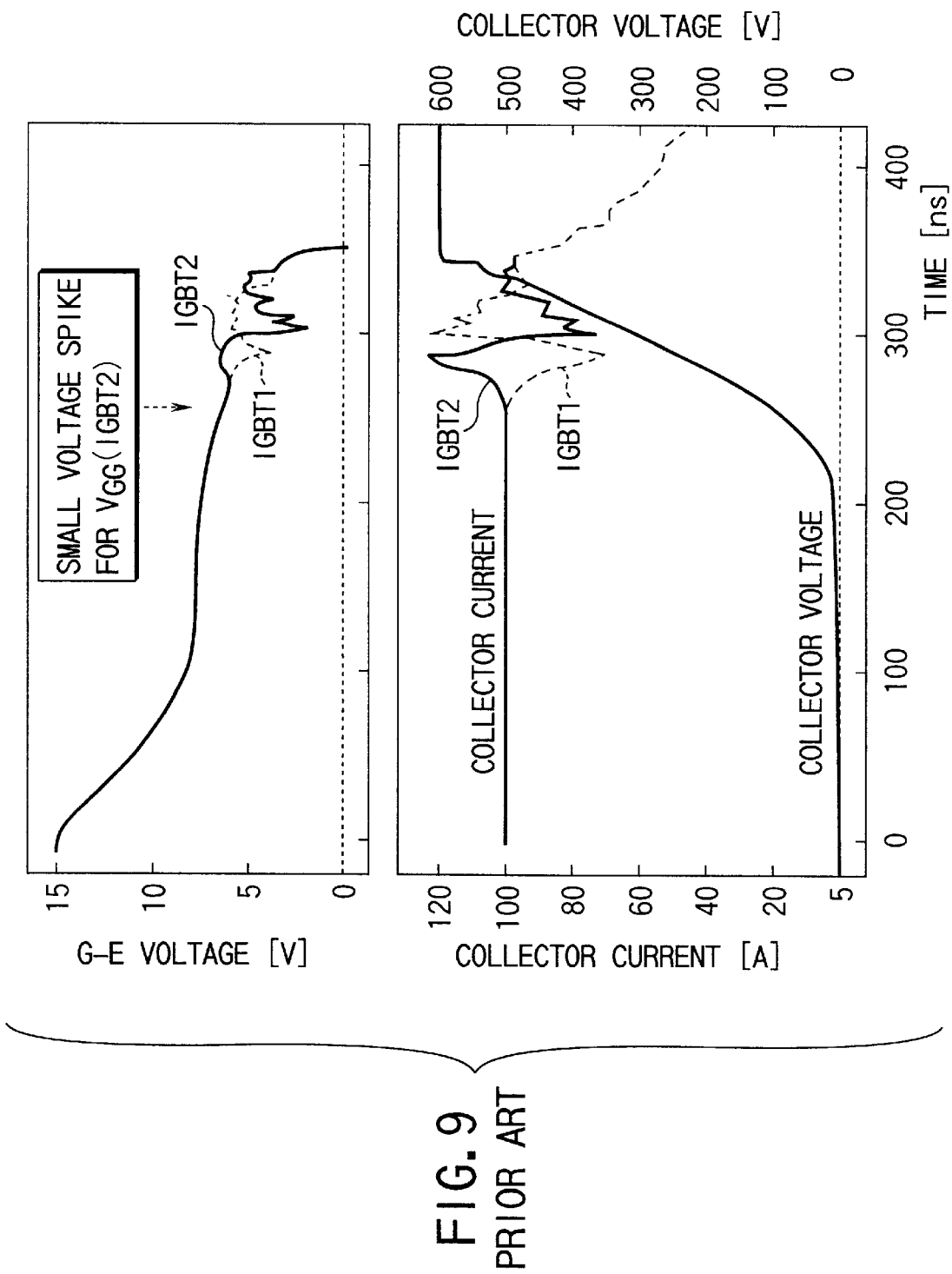
FIG. 9 is a waveform chart showing the simulation results of conventional parallel connection in FIG. 8A.
Figure 10:
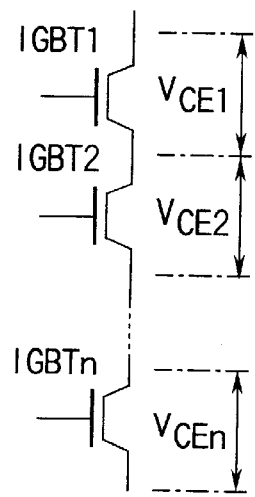
FIG. 10 is a circuit diagram for explaining a conventional nonuniform shared voltage.
Figure 12:
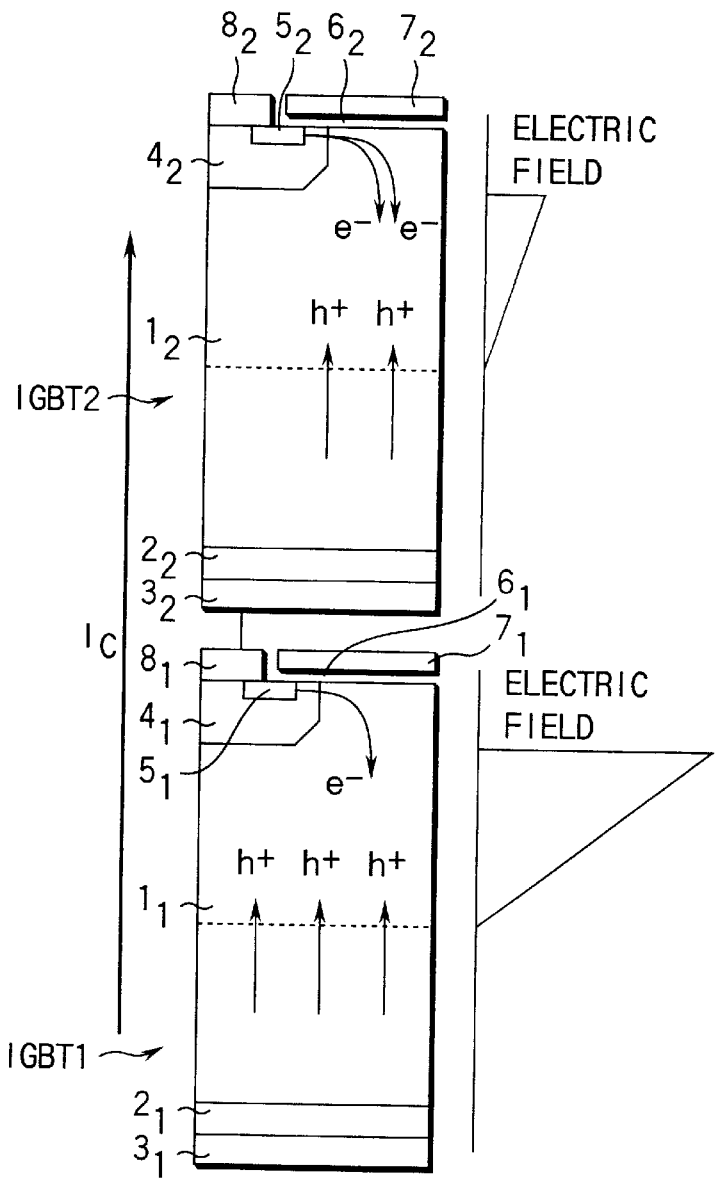
FIG. 12 is a sectional view for explaining the conventional nonuniform shared voltage.
Figure 11:
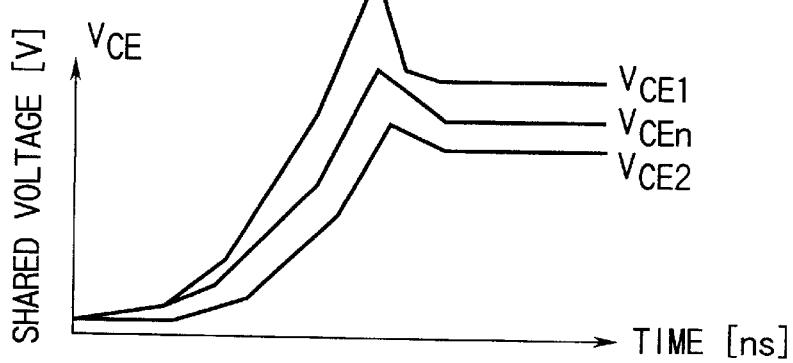
FIG. 11 is a graph for explaining the conventional nonuniform shared voltage.
Figure 13:
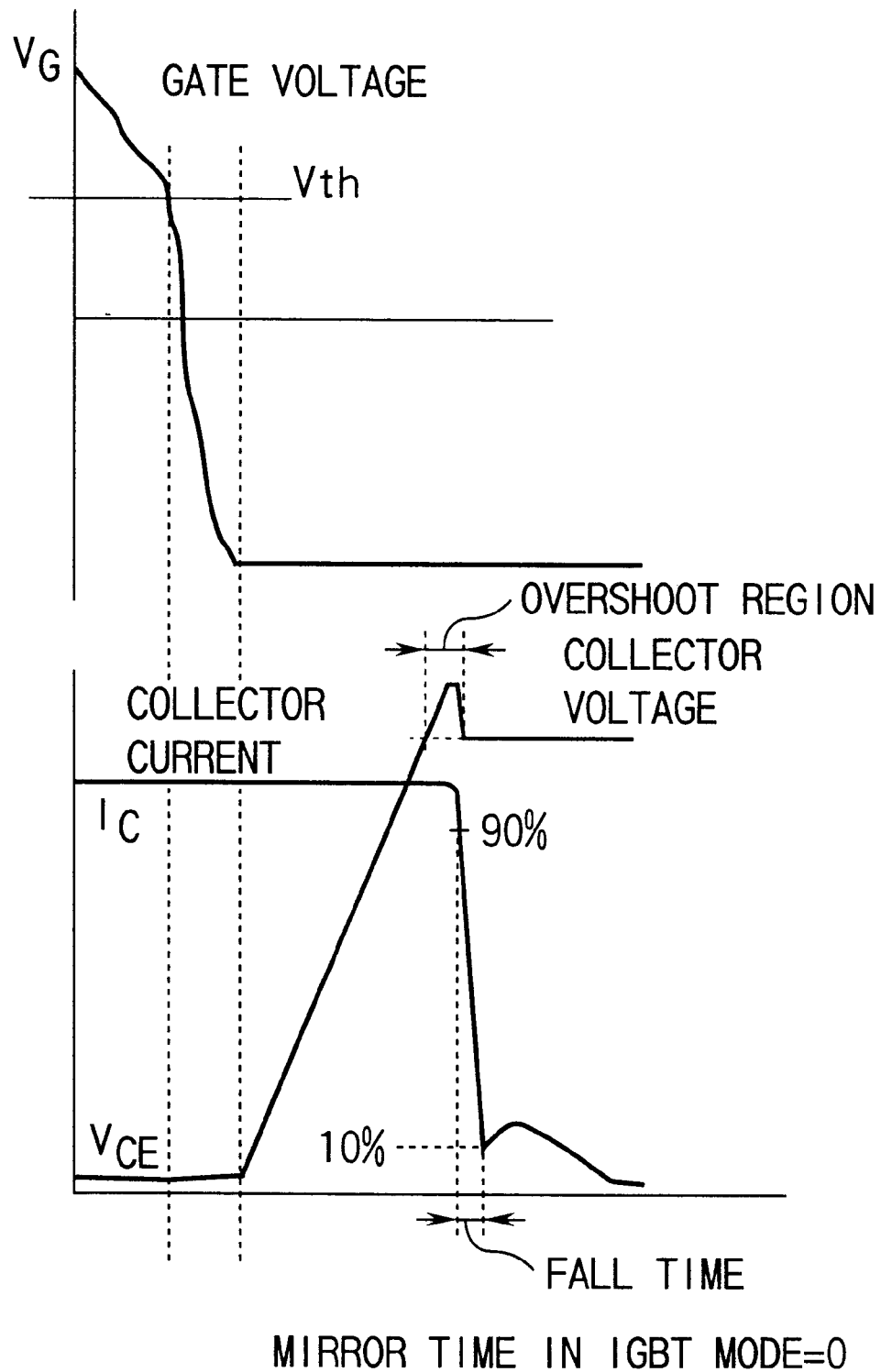
FIG. 13 is a waveform chart for explaining a semiconductor device drive method according to the first embodiment of the present invention.

FIG. 13 is a waveform chart for explaining a semiconductor device drive method according to the first embodiment of the present invention. The same reference numerals as in FIGS. 2 and 5 denote the same parts, a detailed description thereof will be omitted, and only the difference will be described. Also in the following embodiments, a repetitive description will be omitted.

The first embodiment decreases the gate voltages of a plurality of parallel-connected IGBTs to the threshold voltage Vth or less upon turn-off operation before the collector voltage $V_{CE}$ starts rising, as shown in FIG. 13, in order to prevent current concentration and the oscillation phenomenon resulting from an unstable current density. Note that the threshold voltage Vth is a gate voltage necessary to flow the collector current through the IGBT, i.e., a gate voltage which is gradually increased to start flowing the collector current while the collector voltage VCE is applied between the collector and emitter.

The first embodiment can be rewritten into (i) and can be modified into (ii) or (iii).

(i) The first embodiment is a drive method in which the mirror time in the IGBT mode in the prior art is eliminated or shortened and electron injection is stopped before the collector voltage VCE rises.

(ii) The first embodiment is a drive method in which the gate voltage is decreased to the threshold voltage Vth or less to stop electron injection before the collector current Ic shifts to the fall time. The fall time is a period required for the main current to decrease 10% after decreasing 90%, as shown in FIG. 13.

Figure 1:
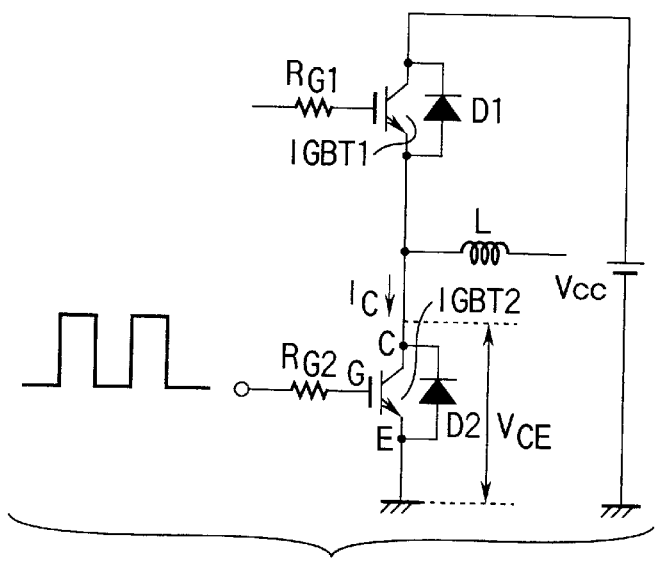
FIG. 1 is a circuit diagram showing the arrangement of a general inverter.

(iii) The first embodiment is a drive method in which the gate voltage is decreased to the threshold voltage Vth or less to stop electron injection before the collector voltage $V_{CE}$ enters the overshoot region upon turn-off operation (before $V_{CE}$ first exceeds the DC voltage of a converter after the start of turn-off operation). The overshoot region is a period during which the device voltage becomes higher than the application voltage Vcc of a normal inverter (see FIG. 1), and the device is often destroyed in this overshoot region.

Figure 14:
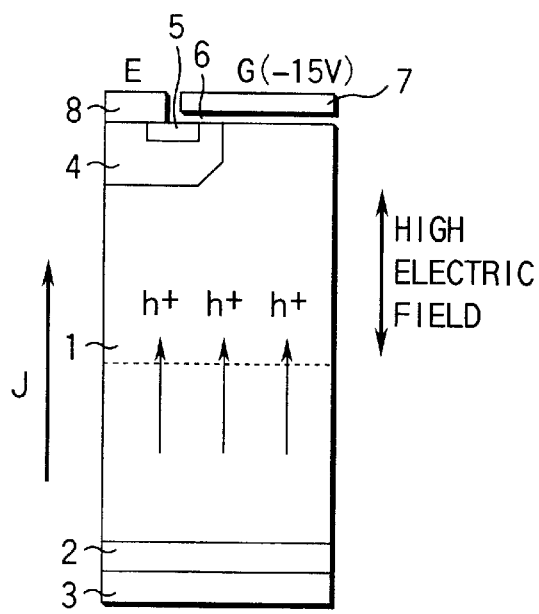
FIG. 14 is a sectional view showing the internal state of the IGBT in the first embodiment.

FIG. 14 shows the internal state of the IGBT while the collector voltage $V_{CE}$ rises. Since the gate voltage is decreased to the threshold voltage Vth or less before the collector voltage VCE rises, only holes flow through the high electric field region without flowing any electrons while the collector voltage $V_{CE}$ rises. Hence, the space charge density ρ in the high electric field is determined by only the hole density p. Since the current Ic is generated by movement of holes in the high electric field at the saturation rate vs, the current value is determined by the product of the hole density p, elementary electric charge amount q, and hole saturation rate vs. That is, the high electric field distribution and current value attain one-to-one correspondence using the hole density p as a parameter. This can be given by equation (3):

$$\rho = q(N_D + p) = q \cdot N_D + Jvs \qquad (3)$$

At this time, the collector voltage $V_{CE}$ is obtained by dividing the integrated value of the space charge density ρ along the electric field by the permittivity $\epsilon_{Si}$. The current unifying mechanism operates to maintain the current Ic flowing through the IGBT at a constant value by the collector voltage $V_{CE}$.

While, therefore, the collector voltage $V_{CE}$ rises, currents Ic1 and Ic2 uniformly flow through the parallel-connected IGBT1 and IGBT2, and the uniformity is kept after that.

Figure 15:
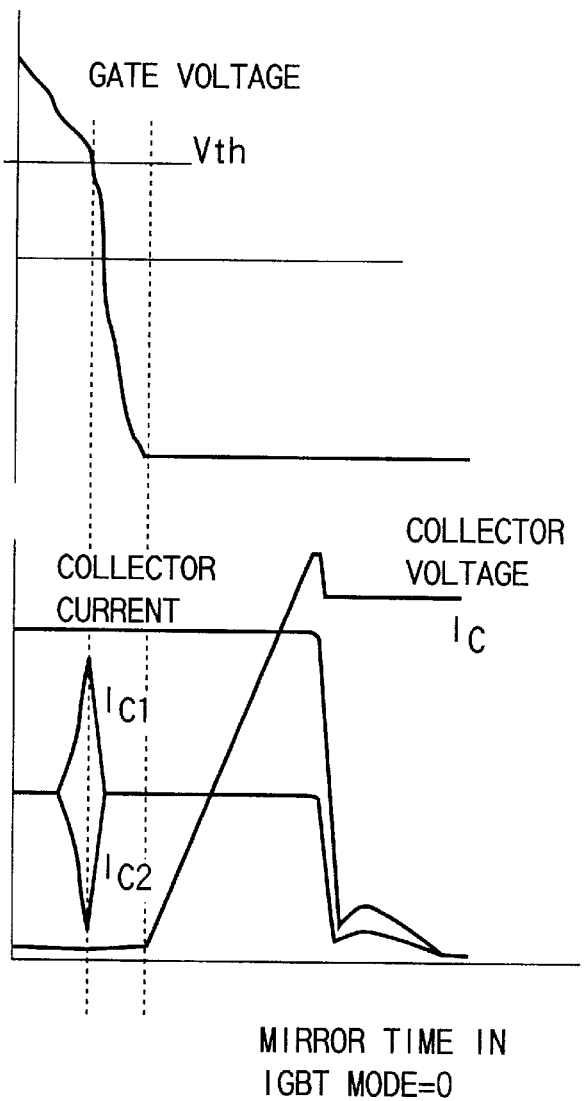
FIG. 15 is a waveform chart for explaining disappearance of a nonuniform current in the first embodiment.
Figure 16:
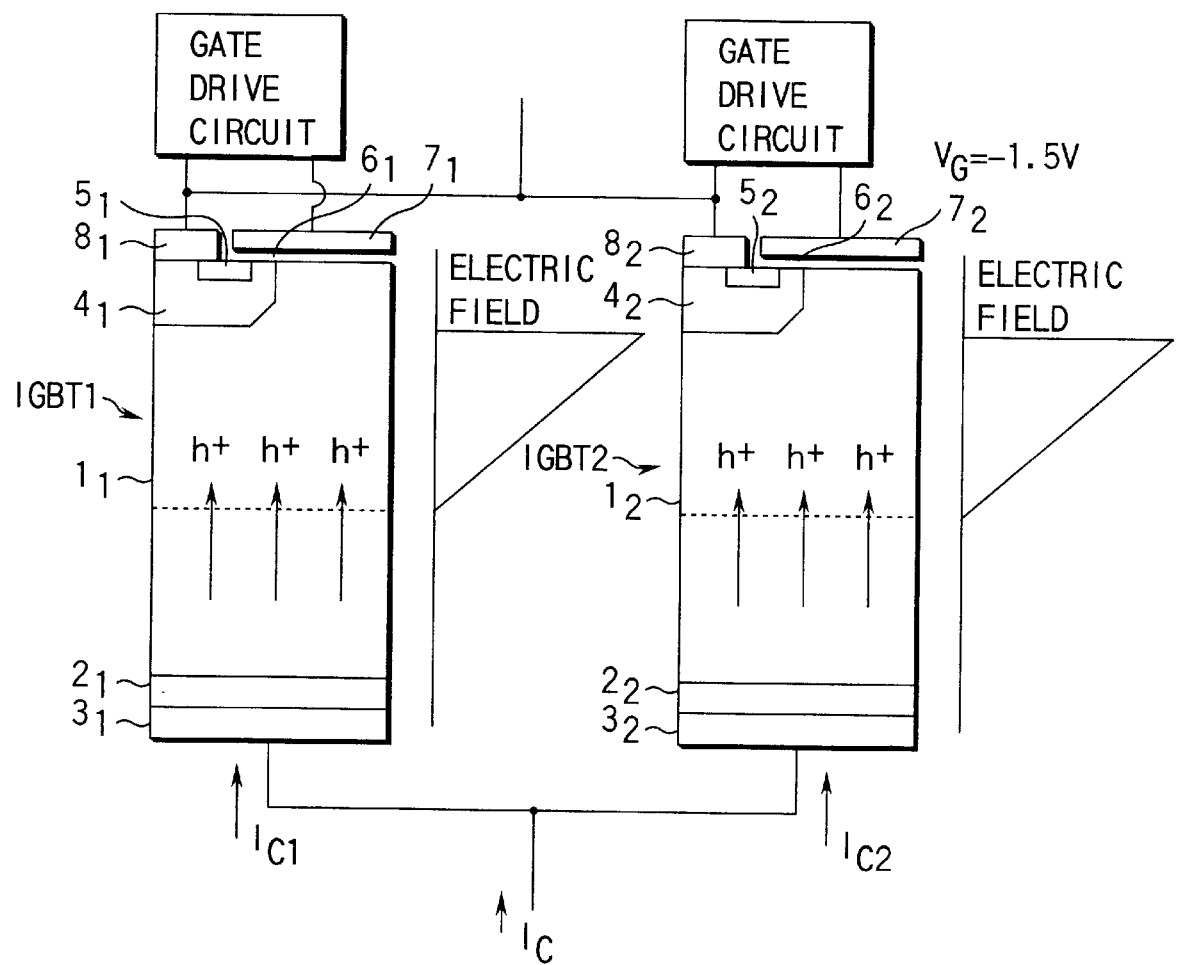
FIG. 16 is a sectional view showing the internal state of the IGBT in parallel connection in the first embodiment.

Even if the characteristics and accumulative charges change due to the difference in temperature between the parallel-connected IGBT1 and IGBT2, current nonuniformity by this change appears only before the collector voltage $V_{CE}$ rises, and disappears when the gate voltage $V_G$ is decreased to the threshold voltage Vth or less, as shown in FIG. 15. This is because when the gate voltage $V_G$ is decreased to the threshold voltage Vth or less, electron injection is stopped to operate the stabilization mechanism for determining the current by only movement of holes, as shown in FIGS. 15 and 16.

When the collector voltage VCE, which may destroy the device, has risen, the current can be made uniform to minimize generation of destruction.

Figure 17:
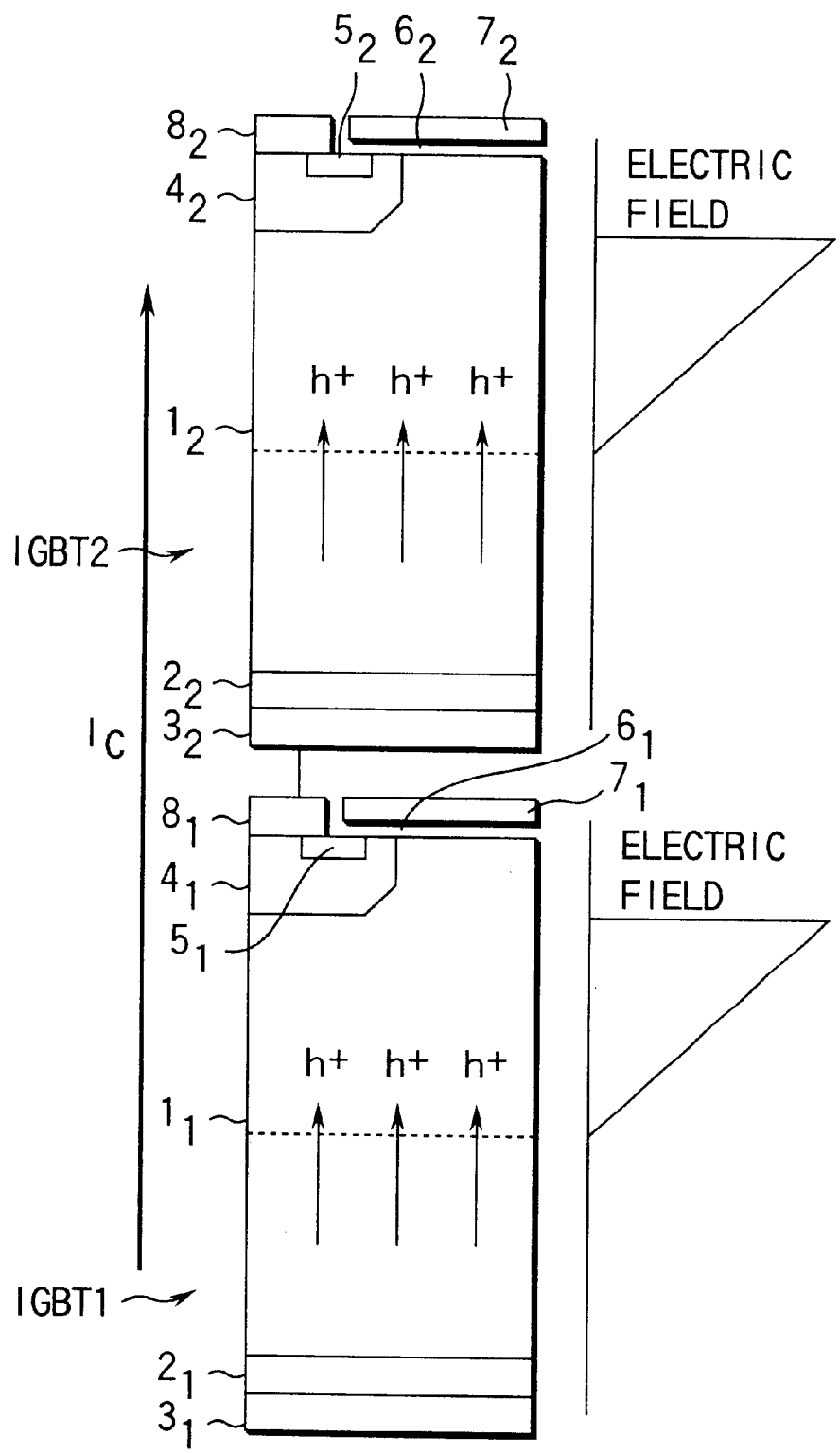
FIG. 17 is a sectional view showing the internal state of the IGBT in series connection in the first embodiment.

Also in series connection, this stabilization mechanism operates. In series connection, the same current Ic flows through IGBT1 and IGBT2, as shown in FIG. 17. For the opposite reason from parallel connection, the internal space charge density ρ becomes uniform. Accordingly, voltages shared by the IGBTs can be made uniform.

The present inventors have found that the ratio IG(peak)/Ic of the maximum value (peak value IG(peak)) of the gate current flowing upon driving the gate to the collector current Ic is a principal condition for improving the current uniformity between parallel-connected IGBTs.

Figure 18:
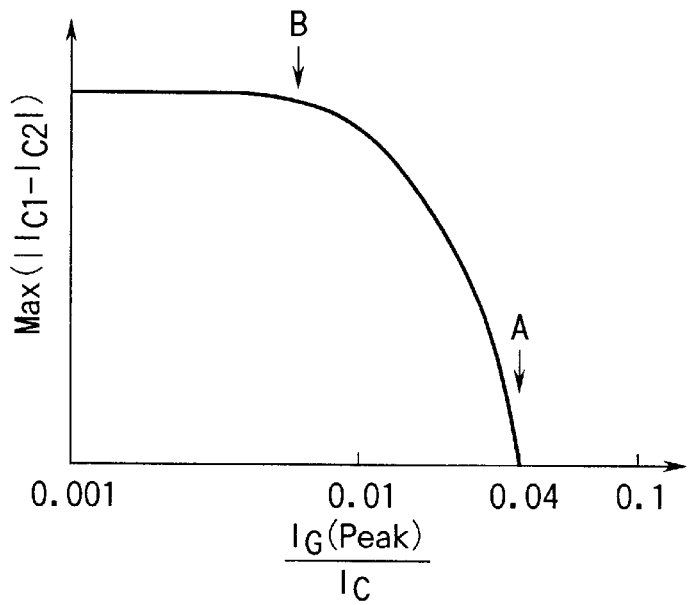
FIG. 18 is a graph showing the dependency of the difference in collector current on the ratio IG(peak)/Ic in the first embodiment.
Figure 19:
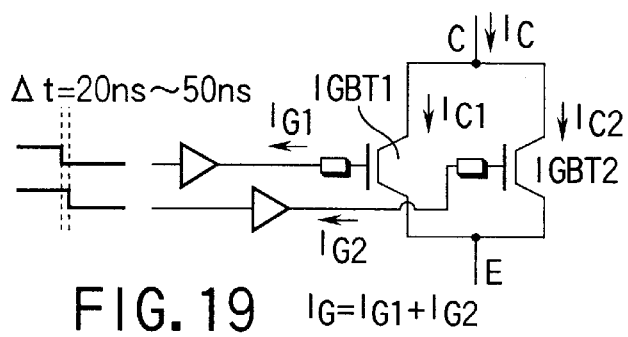
FIG. 19 is a circuit diagram for explaining the dependency in FIG. 18 in the first embodiment.

FIG. 18 is a graph showing the dependency of the difference in collector current between IGBTs on the ratio IG(peak)/Ic. As shown in FIG. 18, the difference in collector current upon switching starts decreasing from a ratio of 0.008 (point B) (for a 3.3-kV device), and completely disappears at 0.04 or more (point A). The graph is obtained from experiment and simulation. In obtaining this graph, the gate signal is supplied at input timings with an interval of about 20 ns to 50 ns upon turn-off operation in order to intentionally make the collector currents Ic1 and Ic2 non-uniform in the parallel-connected IGBT1 and IGBT2, as shown in FIG. 19. Nevertheless, when the ratio of the gate current (peak value) to the collector current exceeds 0.04, the collector current becomes uniform.

Figure 21:
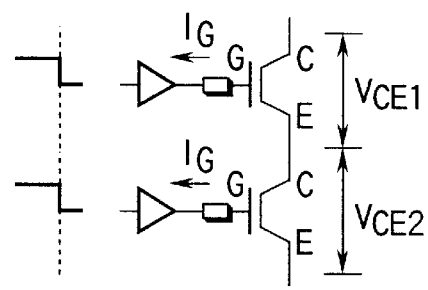
FIG. 21 is a circuit diagram for explaining the dependency in FIG. 20 in the first embodiment.
Figure 20:
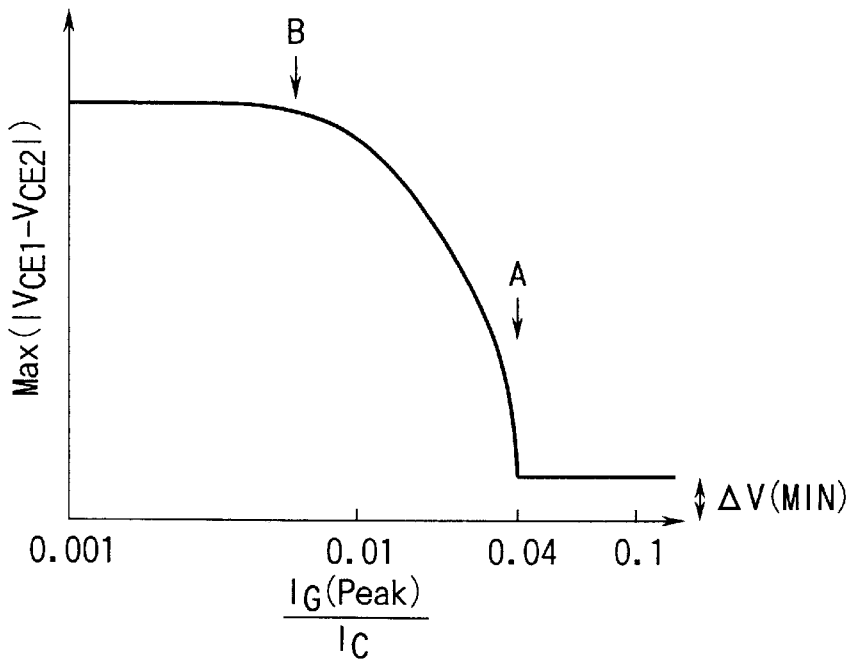
FIG. 20 is a graph showing the dependency of the difference in shared voltage on the ratio IG(peak)/Ic in the first embodiment.

The present inventors have attained the same results as for the shared voltages of IGBT1 and IGBT2 in series connection. That is, as shown in FIGS. 20 and 21, nonuniformity of the shared voltage starts improving from point B and minimizes at point A of 0.04. The difference in shared voltage between IGBT1 and IGBT2 cannot be completely eliminated owing to the difference in characteristics such as carrier amount between IGBT1 and IGBT2, but is greatly improved compared to the prior art.

Figure 22:
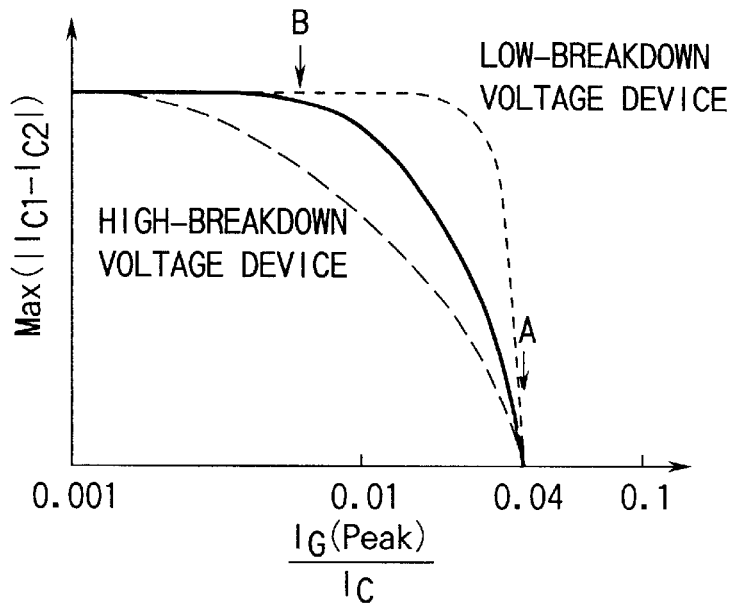
FIG. 22 is a graph showing a comparison between the dependency in FIG. 18 and high and low resistance devices in the first embodiment.
Figure 23:
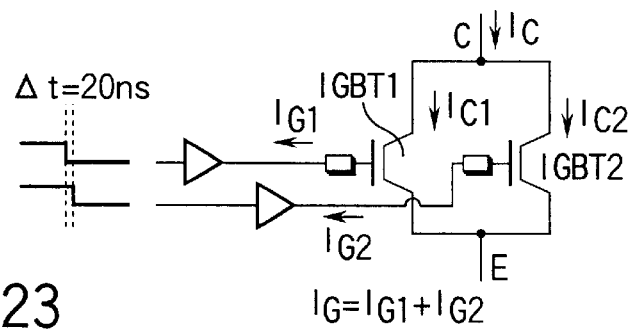
FIG. 23 is a circuit diagram for explaining the dependency in FIG. 22 in the first embodiment.

Comparison between high and low breakdown voltage IGBTs will be described. As shown in FIGS. 22 and 23, the dependency changes depending on the breakdown voltage. In the low breakdown voltage IGBT, the effect appears relatively steeply, and the difference between points A and B is small. In the high breakdown voltage IGBT, the dependency at point B is much smaller than at point A. In other words, in the high breakdown voltage IGBT, the uniformity effect appears at a relatively low current ratio.

Figure 24:
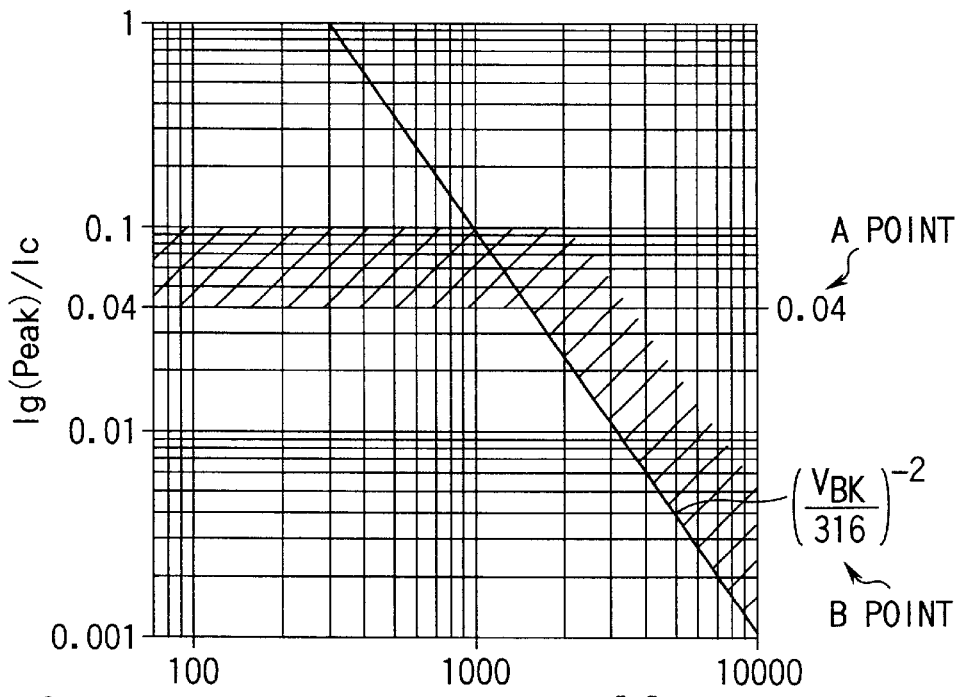
FIG. 24 is a graph showing the relationship between the ratio of the peak value of the gate current to the collector current and the rated resistance of the device in the first embodiment.

FIG. 24 is a graph showing these results. In FIG. 24, the abscissa represents the rated breakdown voltage of the device, and the ordinate represents the ratio of the peak value of the gate current to the collector current.

Point A shown in FIG. 22 corresponds to a horizontal line at 0.04 in FIG. 24, and point B corresponds to an oblique line falling toward the right $(V_{BK}/316)^{-2}$ in FIG. 24. The effect of the present invention appears in a region at a ratio of 0.04 or more, and partially appears in a region above the oblique line. The uniformity effect in series connection of the IGBT appears in a region obtained by adding these two regions.

As described above, according to the first embodiment, when the IGBT is turned off, the gate voltage $V_G$ is decreased to the threshold voltage Vth or less before the collector voltage $V_{CE}$ rises. With this operation, before the collector voltage $V_{CE}$ rises, electron injection can be stopped to improve the stability of the current density, and current concentration, oscillation, and the like can be prevented to improve reliability.

Since the maximum value of the gate current is controlled to always exceed a current 0.04 times the collector current Ic upon turning off the IGBT, the above effect can be easily, reliably realized.

This can be modified to set the gate resistance RG to a resistance value of Vgpp/0.04/Ic or less where Vgpp is the difference voltage between gate voltages in the ON and OFF states. In this case, gate charges upon turn-off operation can be quickly removed.

In addition, since the maximum value of the gate current is controlled to always exceed a current $(V_{BK}/316)^{-2}$ times the collector current Ic upon turning off the IGBT, the above effect of preventing current concentration can be easily, reliably realized. Similarly, this can be modified to set the gate resistance RG to a resistance value of Vgpp/$(V_{BK}/316)^{-2}$/Ic or less. Also in this case, gate charges upon turn-off operation can be quickly removed. The above description assumes that the device is used within the rated range, but operation in the protection mode is not limited to this.

The first embodiment is effective for two or more multiple chips or a large chip area, more effective when the number of chips is 4 or more or the chip area (the total value of the effective area) is 2.5 cm² or more, and particularly effective for a device of low $V_{CE}$(sat) (to be described below).

(Second Embodiment)

Figure 25:
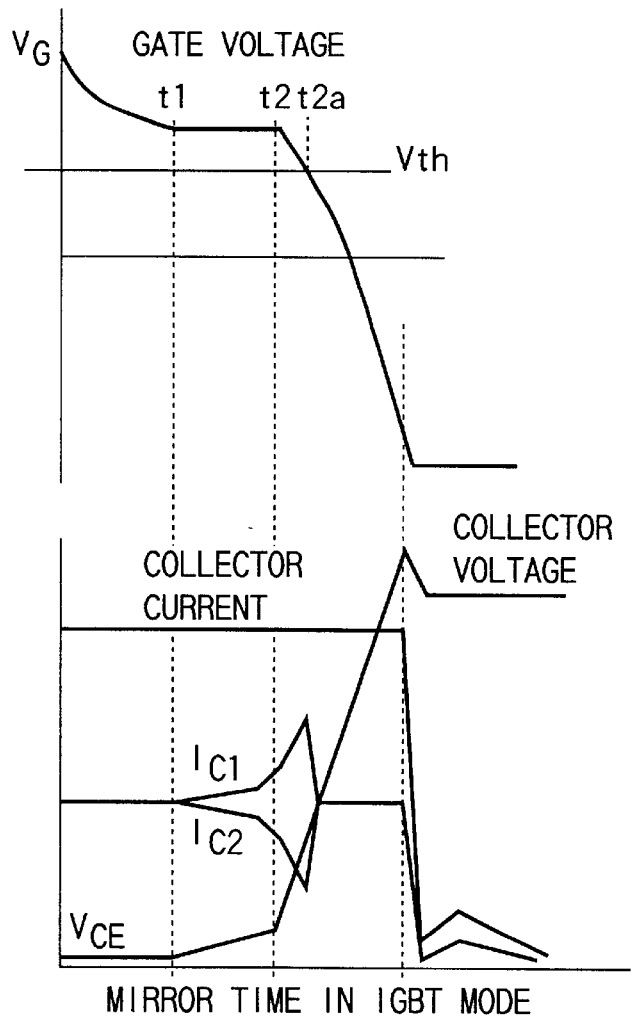
FIG. 25 is a waveform chart for explaining a semiconductor device drive method according to the second embodiment of the present invention.

FIG. 25 is a waveform chart for explaining a semiconductor device drive method according to the second embodiment of the present invention.

The second embodiment is a modification of the first embodiment and exhibits an effective drive method though the current stability is lower than the first embodiment.

More specifically, as shown in FIG. 25, the gate voltages of a plurality of parallel-connected IGBTs are decreased to the threshold voltage Vth or less during the rise of the collector voltage $V_{CE}$. "During the rise of the collector voltage $V_{CE}$" means a range in which the collector voltage $V_{CE}$ does not completely rise. For example, the gate voltage is preferably decreased before the collector voltage $V_{CE}$ increases ½ the resistance of the device in order to prevent destruction, or before the collector voltage $V_{CE}$ increases ⅕ the resistance of the device in order to reduce heat. More specifically, the mirror time in the IGBT mode ends at a timing capable of unifying the collector current before the collector voltage $V_{CE}$ reaches the peak.

In other words, the second embodiment is a drive method in which the mirror time in the IGBT mode in the prior art is shortened to stop electron injection during the rise of the collector voltage $V_{CE}$.

This drive method can also make the collector current Ic uniform when the collector voltage $V_{CE}$ reaches the peak, so that the same effect as the first embodiment can be obtained.

(Third Embodiment)

Figure 26B:
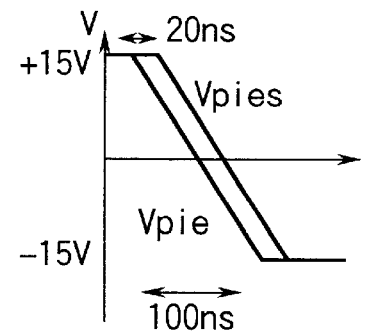
FIG. 26B is a view showing a voltage waveform being applied to IEGTS of the simulation arrangement of a semiconductor device according to the third embodiment of the present invention.
Figure 26A:
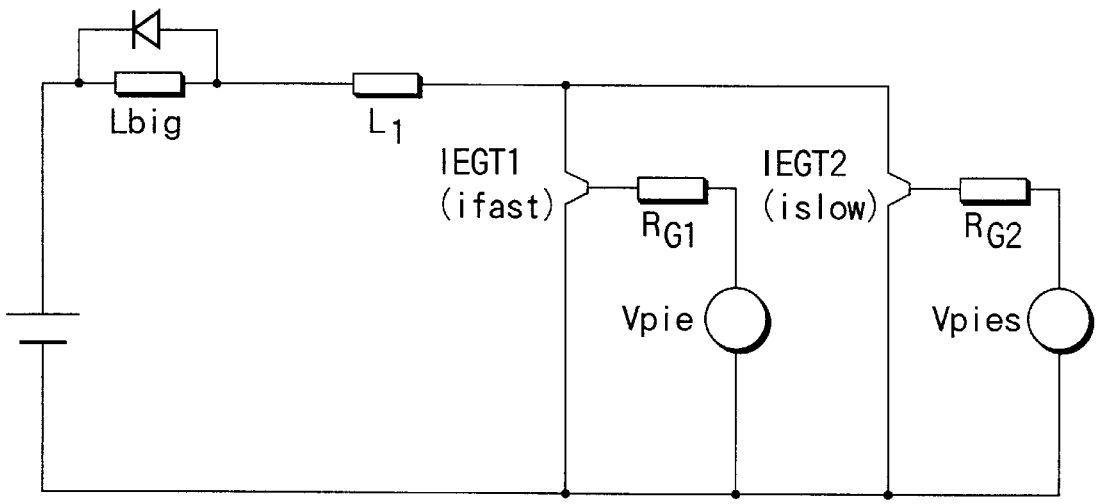
FIG. 26A is a circuit diagram showing the simulation arrangement of a semiconductor device according to the third embodiment of the present invention.

FIG. 26A is a circuit diagram showing the simulation arrangement of a semiconductor device according to the third embodiment of the present invention. FIG. 26B is a view showing a voltage waveform being applied to IEGTS of the simulation arrangement of a semiconductor device according to the third embodiment of the present invention.

The third embodiment is a detailed example of the first embodiment and shows the simulation result.

In this simulation arrangement, as shown in FIG. 26A, IEGT1 and IEGT2 are parallel-connected to each other. IEGT1 is connected to a gate power supply Vpie via a gate resistance RG1, and IEGT2 is connected to a gate power supply Vpies via a gate resistance RG2.

The gate power supply Vpie supplies a turn-off gate signal to IEGT1 via RG1 20 ns before the gate power supply Vpies.

A parallel circuit of IEGT1 and IEGT2 is series-connected to a parasitic inductance L1, inductive load Lbig, and main power supply. The inductive load Lbig is parallel-connected to a commutation diode. An IEGT used for simulation has a trench MOS gate.

The simulation results of a drive method according to the present invention with this arrangement will be described in comparison with the prior art in the order from the turn-off waveform, resistance load, inductive load, charge difference, temperature dependency, and turn-off loss.

Figure 27:
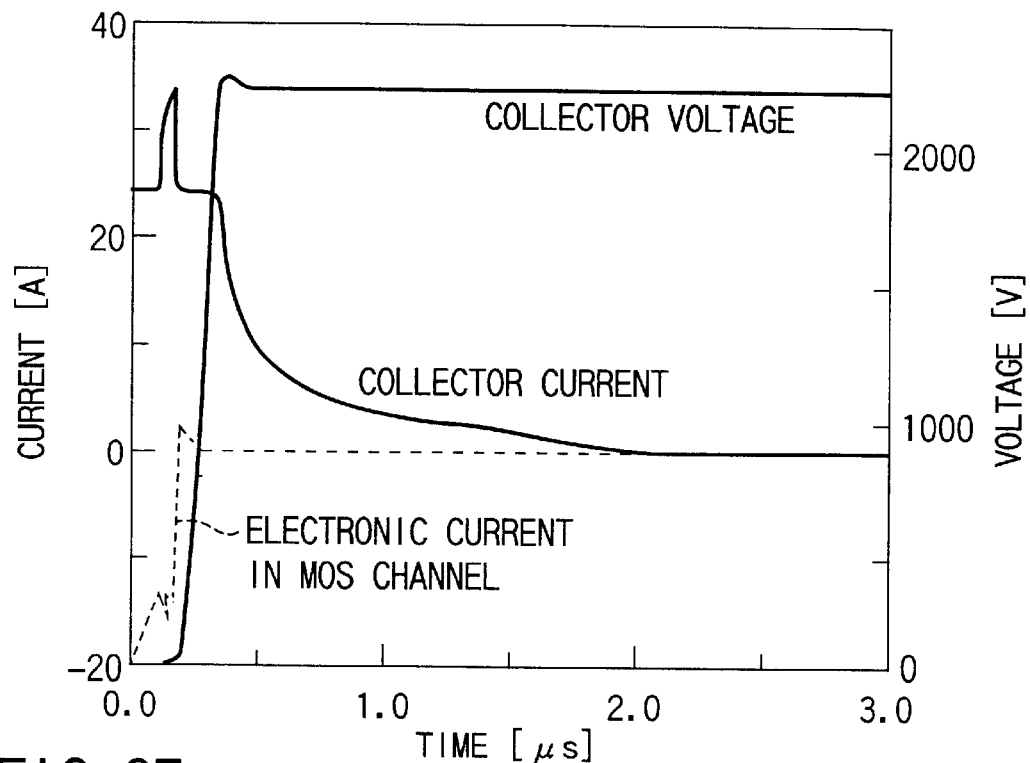
FIG. 27 is a waveform chart showing a turn-off waveform in the drive method according to the third embodiment of the present invention.
Figure 28:
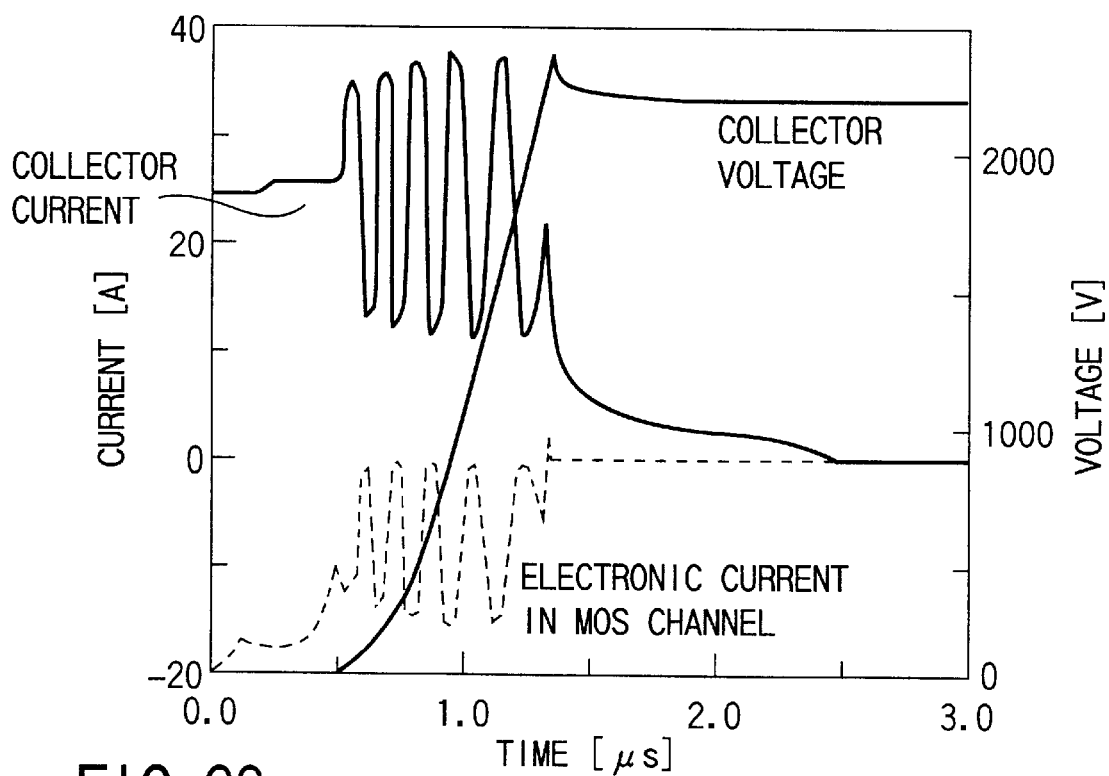
FIG. 28 is a waveform chart showing a turn-off waveform in the conventional drive method in the third embodiment.

The turn-off waveform will be explained. FIG. 27 is a waveform chart showing a turn-off waveform (RG=3Ω) in the drive method according to the present invention. FIG. 28 is a waveform chart showing a turn-off waveform (RG= 10Ω) in the conventional drive method.

In the drive method of the present invention, as shown in FIG. 27, the collector current is stable because the electronic current in the MOS channel in a p-type base layer 4 is eliminated before the collector voltage $V_{CE}$ rises upon turn-off operation.

To the contrary, in the conventional drive method, as shown in FIG. 28, while the collector voltage $V_{CE}$ rises upon turn-off operation, the electronic current flows to oscillate the collector current.

The experimental results using a 1,700-V IGBT chip will be described. The resistance load will be explained. The resistance load was 10Ω.

Figure 29:
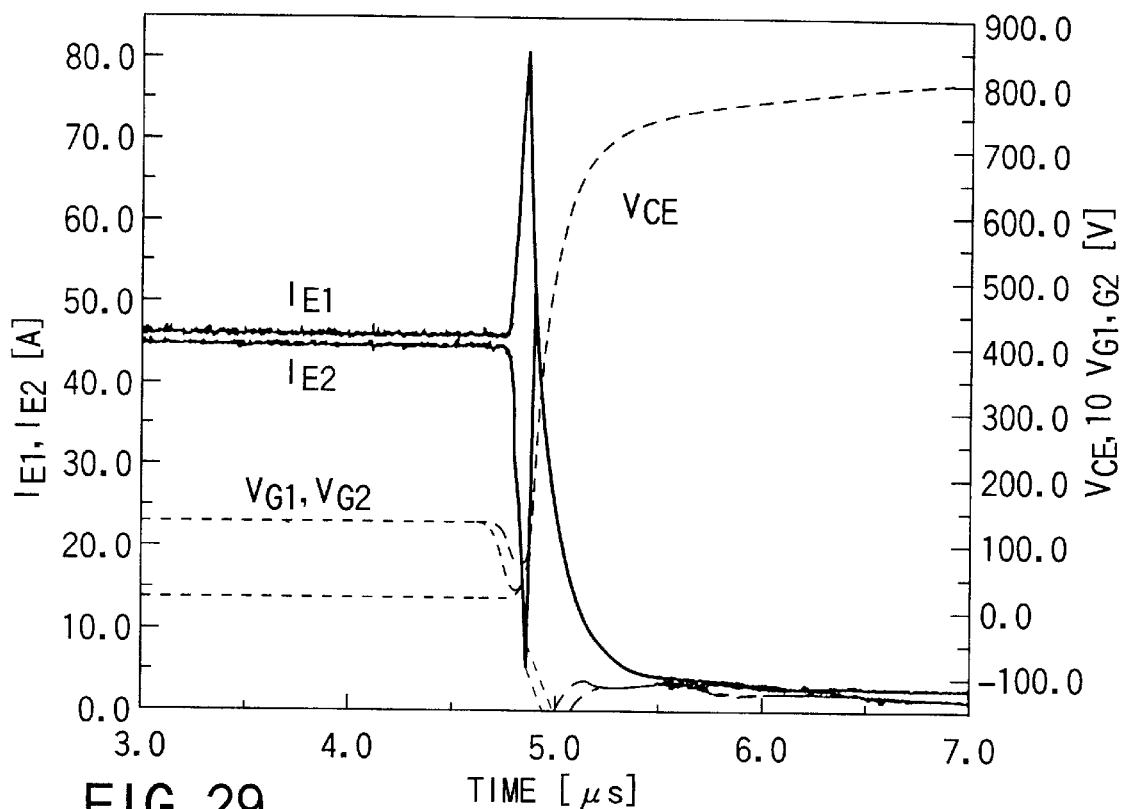
FIG. 29 is a waveform chart showing a turn-off waveform with a resistance load of the present invention in the third embodiment.

In the drive method according to the present invention (gate resistance=1Ω), emitter currents $I_{E1}$ and $I_{E2}$ became different for only a short time after the collector voltage $V_{CE}$ started rising, but flowed uniformly soon, as shown in FIG. 29. Consequently, the current was cut off while the current was uniformly shared by chips. The gate voltages $V_{G1}$ and $V_{G2}$ did not have any mirror time.

Figure 30:
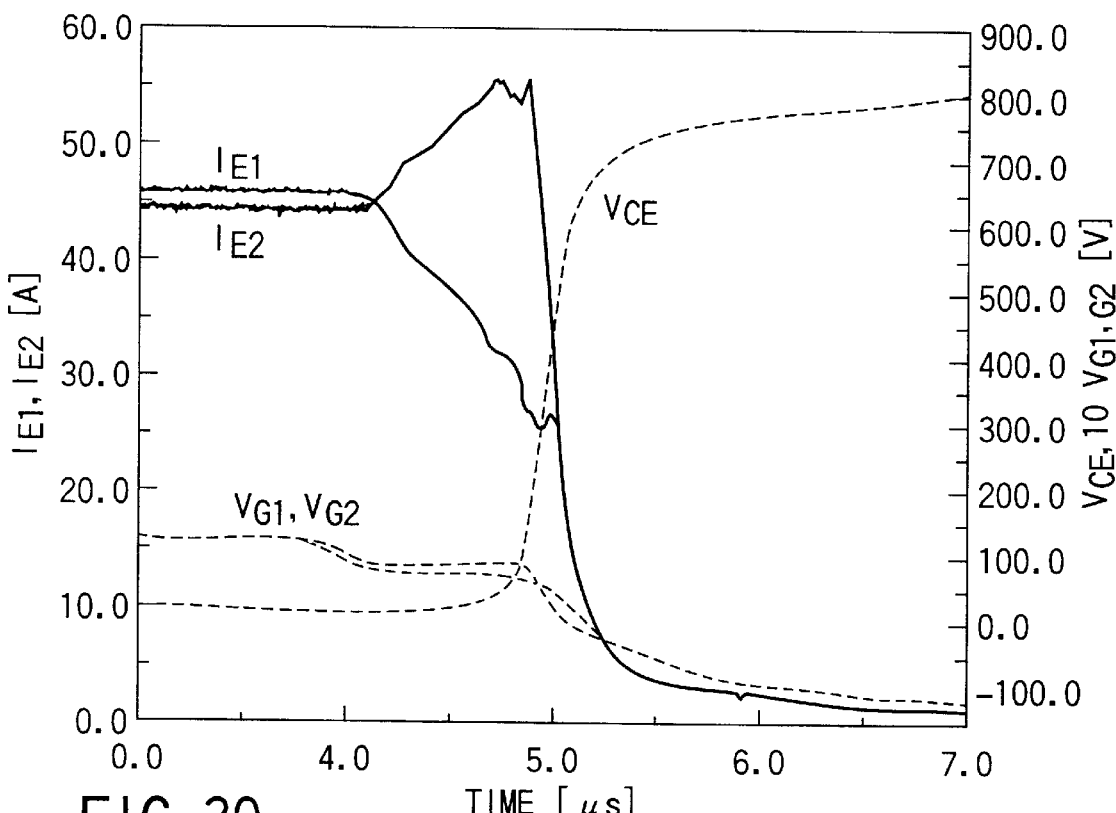
FIG. 30 is a waveform chart showing a turn-off waveform with a conventional resistance load in the third embodiment.

In the conventional drive method (gate resistance=50Ω), different emitter currents $I_{E1}$ and $I_{E2}$ flowed during turn-off operation, as shown in FIG. 30. While the current was nonuniform, the current was cut off, which readily destroyed the device. The gate voltage $V_{G1}$ and $V_{G2}$ had a flat mirror time and gradually changed.

The inductive load will be explained. The inductive load value was 1 mH.

Figure 31:
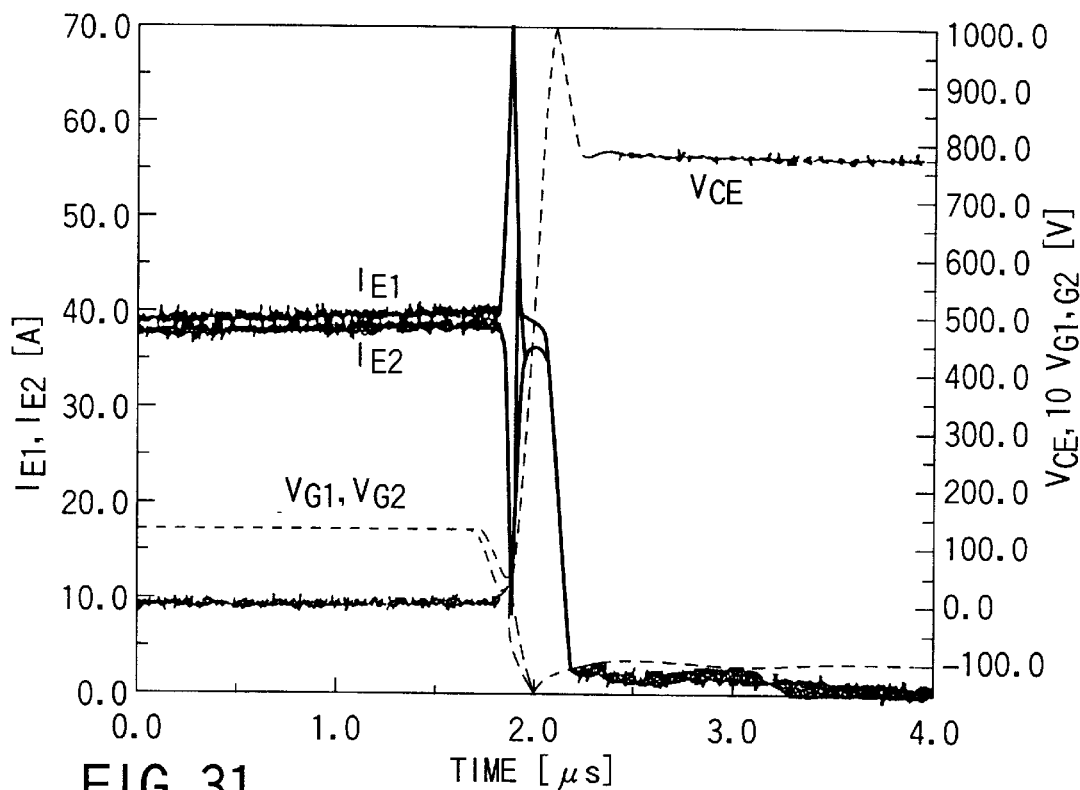
FIG. 31 is a waveform chart showing a turn-off waveform with an inductive load of the present invention in the third embodiment.

In the drive method according to the present invention (gate resistance=1Ω), the emitter currents $I_{E1}$ and $I_{E2}$ became different for only a short time after the collector voltage $V_{CE}$ started rising, but flowed uniformly soon, as shown in FIG. 31. The gate voltages $V_{G1}$ and $V_{G2}$ did not have any mirror time.

Figure 32:
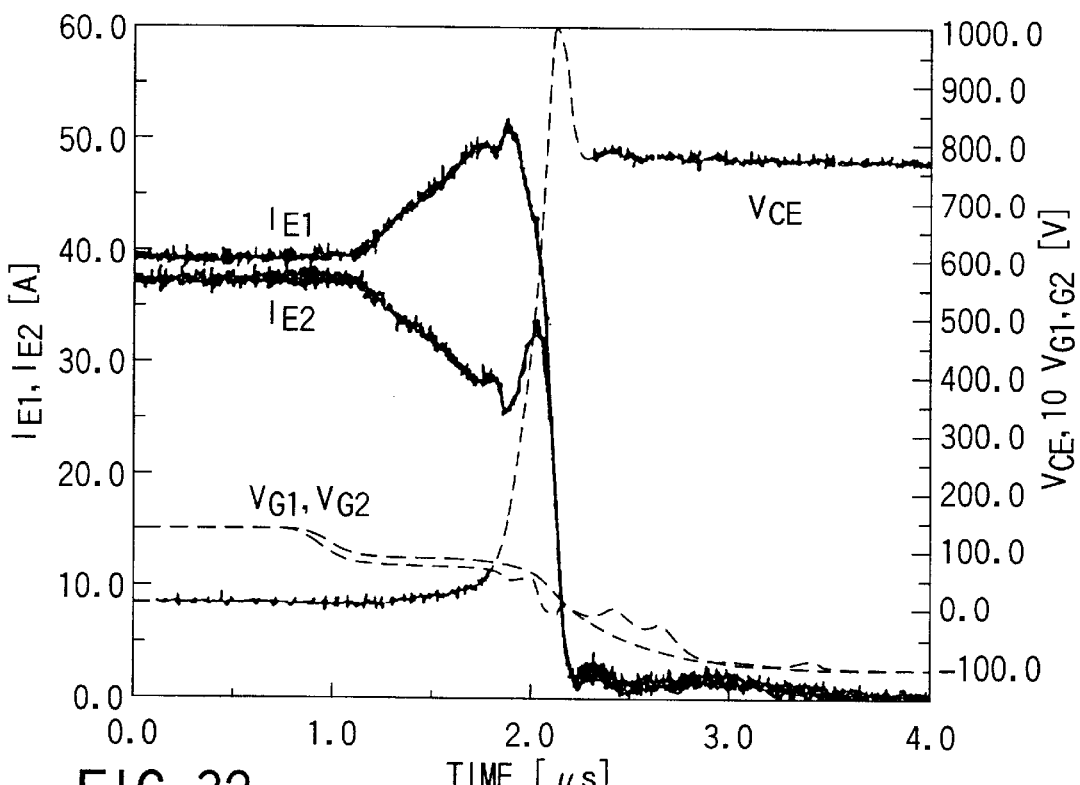
FIG. 32 is a waveform chart showing a turn-off waveform with a conventional inductive load in the third embodiment.

In the conventional drive method (gate resistance=50Ω), different emitter currents $I_{E1}$ and $I_{E2}$ flowed during turn-off operation, as shown in FIG. 32. While the current was nonuniform, the current was cut off, which readily destroyed the device. The gate voltage $V_{G1}$ and $V_{G2}$ had a flat mirror time.

The charge difference will be described.

Figure 33:
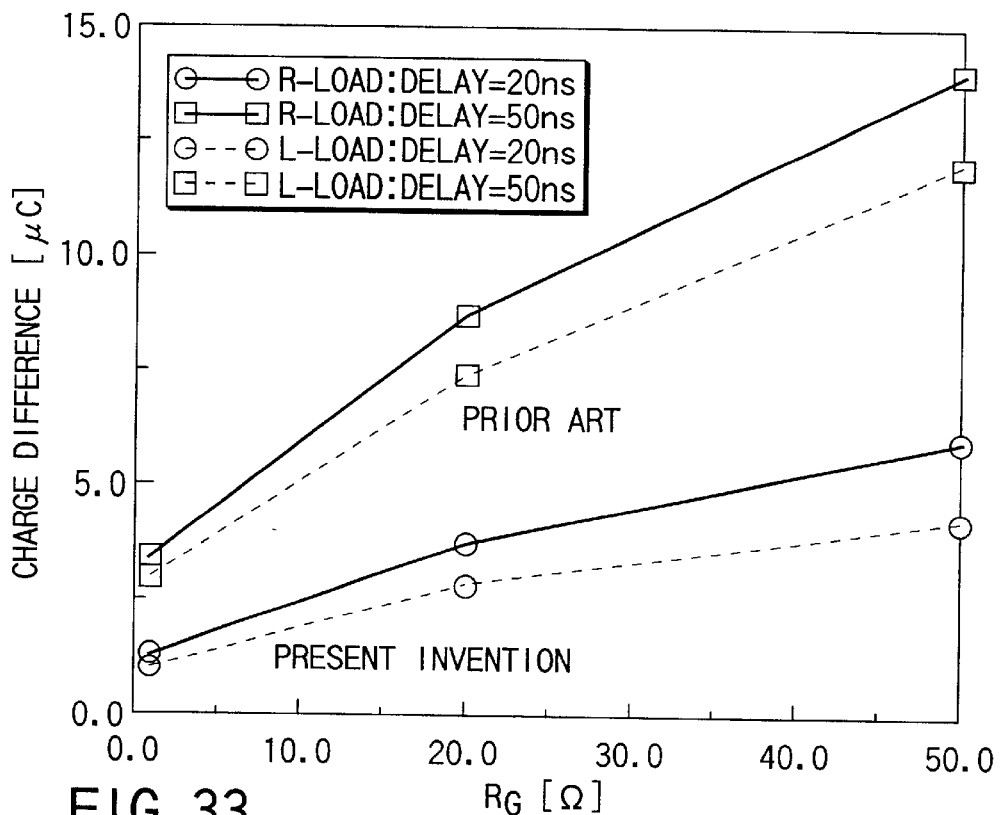
FIG. 33 is a graph showing the difference in gate charge between the third embodiment and the prior art.

As shown in FIG. 33, the difference in gate charge flowing upon turn-off operation between two IGBTs decreases as the gate resistance RG decreases, and increases as the gate resistance RG increases.

The case of a gate resistance having a small value of 1Ω used in the drive method of the present invention is compared with the case of a gate resistance having a normal value of 20Ω used in the conventional drive method to find that the difference in gate charge between two IGBTs is about three time larger in the prior art. That is, the effects of the present invention can also be explained from this viewpoint, and can improve the difference in chip temperature due to heat generation or the like.

The temperature dependency will be described.

Figure 34:
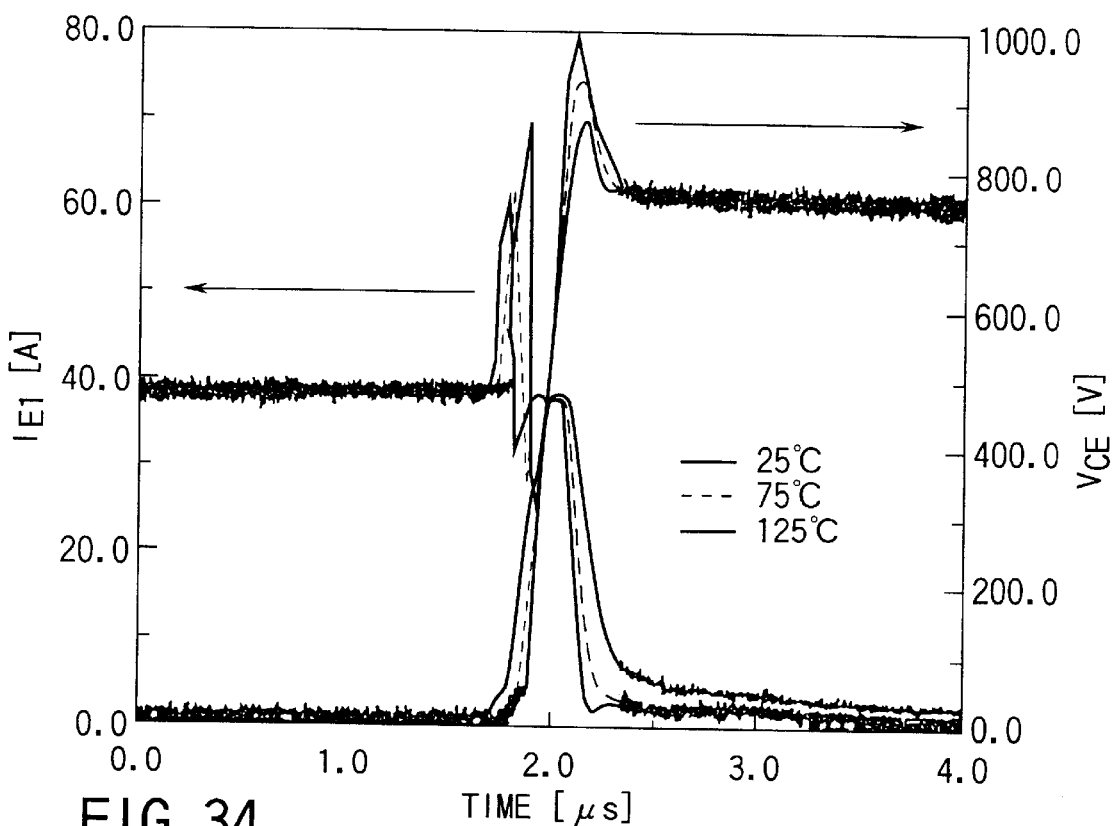
FIG. 34 is a waveform chart showing the temperature dependency of the drive method in the third embodiment.

FIG. 34 shows the temperature dependency of the turn-off waveform. In general, a high temperature decreases the turn-off speed. A low switching speed decreases not only the current peak but also the overshoot amount of voltage. However, the switching speed does not exhibit any fundamental difference depending on the temperature, and the effects of the present invention can act for any temperature.

The turn-off loss will be described.

Figure 35:
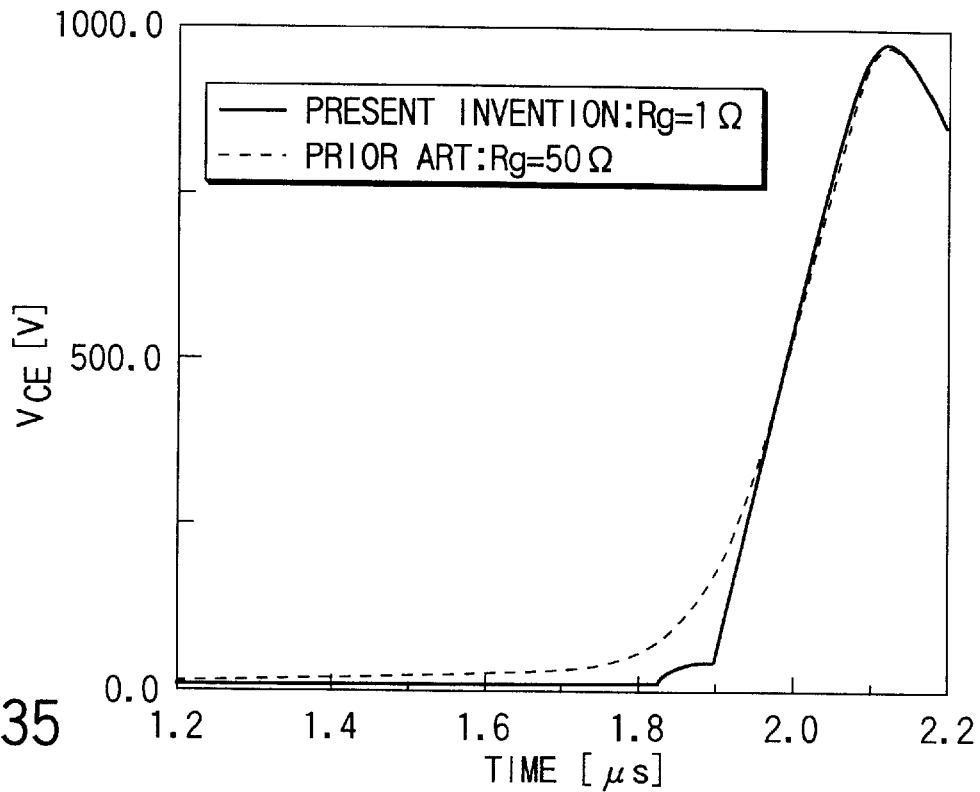
FIG. 35 is a waveform chart for explaining the turn-off loss in the third embodiment.

As shown in FIG. 35, since the drive method according to the present invention does not adopt any mode (to 1.9 μs) in which $V_{CE}$ gradually increases in the conventional method, a turn-off loss generated in this period greatly reduces. Accordingly, the turn-off loss can be reduced compared to the conventional method.

(Fourth Embodiment)

The above-mentioned first to third embodiments mainly concern the semiconductor device drive method. The following fourth to 14th embodiments will exemplify a gate drive circuit suitable for the drive method according to the present invention.

Generally, as described above, a plurality of chips are arranged parallel in a large-current IGBT package in order to cope with a large current, and external gate terminals are connected to a plurality of gates in the package. Also, emitters are connected to the plurality of internal chips via external terminals.

Figure 36:
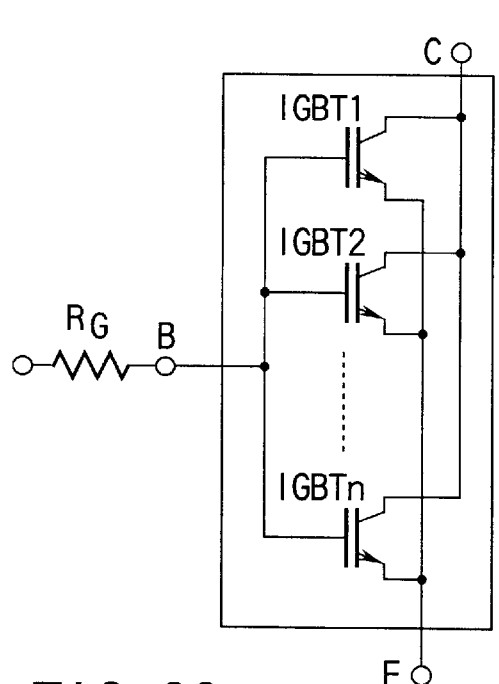
FIG. 36 is a circuit diagram showing a conventional circuit for explaining the fourth embodiment of the present invention.

AS shown in FIG. 36, a plurality of chips are parallel-connected in a large-current IGBT package, and the gate of each chip is connected to and driven by a gate drive circuit (not shown) via a gate resistance RG. The gate resistance RG generally has a value of about 20Ω/100 A.

Figure 37:
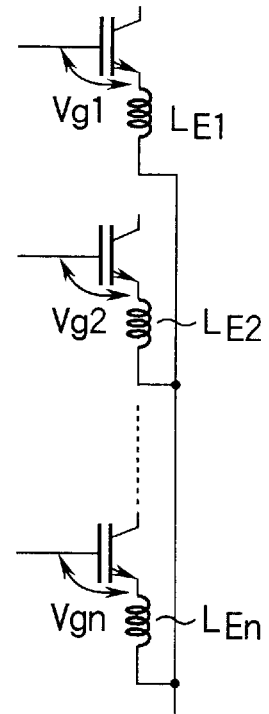
FIG. 37 is a circuit diagram showing the conventional circuit in the fourth embodiment.

In general, parasitic inductances $L_{E1}$ to $L_{En}$ exist between an external emitter terminal E and chip emitter electrodes in the package, as shown in FIG. 37. Upon switching operation, effective emitter-gate (to be referred to as e-g) voltages Vg1 to Vgn change between chips to vary the potential.

The influence of $L_{E1}$ to $L_{En}$ is as follows. Variations in Vg1 to Vgn result in time delays in the change in gate voltage. Letting $V_{GG}$ be an external gate voltage, the time delay is given by $$V_{GG}=Vgi+L_{Ei}\cdot dI_{Ei}/dt \text{ for } (i=1 \text{ to } n).$$

Letting gmi be the transconductance of IGBTi, $$I_{Ei}=gmi\cdot(Vgi-Vthi)$$

where $I_{Ei}$ is the emitter current value of IGBTi and Vthi is the gate threshold of IGBTi.

From these equations, $$Vgi=V_{GG}-L_{Ei}\cdot gmi\cdot dVgi/dt$$

The time constant of this first order differential equation is $L_{Ei}\cdot gmi$, and the delay of each chip can be represented by the product of the emitter inductance $L_{Ei}$ and transconductance gmi. This theory can be applied to not only chips but also parallel-connected devices, general MOSFETs, MESFETs, and bipolar transistors in AC operation.

Figure 38:
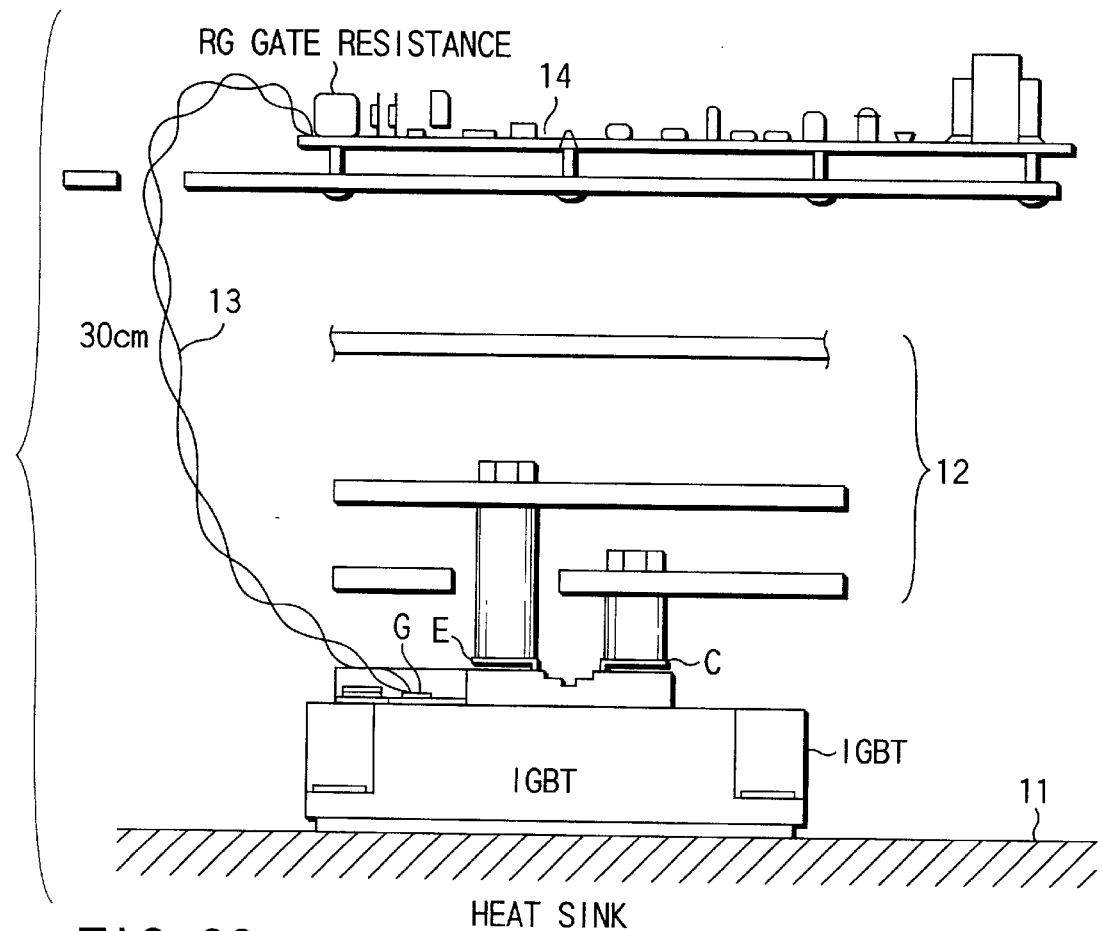
FIG. 38 is a sectional view showing an example of conventional mounting in the fourth embodiment.

FIG. 38 is a sectional view showing an example of mounting of the IGBT. The IGBT is mounted on a heat sink 11, and emitter and collector terminals E and C are connected to a main circuit 12 constituted by connecting components with a copper plate or bar. Gate and emitter terminals G and E are connected to a gate drive circuit 14 via a thin cable 13.

Figure 39:
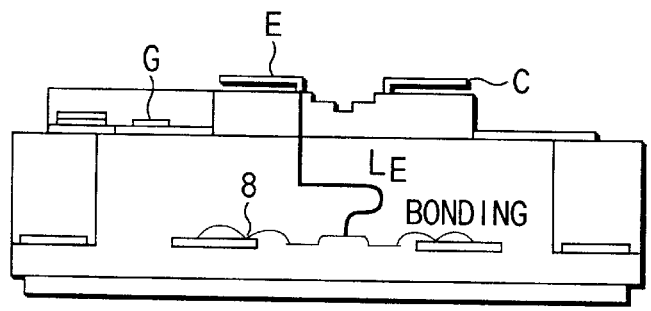
FIG. 39 is a sectional view showing conventional emitter wiring in the fourth embodiment.

FIG. 39 is a sectional view showing emitter wiring inside the IGBT package. 440-A and 1200-A devices use wiring lines 5 cm to 7 cm and 10 cm or more in length, respectively, from the emitter terminal E to an emitter electrode 8 of the chip. The emitter has a parasitic inductance $L_E$ of about 30 to 50 nH. This also applies to the collector.

Figure 40:
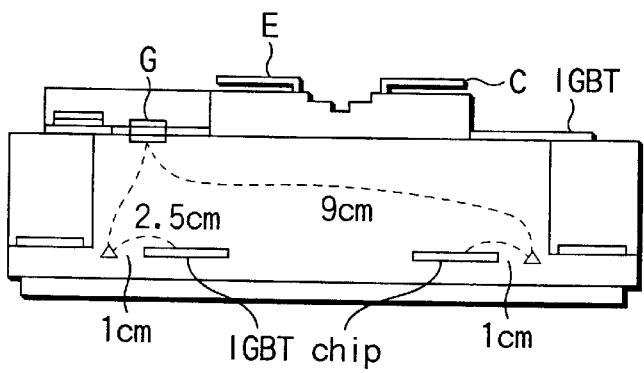
FIG. 40 is a sectional view showing conventional gate wiring in the fourth embodiment.

FIG. 40 is a sectional view showing gate wiring inside the IGBT package. A gate wiring line extending to a chip on one side is a thin (0.5 mm) wire having a length of about 3.5 cm, and a gate wiring line extending to a chip on the other side is a wire having a length of about 10 cm. The gate wiring line has a maximum inductance $L_G$ of 150 nH or more between chips.

In this general mounting, even if the peak value Ig(peak) of the gate current of the IGBT is tried to be increased 0.04 times the collector current Ic, as mentioned with reference to FIG. 24 according to the present invention, this fails because the rise speed of the gate voltage/current is low owing to the parasitic inductance.

Figure 41:
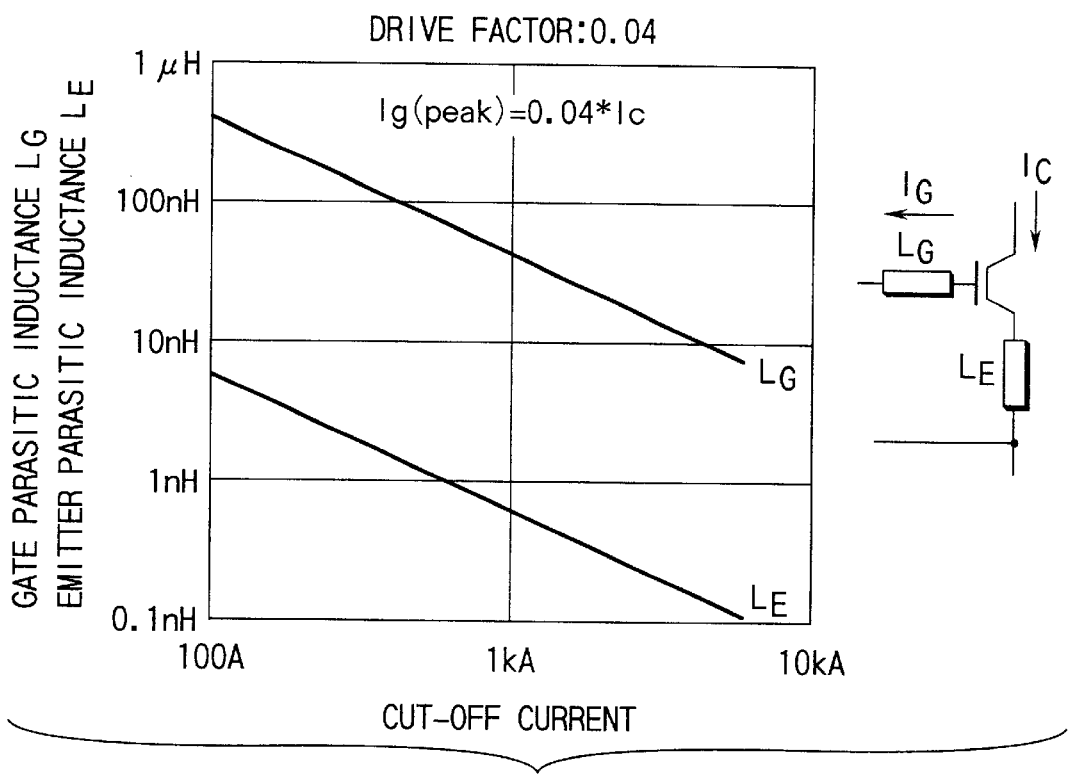
FIG. 41 is a graph showing both the allowable value of the parasitic inductance and the device resistance in the fourth embodiment.
Figure 42:
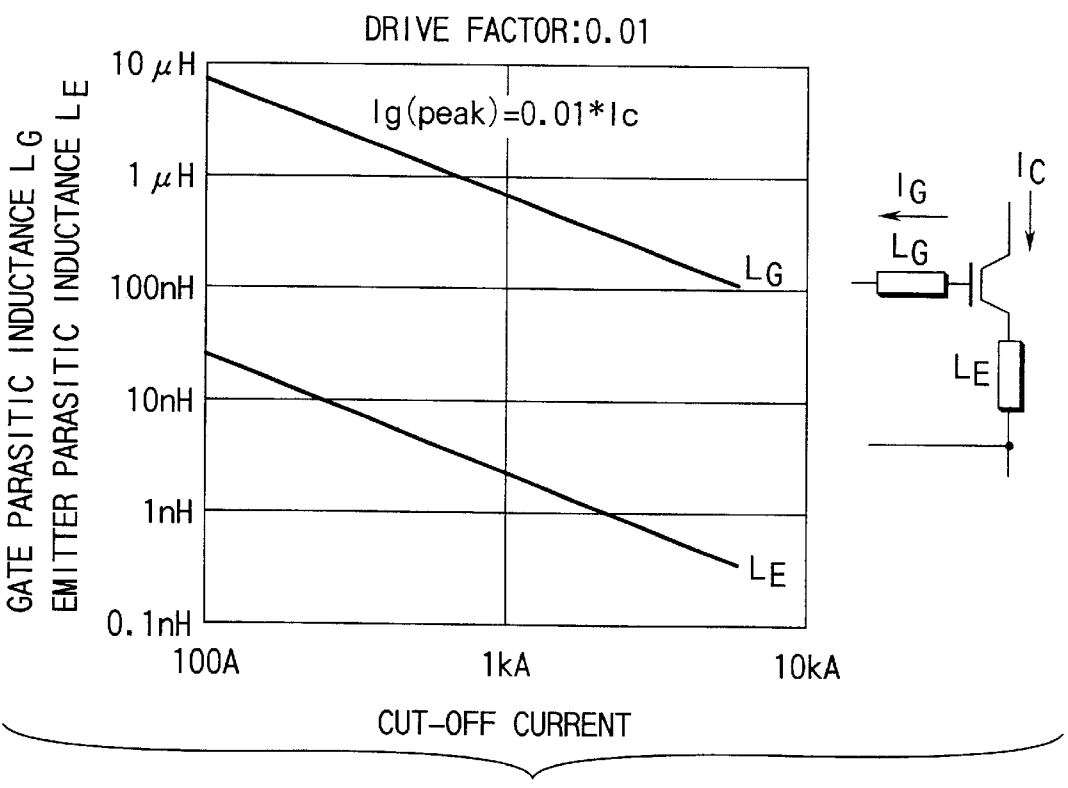
FIG. 42 is a graph showing both the allowable value of the parasitic inductance and the device resistance in the fourth embodiment.
Figure 43:
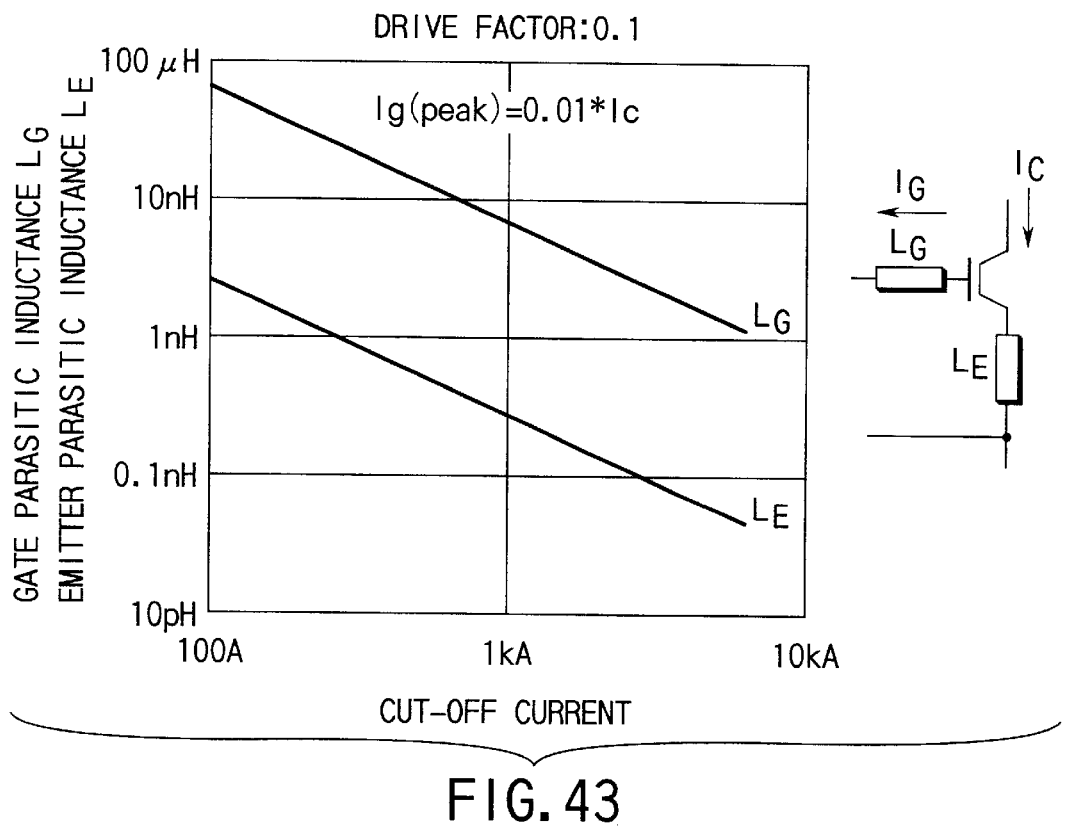
FIG. 43 is a graph showing both the allowable value of the parasitic inductance and the device resistance in the fourth embodiment.

The current is difficult to increase 0.04 times unless the parasitic inductances $L_G$ and $L_E$ are decreased as the cut-off current of the device increases, as shown in FIG. 41. The drive factor which can implement the present invention more reliably than a drive factor of 0.04 is 0.1, or 0.01 with which the effect is partially attained. The cut-off current dependencies of the parasitic inductances $L_G$ and $L_E$ at these drive factors are shown in FIGS. 42 and 43. In any case, the parasitic inductances $L_G$ and $L_E$ are too high for a device demanded for a large cut-off current in the conventional mounting, so the drive method of the present invention cannot be realized.

Considering the above problems, a gate drive circuit according to the fourth embodiment of the present invention will be described below.

Figure 44:
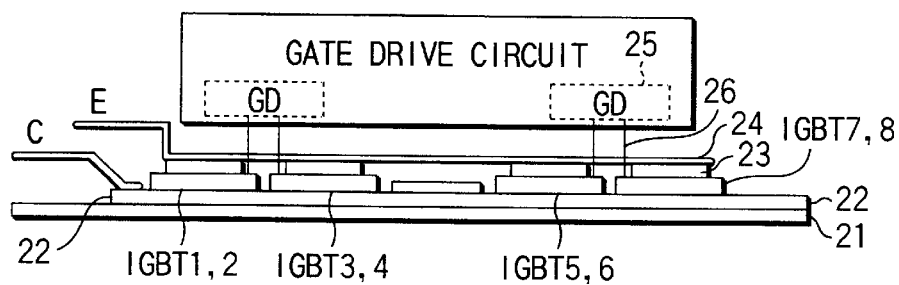
FIG. 44 is a sectional view showing the structure of a semiconductor device to which a gate drive circuit according to the fourth embodiment of the present invention is applied.
Figure 45:
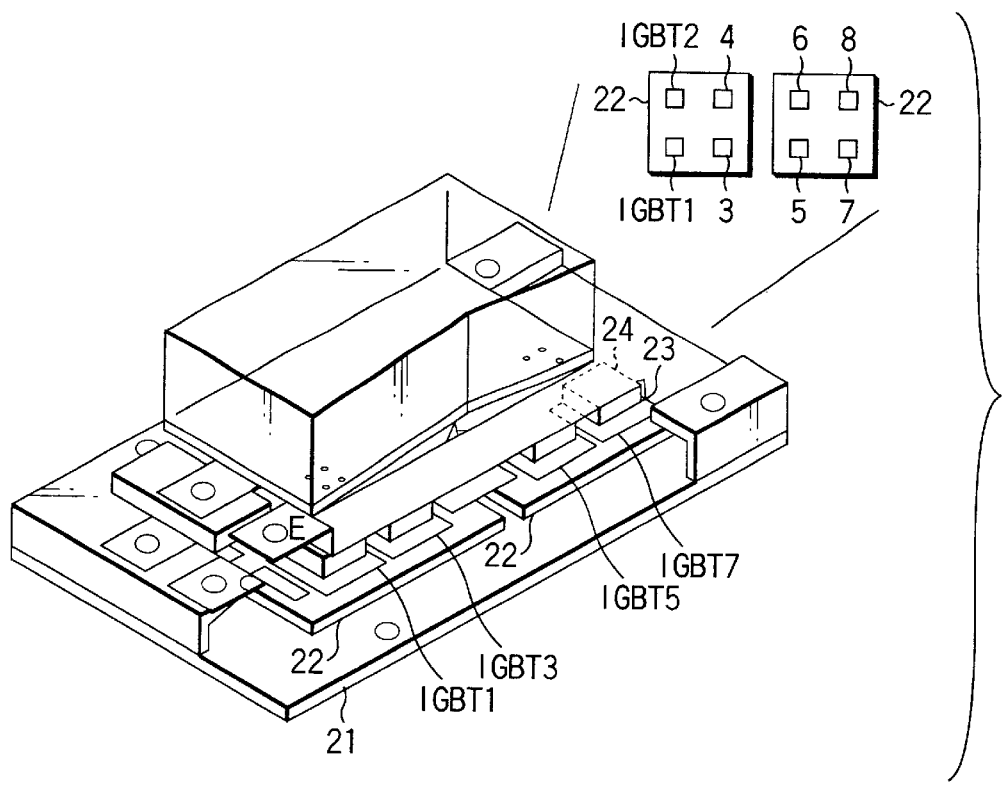
FIG. 45 is a perspective view showing the semiconductor device in FIG. 44 in the fourth embodiment.
Figure 46A:
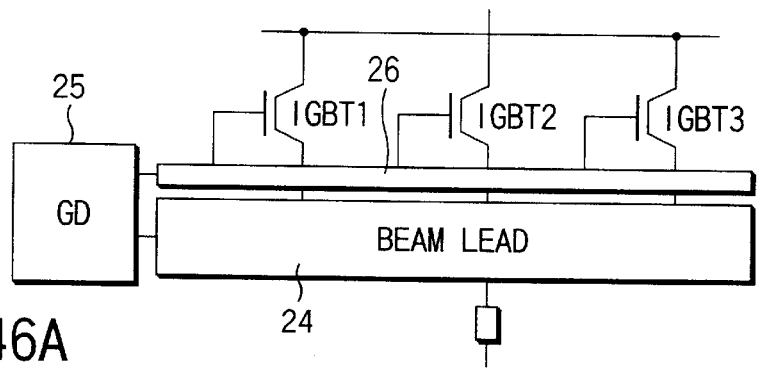
FIGS. 46A and 46B are circuit diagrams showing the semiconductor device in the fourth embodiment.
Figure 46B:
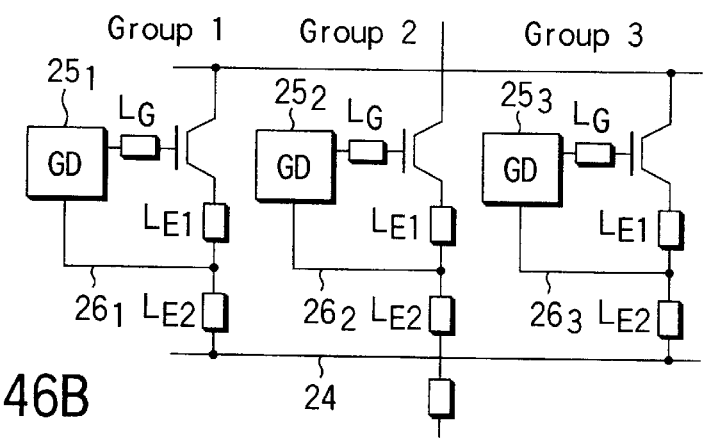

FIG. 44 is a sectional view showing the structure of a semiconductor device to which a gate drive circuit according to the fourth embodiment of the present invention is applied. FIG. 45 is a perspective view showing the semiconductor device in FIG. 44. FIGS. 46A and 46B are circuit diagrams showing the semiconductor device. This semiconductor device is formed by mounting an insulating board whose two surfaces are patterned with copper, such as a DBC (Direct Bond Copper) board 22 on a copper board 21 and soldering chips of IGBT1 to IGBT4 and IGBT5 to IGBT8 on the surface of the copper pattern. The lower surface of each chip serves as a collector electrode and its upper surface serves as an emitter electrode. The gate electrode has a small gate contact pad on its surface. A molybdenum plate 23 is soldered on the emitter electrode of the chip. The molybdenum plates 23 on the emitters are connected to each other via a beam lead 24 made of a copper plate, copper braided wire, or the like.

For a 1,000-A cut-off IGBT, a gate drive circuit 25 is arranged immediately above the IGBT or distant up to 150 nH (15 cm), and connected to the gates of IGBT1 to IGBT4 via a gate lead 26.

The beam lead arrangement shown in FIGS. 44 and 45 can shorten the wiring distance and reduce the parasitic inductances $L_E$ and $L_G$ to easily, reliably realize the drive method according to the present invention. In this case, $L_E$ is effectively reduced within groups respectively composed of IGBT1 to IGBT4 and IGBT5 to IGBT8. Note that the emitter wiring to the gate circuit is not illustrated in FIGS. 44 and 45.

Although the gate circuit is divided into two parts in the fourth embodiment, the gate circuit may be divided by a division number m, as will be described in the next embodiment. This division reduces the size to decrease the effective value of L to 1/m and the flowing current to 1/m. As a result, the influence of the parasitic inductance L upon turn-off and turn-on operations can be reduced to $1/m^2$.

This description about the gate current value assumes that the gate capacitance $C_G$ of the IGBT chip is about 20 to 30 nF per chip effective area of 1 $cm^2$. If this value greatly decreases in the future, the gate current value also proportionally decreases to obtain the same effects. Alternatively, if the gate capacitance $C_G$ decreases with the same gate current value, the above-described effects of the present invention are enhanced.

(Fifth Embodiment)

The fifth embodiment divides the gate drive circuit into respective IGBTs or IGBT groups to reduce the wiring distance and the parasitic inductances $L_G$ and $L_E$ in consideration of the case in which the parasitic inductance cannot be reduced only by the beam lead arrangement in the fourth embodiment or the beam lead cannot be used in terms of the technique or cost (FIG. 46).

Accordingly, for 2-division, the units of the gate drive circuit can be arranged to a distance up to about 300 nH (30 cm), and for 4-division, the units can be arranged to a distance up to about 600 nH (60 cm). The number of IGBTs included in one IGBT group is preferably 10 or less in terms of facilitation of the manufacture and driving.

Figure 47:
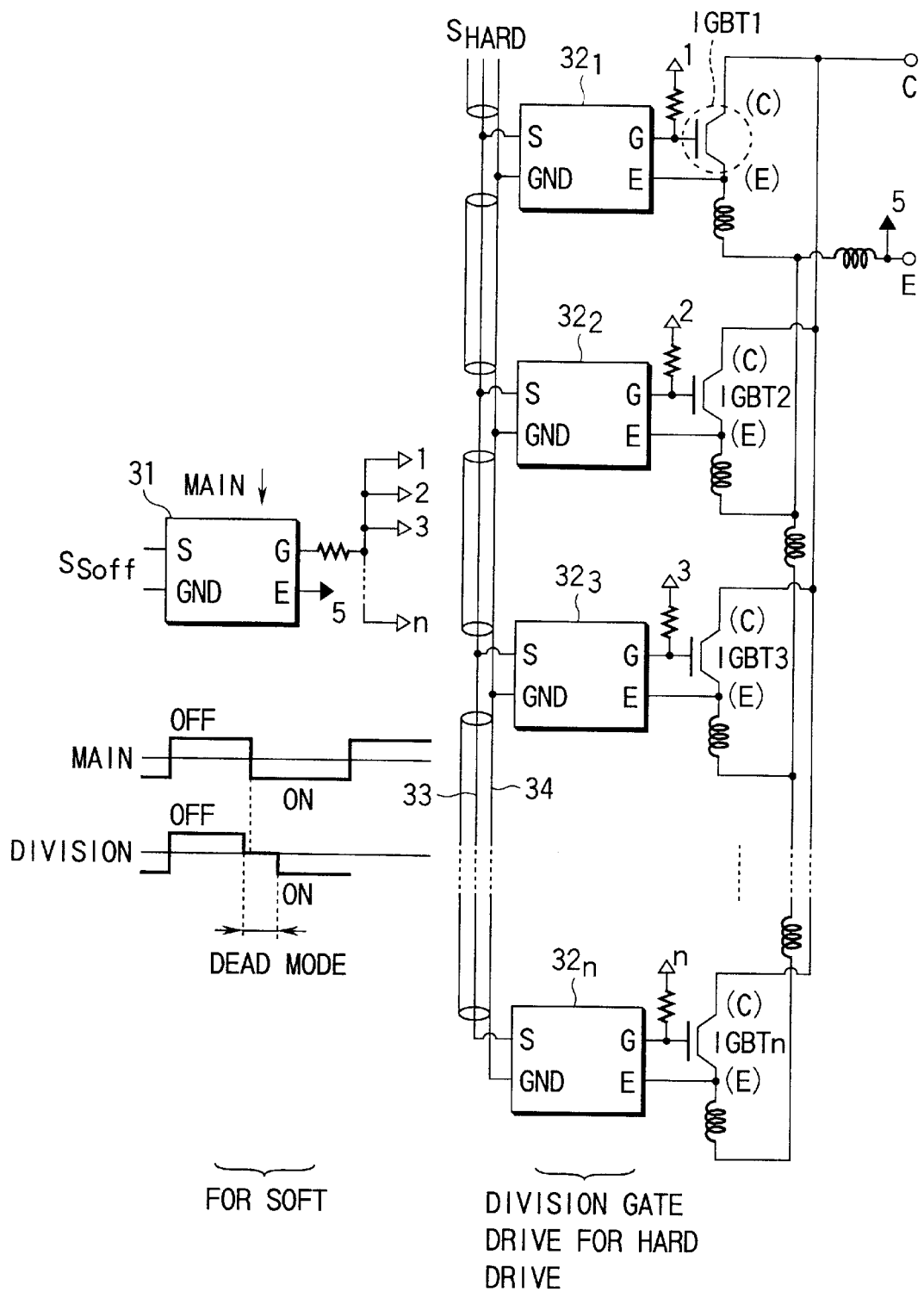
FIG. 47 is a circuit diagram showing a division gate drive according to the fifth embodiment of the present invention.

FIG. 47 is a circuit diagram showing a division gate drive according to the fifth embodiment. This division gate drive is constituted by a main gate circuit 31 connected to the gates of all IGBTs, and division gate circuits $32_1$ to $32_n$ independently connected to respective IGBTs or IGBT groups.

The main gate circuit 31 has signal and ground terminals S and GND on its input side and gate and emitter terminals G and E on its output side. The gate G is connected to the gates of all IGBTs, and the emitter terminal E is connected to the emitters of all IGBTs. Note that all the control may be done by the division gate circuits $32_1$ to $32_n$ without using the main gate circuit 31.

The division gate circuits $32_1$ to $32_n$ have signal and ground terminals S and GND on their input sides. The signal terminals S are connected to each other via a signal line 33, and the ground terminals GND are connected to each other via a sealed line 34 of the signal line 33.

The division gate circuits $32_1$ to $32_n$ have gate and emitter terminals G and E on their output sides. The gates G are individually connected to the gates of the IGBTs, and the emitter terminals are individually connected to the emitters of the IGBTs.

The output sides (FIG. 48) of the gate circuits 31 and $32_1$ to $32_n$ are insulated from each other or AC-insulated. Thus, even if the emitter potential varies in units of IGBTs or IGBT groups, no current passes through them not to influence the effective gate voltage (gate voltage actually applied to the chip).

Figure 48:
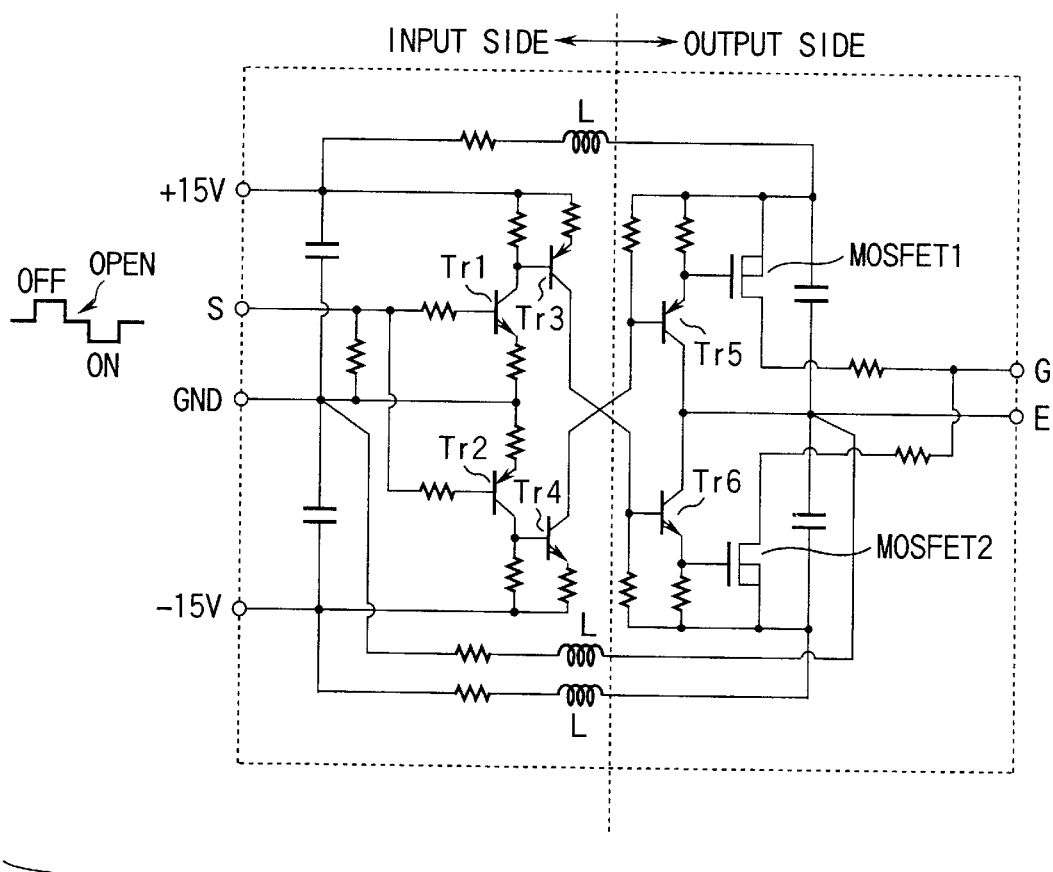
FIG. 48 is a circuit diagram showing the gate circuit in the fifth embodiment.

FIG. 48 is a circuit diagram showing the gate circuits 31 and $32_1$ to $32_n$. The input and output sides are AC-insulated via L. Even if the emitter current on the output side greatly varies, a level shifter reliably transmits a signal from the input side.

To avoid contention between the main gate circuit 31 and division gate circuits $32_1$ to $32_n$, the division gate drive has a dead mode in which both MOSFET1 and MOSFET2 are turned off. Note that a general gate circuit does not have any dead mode. This dead mode is effective when the turn-on speed is set low in order to reduce the load on the diode.

This division gate drive can further reduce the parasitic inductances $L_E$ and $L_G$ to easily, reliably realize the drive method of the present invention.

As for the signal supply timings for the main gate circuit 31 and division gate circuits $32_1$ and $32_n$ in FIG. 47, the following timing is effective in addition to the timing shown in FIG. 47. In FIG. 47, the turn-off timing of the division gate circuits $32_1$ to $32_n$ is slightly earlier than that of the main gate circuit 31 in order to quickly reduce the gate voltage to Vth or less, which is the main purpose of the present invention. However, if the ability of the gate circuit cannot be made so high, it is effective that the gate voltage is slowly reduced in the main gate circuit 31 and the gate voltage is steeply reduced in the division gate circuits $32_1$ and $32_n$ at the rise timing of the collector voltage $V_{CE}$.

When the present invention is applied to turn-on operation, too, the dead mode can be eliminated to simplify the circuit in FIG. 48, as a matter of course. The shift timing to the dead mode in the division gate circuits $32_1$ to $32_n$ is slightly earlier than that in the main gate circuit 31 in FIG. 47. In this case, the turn-on timing is determined by the main gate circuit 31. If this timing is determined by a signal (SHARD) supplied to the division gate circuits $32_1$ to $32_n$, the shift timing to the dead mode is desirably set after the turn-on timing of the main gate circuit 31.

In FIG. 47, the division gate circuits $32_1$ to $32_n$ are formed as separate units and receive a signal via the coaxial cable. Instead, the division gate circuits $32_1$ to $32_n$ may be formed on the same printed board to obtain the same effects. In this case, the coaxial cable need not always be arranged.

Using the printed board decreases the degree of freedom for layout, compared to FIG. 47, but is advantageous in cost and manufacture.

Even if the circuit from the first stage (Tr1 and Tr) to the second stage (Tr1 to Tr4) on the input side shown in FIG. 48 is combined, and the subsequent circuit is divided, the arrangement can be simplified with the same effects.

In the circuit shown in FIG. 48, the input and output sides are AC-insulated by L. Alternatively, a recent compact, low-cost DC-DC converter, AC-DC converter, or regulator which insulates the primary and secondary sides can be effectively used to more completely insulate the input and output sides and decrease the probability of malfunctions.

As another method of completely insulating the gate circuits 31 and $32_1$ to $32_n$ in FIG. 47, a signal may be optically transmitted. More specifically, a light-receiving portion is set on the input side in FIG. 48, and an optical cable replaces the coaxial cable. A photocoupler may be used instead of the optical cable. In this case, the power supply of each gate circuit must be AC-insulated but need not be AC-insulated by L, unlike the input and output sides in FIG. 48.

When the chip area increases in the future, the division gate drive may be provided in units of areas on the chip. For example, the chip is divided into four areas, and an independent gate drive may be arranged on each area or a gate resistance may be simply arranged on each area.

The fifth embodiment can also be applied to an arrangement in which reflux diode chips are additionally connected in opposite directions between the collectors and emitters of respective IGBT chips. In this case, the minimum length of a current path passing through the reflux diode chip between the collector and emitter is preferably smaller than the minimum length of a current path passing through the bipolar device between main electrodes in order to reduce the parasitic inductance of wiring.

In addition, the maximum value of the minimum length of a current path passing through the reflux diode chip between the collector and emitter terminals is preferably smaller than the minimum length of a current path passing through any IGBT in order to reduce the parasitic inductance of wiring.

The IGBT of the fifth embodiment is suitable for the division gate drive of the present invention because of a plurality of gate electrodes and a larger number of gate electrode terminals than the number of collector terminals (or emitter terminals). An IGBT module having a preferable arrangement can be realized by practical mounting or the like.

(Sixth Embodiment)

Figure 49:
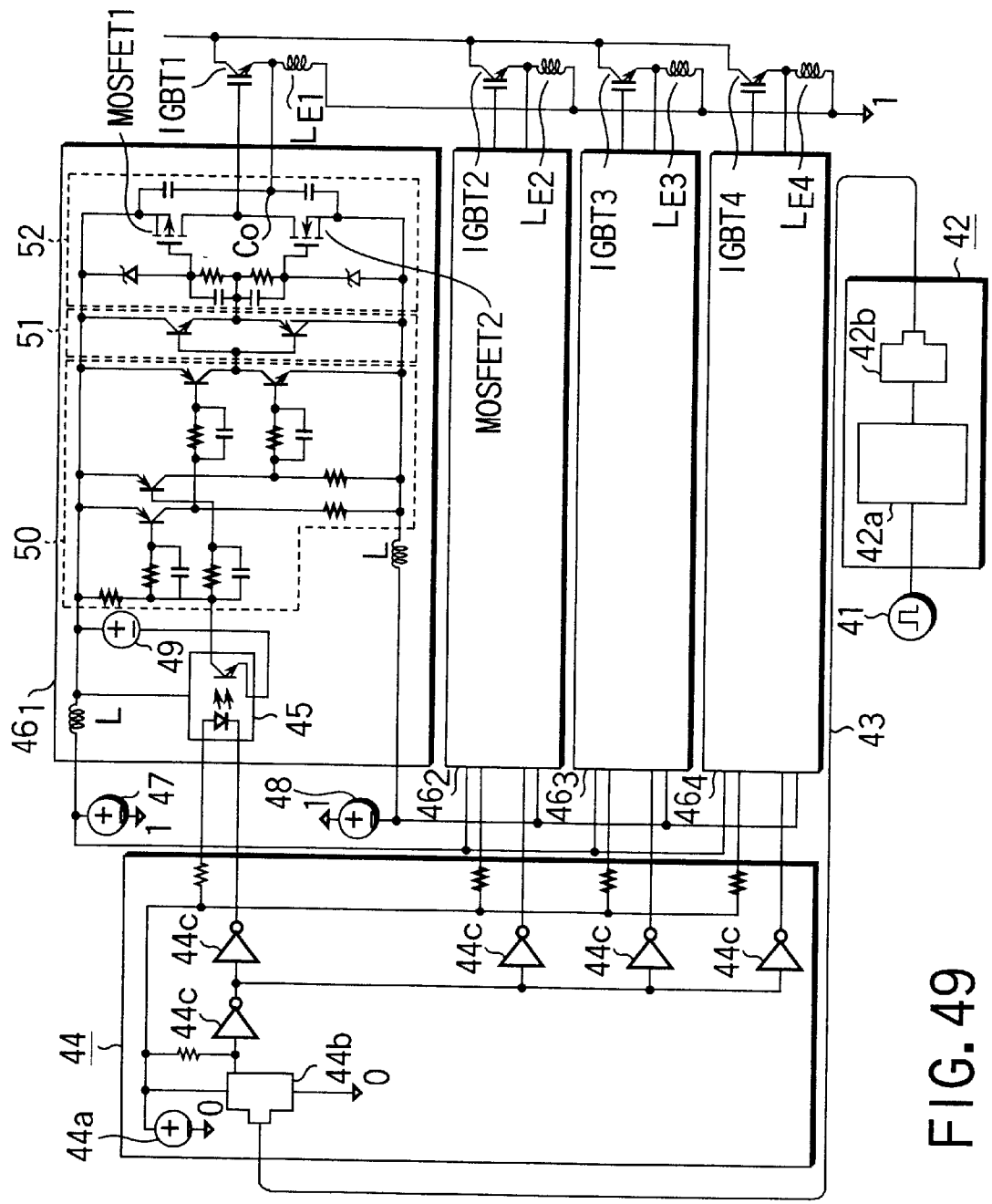
FIG. 49 is a circuit diagram showing the arrangement of a gate drive apparatus according to the sixth embodiment of the present invention.

FIG. 49 is a circuit diagram showing the arrangement of a gate drive apparatus according to the sixth embodiment of the present invention. The sixth embodiment is a detailed example of a gate drive apparatus using a photocoupler in order to completely insulate respective gate circuits, as described in the fifth embodiment.

This gate drive apparatus comprises a signal source 41 for generating a drive signal for driving the circuit, a light-transmitting section 42 for converting the drive signal received from the signal source 41 into an optical signal and transmitting the optical signal, a photocoupler drive circuit 44 for converting the optical signal received from the light-transmitting section 42 via an optical fiber cable 43 into a current signal, four gate drive circuits $46_1$ to $46_4$ for receiving the current signal from the photocoupler drive circuit 44 while electrically insulating it by a photocoupler 45, and driving the gates of IGBT1 to IGBT4 on the basis of the received signal, and positive and negative DC power supplies 47 and 48 connected to the gate drive circuits $46_1$ to $46_4$.

The light-transmitting section 42 has a light-transmitting module drive circuit 42a and light-transmitting module 42b. The light-transmitting module drive circuit 42a converts the level or the like of a drive signal from the signal source 41 to a drive signal for the light-transmitting module 42b. The light-transmitting module 42b converts the converted drive signal into an optical signal and transmits the optical signal to the optical fiber cable 43.

The photocoupler drive circuit 44 comprises a DC power supply 44a for mainly supplying a positive voltage to the primary-side anode of the photocoupler 45 in each of the gate drive circuits $46_1$ to $46_4$, a light-receiving module 44b for converting an optical signal on the optical fiber cable 43 into an electrical signal, an inverter 44c for supplying the electrical signal to the primary-side cathode of each photocoupler 45, and the like.

The gate drive circuits $46_1$ to $46_4$ have the same arrangement, and the gate drive circuit $46_1$ will be exemplified.

The gate drive circuit $46_1$ has an inductance L for AC-insulating the positive and negative DC power supplies 47 and 48 from each amplification section and the like on the subsequent stage, a DC power supply 49 on the negative side of the photocoupler 45, the photocoupler 45 for transmitting a current signal received from the photocoupler drive circuit 44 as a drive signal to a voltage amplification section 50 on the subsequent stage while electrically insulating the current signal, the voltage amplification section 50 for amplifying the voltage of the drive signal and supplying the voltage-amplified signal to a current amplifier (emitter follower) section 51, the current amplification section 51 for amplifying the current of the voltage-amplified drive signal and supplying the current-amplified signal to an output section 52, and the output section 52 which drives MOSFET1 and MOSFET2 based on the current-amplified drive signal, outputs a gate signal to the gate of IGBT1, and has a common-side point Co directly connected to the emitter of IGBT1. with this arrangement, the following effects can be attained.

More specifically, since the potential at the point Co of the output section 52 is AC-insulated by the inductance L from the positive and negative DC power supplies 47 and 48, the power supplies 47 and 48 of the gate drive circuits $46_1$ to $46_4$ can be shared. Note that the power supplies 47 and 48 may be arranged for each of the gate drive circuits $46_1$ to $46_4$. (In this case, a DC-DC converter, regulator, or the like may be used as a power supply). Further, a resistance may be connected in place of the inductance L to obtain the same effects.

The gate drive circuits $46_1$ to $46_4$ and photocoupler drive circuit 44 are electrically insulated via the photocoupler 45, and the light-transmitting module 42b and light-receiving module 44b are connected by an optical signal. Hence, even if parasitic inductances exist between the ground of the gate drive circuits $46_1$ to $46_4$ and the emitters of IGBT1 to IGBT2, MOSFET1 and MOSFET2 in the output section can reliably operate to apply the gate voltage Vg between the emitters and gates of IGBT1 to IGBT4.

Even if noise is superposed on the signal system, the common mode rejection ratio (CMMR) of the photocoupler 45 can greatly reduce malfunctions of the gate drive circuits $46_1$ to $46_4$ arising from noise.

Since optical transmission is done separately from the power supply system, no current flows from the power supply upon switching or through the main current power supply or ground wiring, and malfunctions caused by the falling of a thunderbolt or large-current switching can be prevented.

Figure 50:
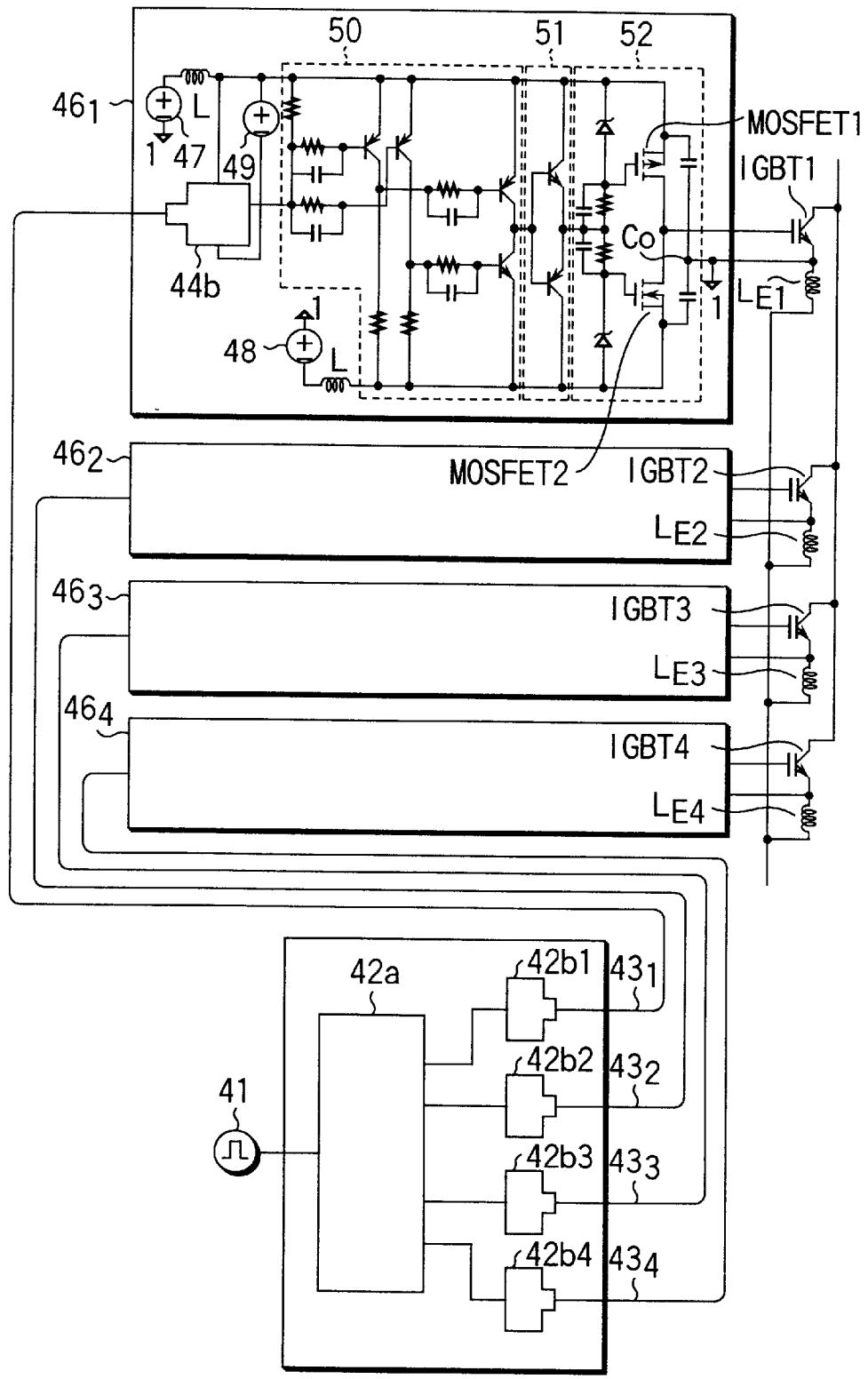
FIG. 50 is a circuit diagram showing a modification of the sixth embodiment.

The sixth embodiment can be modified into an arrangement in which light-transmitting modules 42b1 to 42b4 equal in number to the gate drive circuits $46_1$ to $46_4$ are parallel-arranged to individually supply optical signals to the light-receiving modules 44b in the gate drive circuits $46_1$ to $46_4$ via optical fiber cables $43_1$ to $43_4$, as shown in FIG. 50. This modification can independently transmit four optical signals via the optical fiber cables $43_1$ to $43_4$ to realize more stable gate driving.

"▽" in FIGS. 49 and 50 are distributed grounds for the gate drive circuits $46_1$ to $46_4$, and the gate drive circuits $46_1$ to $46_4$ can take different potentials.

(Seventh Embodiment)

Figure 51:
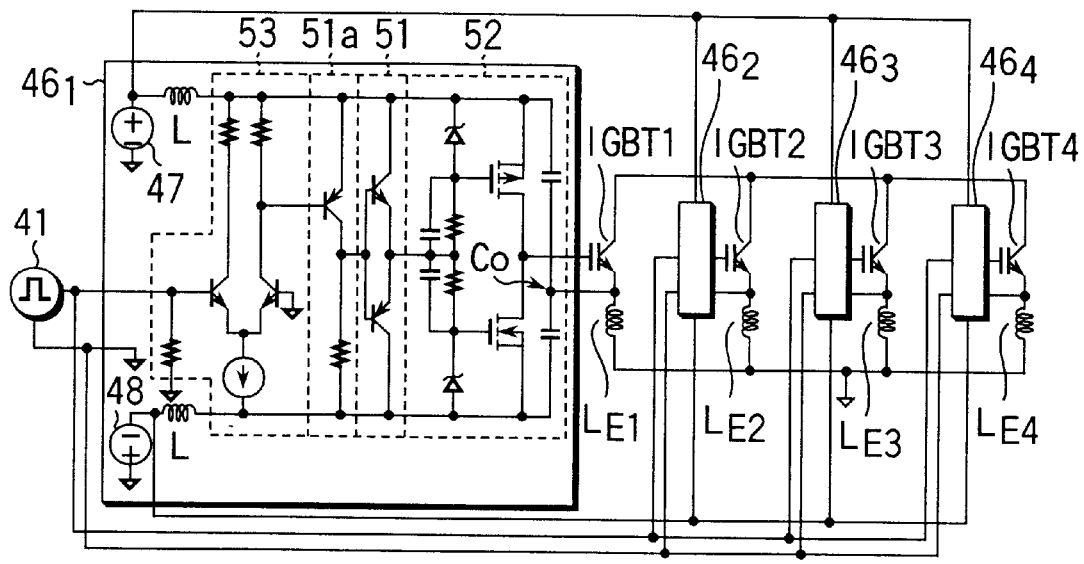
FIG. 51 is a circuit diagram showing the arrangement of a gate drive apparatus according to the seventh embodiment of the present invention.

FIG. 51 is a circuit diagram showing the arrangement of a gate drive apparatus according to the seventh embodiment of the present invention. The seventh embodiment is a modification of the sixth embodiment that comprises a differential circuit 53 instead of the photocoupler 45.

A voltage amplification section 50a is constituted by a one-stage circuit without using any speed-up capacitor and resistance.

Figure 52:
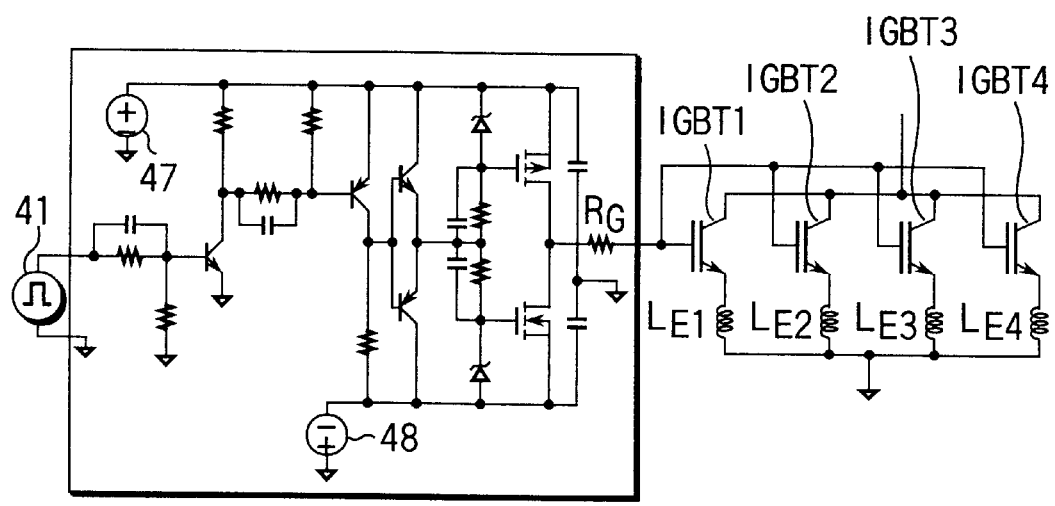
FIG. 52 is a circuit diagram showing a conventional arrangement for explaining the effects of the seventh embodiment.

According to this arrangement, since the input stage adopts the differential circuit 53, unlike the prior art in FIG. 52, MOSFET1 and MOSFET2 in an output section 52 can reliably operate even with parasitic inductances in the emitters of gate drive circuits $46_1$ to $46_4$ to apply the gate voltage between the emitters and gates of IGBT1 to IGBT4.

Since the input stage adopts the differential circuit 53, even if noise is superposed on the signal system, the common mode rejection ratio (CMMR) of the differential circuit 53 can greatly reduce malfunctions of the gate drive circuits $46_1$ to $46_4$ arising from noise.

Since the current can be controlled by the emitter side of the differential circuit 53, the current consumption can be reduced to downsize the power supply. Consequently, the design margin and application range can be widened. Since no current flows through the power supply or ground wiring, malfunctions caused by the falling of a thunderbolt or large-current switching can be prevented.

(Eighth Embodiment)

Figure 53:
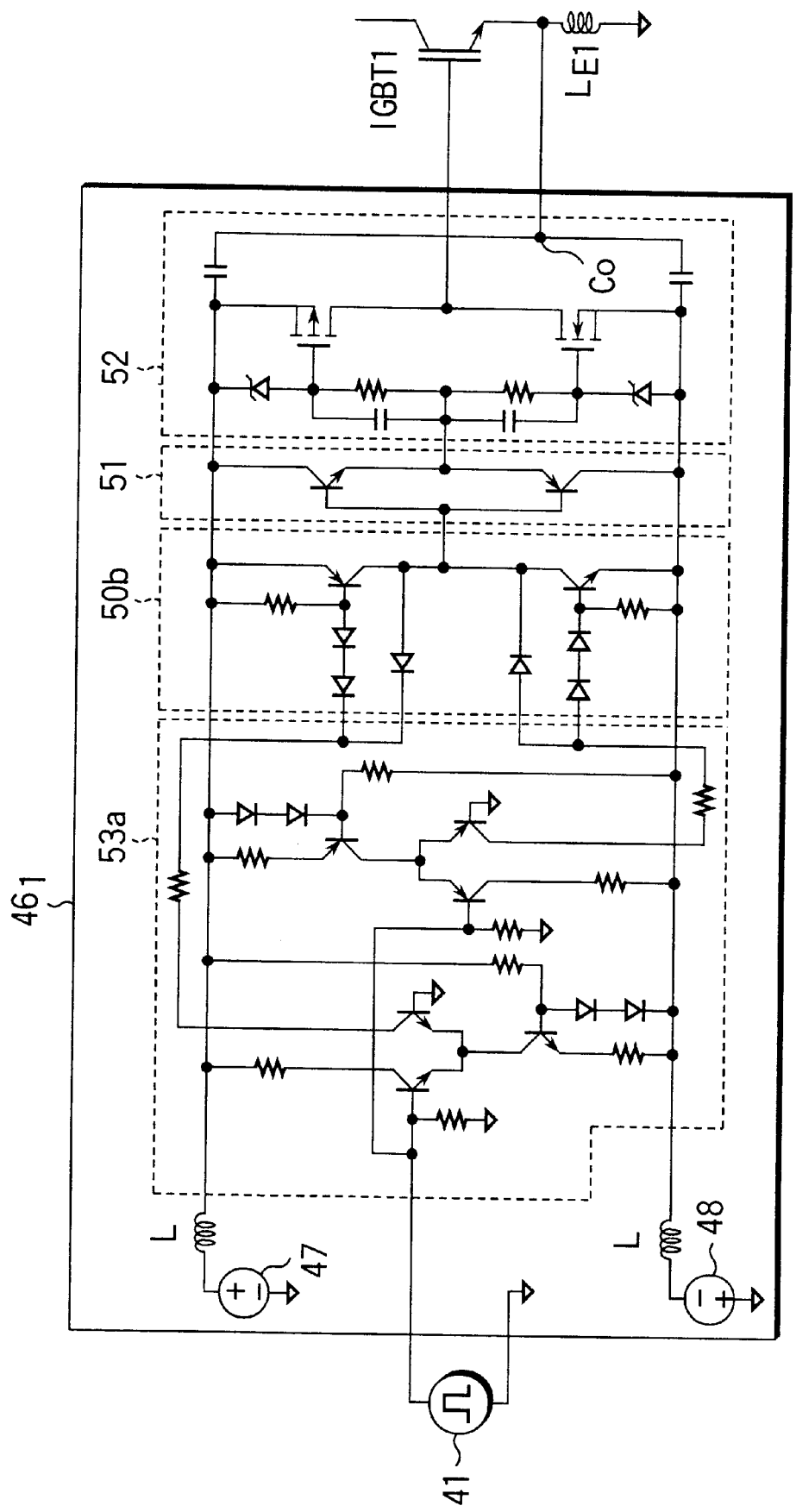
FIG. 53 is a circuit diagram showing the arrangement of a gate drive apparatus according to the eighth embodiment of the present invention.

FIG. 53 is a circuit diagram showing the arrangement of a gate drive apparatus according to the eighth embodiment of the present invention. The eighth embodiment is a modification of the seventh embodiment in which a differential circuit 53a is constituted by two stages. Along with this, a voltage amplification section 50b is added with a resistance and diode, as shown in FIG. 53.

This arrangement can attain the following effects in addition to the effects of the seventh embodiment.

Since switching operation is performed by not saturation operation by non-saturation operation except for MOSFET1 and MOSFET2 of an output section 52, a stable high-speed drive waveform can be obtained without any delay by the accumulation time of gate drive circuits $46_1$ to $46_4$.

In particular, the gate drive circuits $46_1$ to $46_4$ do not use any speed-up capacitor. Even if the plurality of gate drive circuits $46_1$ to $46_4$ are operated by one signal source 41, the timing is not shifted by the accumulation times of switching devices between the gate drive circuits $46_1$ to $46_4$.

In addition, the gate drive circuits $46_1$ to $46_4$ do not use any capacitor except for capacitors on the input sides of MOSFET1 and MOSFET2 in the output section 52, the influence of switching noise of IGBT1 to IGBT4 hardly appears, and stable high-speed switching can be realized.

Since the circuit arrangement is symmetrical between the positive and negative sides, the circuit rarely malfunctions with respect to noise. An inductance L AC-insulates the positive and negative DC power supplies 47 and 48 from circuits 53 and 50 to 52 on the output stage, so that the signal source 41 and power supplies 47 and 48 can be realized with a smaller number than the number of gate drive circuits $46_1$ to $46_4$. Further, each of the signal source 41 and power supplies 47 and 48 can be shared by the gate drive circuits $46_1$ to $46_4$.

(Ninth Embodiment)

Figure 54:
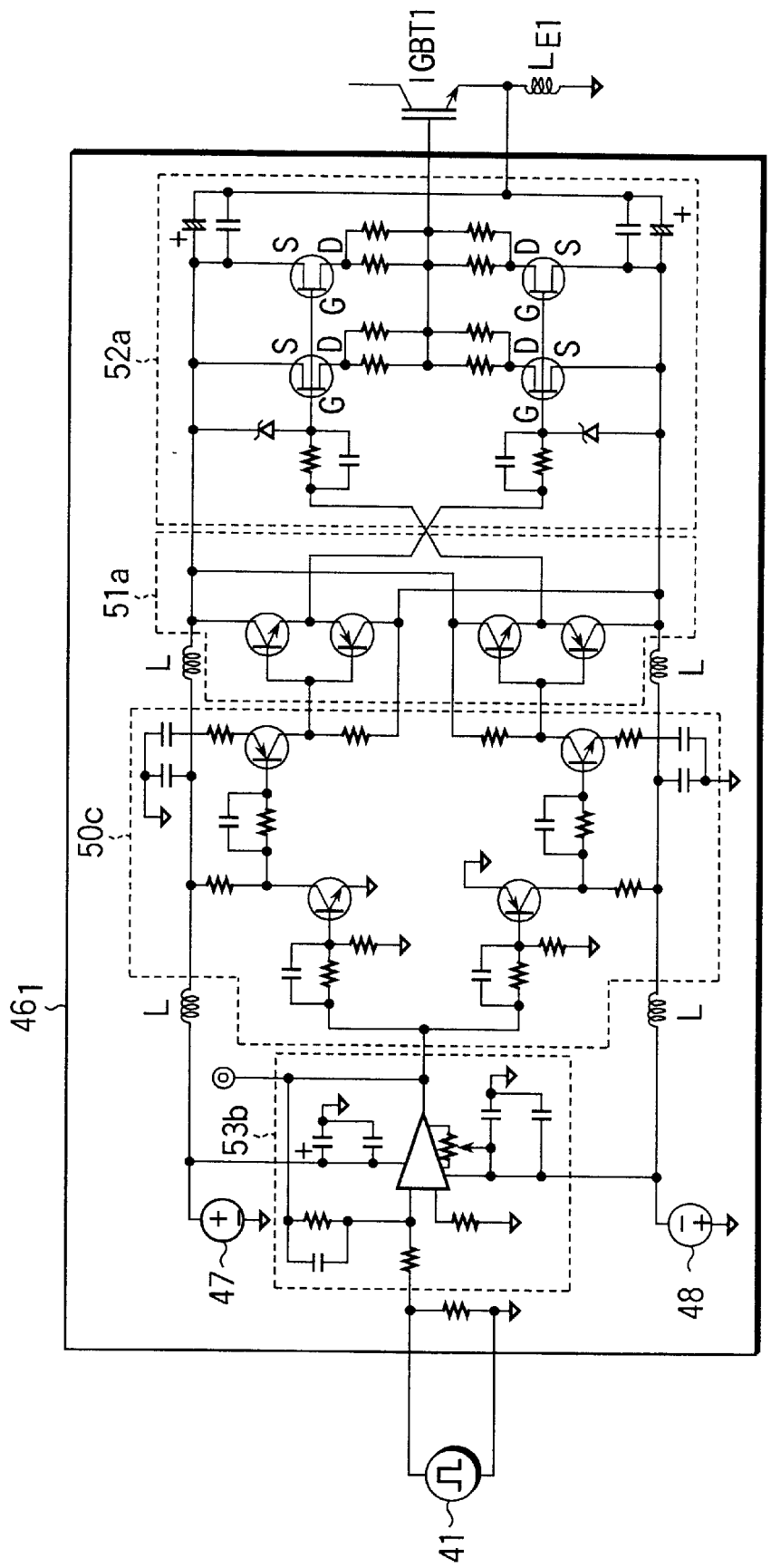
FIG. 54 is a circuit diagram showing the arrangement of a gate drive apparatus according to the ninth embodiment of the present invention.

FIG. 54 is a circuit diagram showing the arrangement of a gate drive apparatus according to the ninth embodiment of the present invention. The ninth embodiment is a modification of the seventh embodiment in which a differential circuit 53b is realized by an operational amplifier and circuits in a voltage amplifier section 50c and current amplifier section 51a on the subsequent stage are parallel-arranged symmetrically between the positive and negative sides. Inductances L are inserted between DC power supplies 47 and 48 and the voltage amplifier section 50c and between the voltage amplifier section 50c and the current amplifier section 51a.

This arrangement can attain the following effects in addition to the effects of the seventh embodiment.

Since the two inductances L are inserted in the power supply system to AC-insulate the DC power supplies 47 and 48 from an output section 52a, the same effects as described above can be obtained.

Figure 55:
FIG. 55 is a waveform chart showing an operation waveform for explaining the effects of the ninth embodiment.

FIG. 55 is a waveform chart showing an operation waveform when IGBT1 to IGBT4 are switched by inserting parasitic inductances on their emitter sides. As shown in FIG. 55, since parasitic inductances exist between the ground of gate drive circuits $46_1$ to $46_4$ and IGBT1 to IGBT4, an oscillation waveform up to 60V is generated on the ground-gate voltage, but the gate pulse is reliably applied between the emitters and gates of IGBT1 to IGBT4.

In other words, according to the ninth embodiment, as confirmed by the waveform chart in FIG. 55, the influence of changes in gate potential by the parasitic inductances of the emitters of IGBT1 to IGBT4 can be reduced to flow a stable main current free from current concentration and prevent destruction of the IGBT device.

(10th Embodiment)

Figure 56:
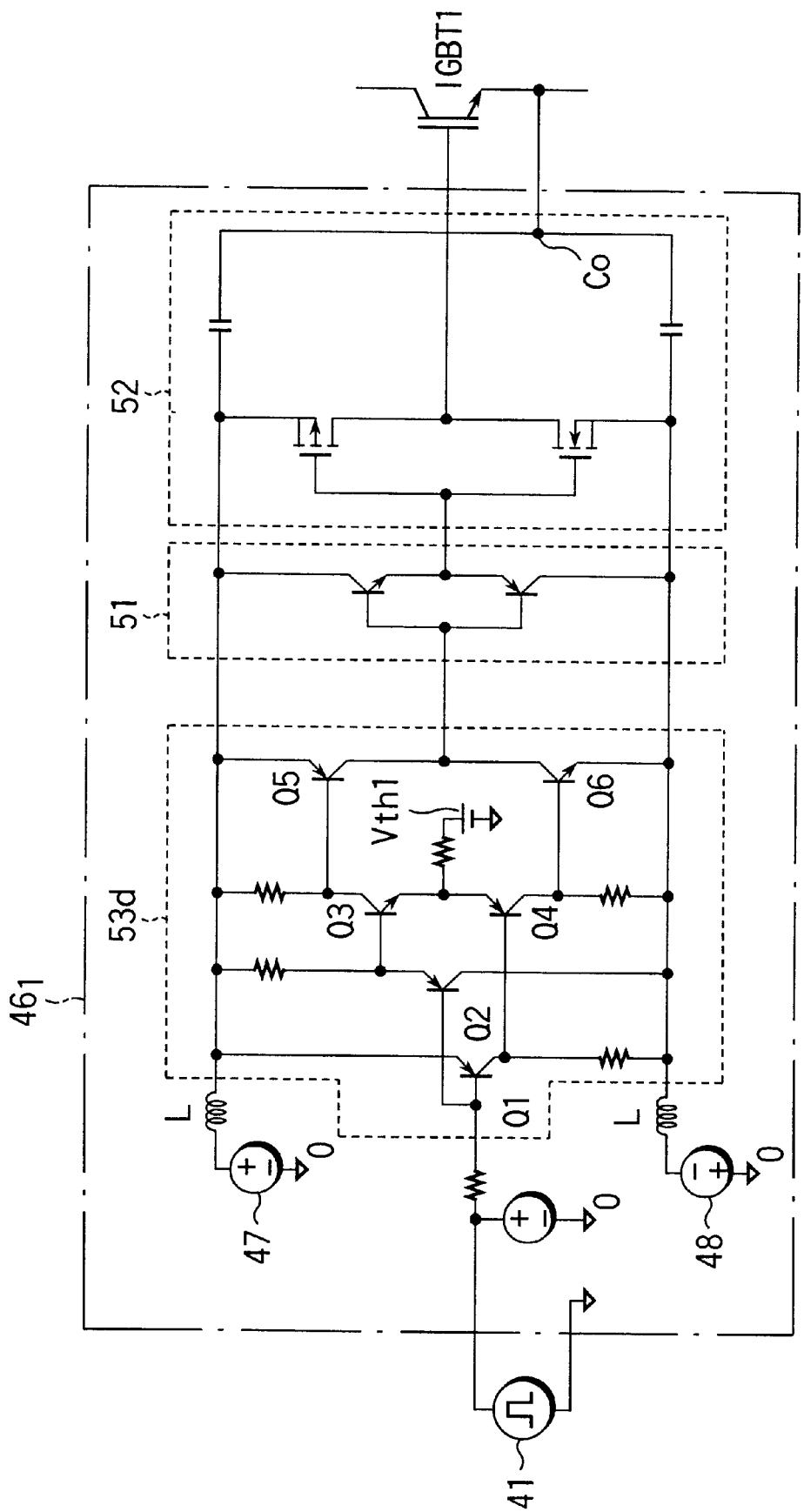
FIG. 56 is a circuit diagram showing the arrangement of a gate drive apparatus according to the 10th embodiment of the present invention.

FIG. 56 is a circuit diagram showing the arrangement of a gate drive apparatus according to the 10th embodiment of the present invention. The 10th embodiment is a modification of the seventh embodiment in which a differential circuit 53d is realized by a current differential circuit using a total of six transistors Q1 to Q6 including two bias transistors Q1 and Q2 on the initial stage.

Gate resistances (not shown) between IGBT1 to IGBT4 and gate drive circuits $46_1$ to $46_4$ are defined to have a resistance value of 15Ω or less per effective device area of 1 cm$^2$ for the IGBT device.

With this arrangement, the dead region on the initial stage can be eliminated by the two bias transistors Q1 and Q2 on the initial stage to increase the precision for the threshold voltage Vth1, in addition to the effects of the seventh embodiment.

Since the gate resistance is defined to have 15Ω or less per effective device area of 1 cm², all IGBT1 to IGBT4 can be switched easily, reliably, and uniformly, and the cut-off current can be greatly increased.

Next, the peripheral arrangement of IGBT1 to IGBT4 will be described by exemplifying an application of the gate drive apparatus shown in FIG. 56. In the following application example, the gate resistance is defined to have 15Ω or less per effective device area of 1 cm².

Figure 57:
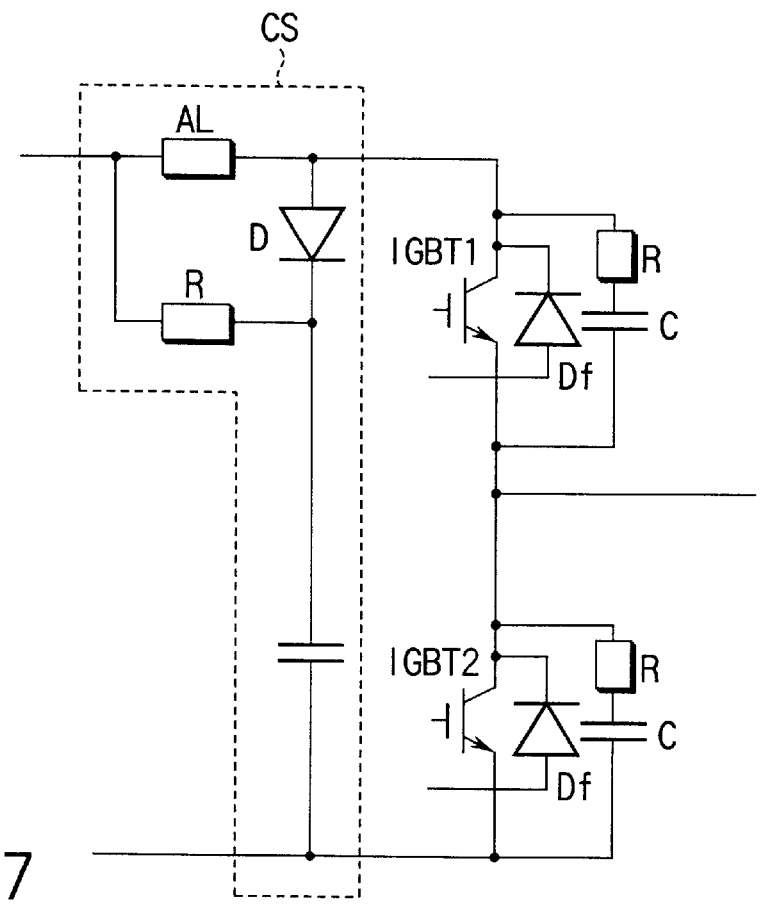
FIG. 57 is a circuit diagram for explaining an application example in the 10th embodiment.

FIG. 57 is a circuit diagram showing IGBT1 and IGBT2 having antiparallel diodes Df and their RC snubber circuit. Capacitors C of the RC snubber circuit are arranged close to IGBT1 and IGBT2 in the device module. The capacitor C has a value as small as 10 nF to 66 nF with respect to a cut-off current of 100 A to 200 A (in the prior art, 100 nF to 300 nF with respect to 100 A to 200 A).

The value of the capacitor C is set to obtain the same dv/dt as the conventional gate resistance in order to avoid destruction by a high dv/dt with a small gate resistance. By setting the value of the capacitor C in this way, the device loss can be reduced to increase the inverter efficiency. Although a resistance R has about 5Ω, it may be omitted or replaced with a charge/discharge CRD snubber.

As shown in FIG. 57, a clamp snubber circuit CS can be further employed in order to enhance the current cut-off ability.

Figure 58:
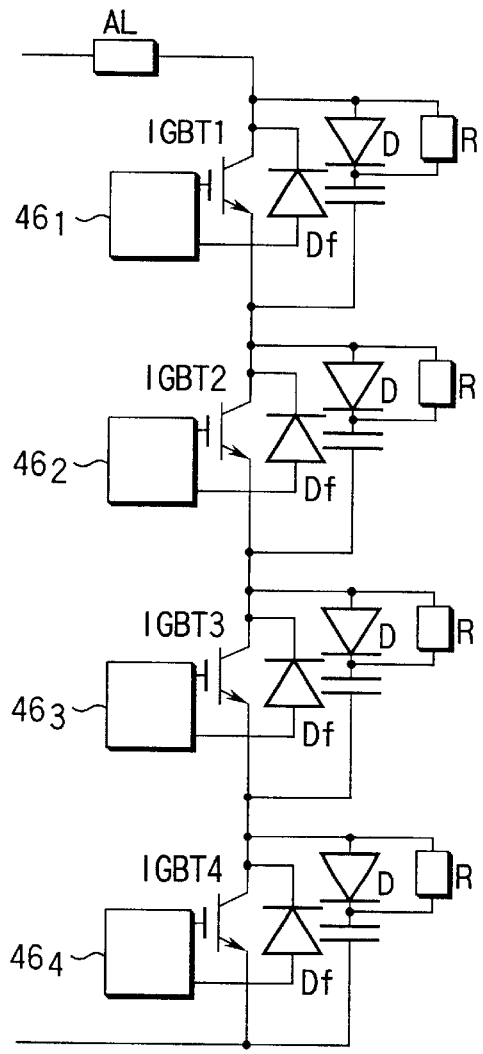
FIG. 58 is a circuit diagram for explaining another application example in the 10th embodiment.

The RC snubber circuit in FIG. 57 may be modified into an LCD snubber circuit by parallel-connecting a diode D to the resistance R, as shown in FIG. 58. In this LCD snubber circuit, IGBT devices may be series-connected. An anode reactor AL is 1 μH or less with respect to 1,000 A, and desirably 0.5 μH or less.

Figure 59:
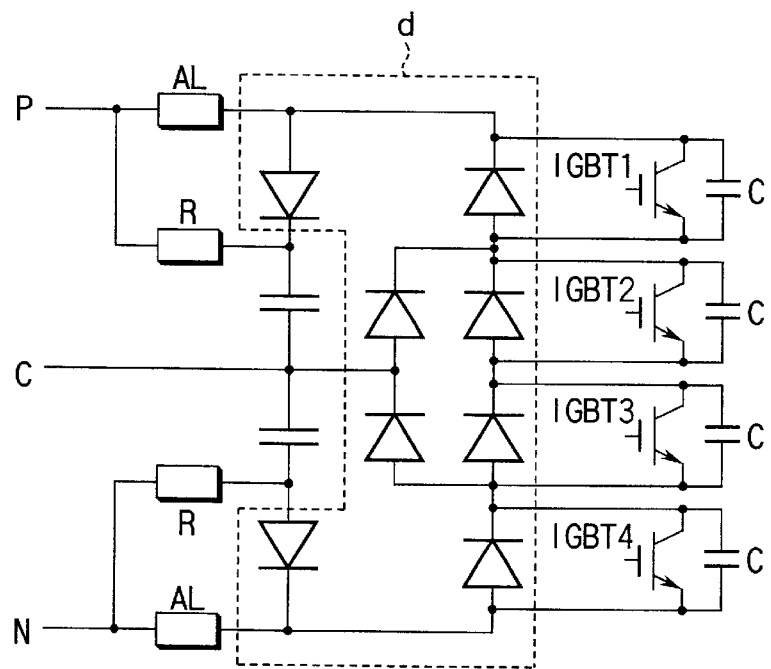
FIG. 59 is a circuit diagram for explaining still another application example in the 10th embodiment.

FIG. 59 is a circuit diagram showing an application example to an NPC (3-level inverter, neutral point clamp circuit). The diode D portion surrounded by the broken line d can be formed into one package to reduce the inductance and increase the effects of the snubber circuit. The IGBT device is appropriately parallel-connected to a capacitor C (or CR or CRD snubber circuit) having a small value and uses a gate resistance RG having a small value, as described above, thereby increasing the efficiency and current cut-off ability.

(11th Embodiment)

Figure 60:
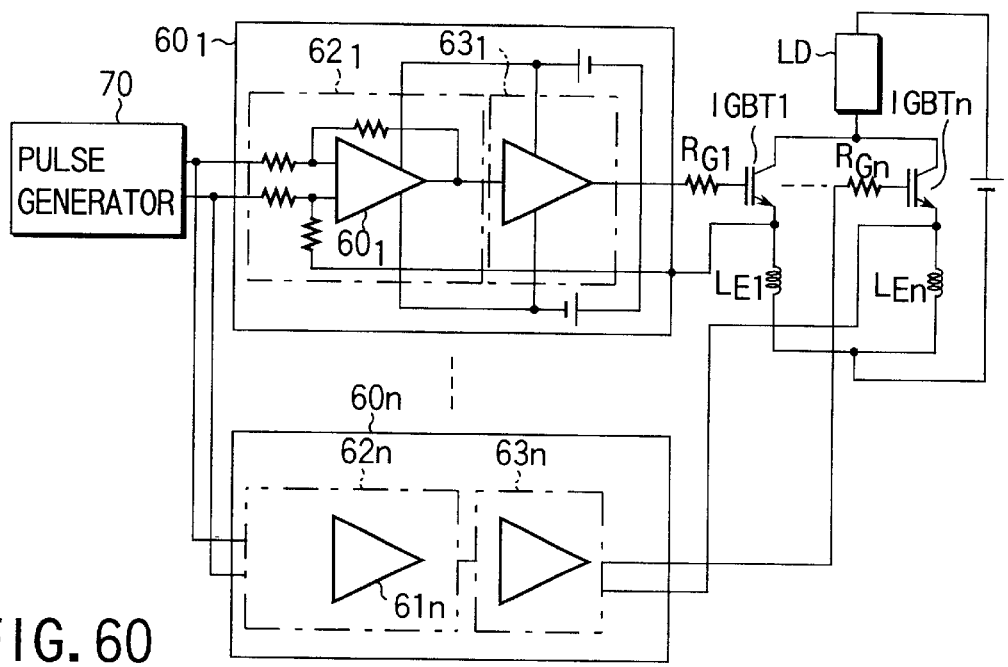
FIG. 60 is a circuit diagram showing a floating gate circuit applied to a semiconductor device according to the 11th embodiment of the present invention.

FIG. 60 is a circuit diagram showing a floating gate circuit applied to a semiconductor device according to the 11th embodiment of the present invention.

This floating gate circuit comprises n gate drive circuits $60_1$ to $60_n$ equal in number to n IGBT1 to IGBTn chips or devices parallel-connected to a load LD. The gate drive circuits $60_1$ to $60_n$ are connected to a common pulse generator 70 for generating a gate pulse signal.

The gate drive circuits $60_1$ to $60_n$ respectively comprise voltage amplifiers $62_1$ to $62_n$ serving as differential amplifier circuits using arithmetic amplifiers $61_1$ to $61_n$ for amplifying gate pulse signals input from the pulse generator, and current amplifiers $63_1$ to $63_n$ for amplifying the currents of the gate pulse signals amplified by the voltage amplifiers $62_1$ to $62_n$ and outputting the amplified signals to gate resistances RG1 to RGn.

The current amplifiers $63_1$ to $63_n$ have an output impedance as small as several Ω to 1Ω or less per chip effective area of 1 cm², and can turn on/off the gates of IGBT1 to IGBTn via the gate resistances RG1 to RGn at a high speed. Note that the gate resistances RG1 to RGn correspond to the drive method of the present invention and have a resistance value about 1/10 the general value.

Since the internal chip emitter and external emitter terminal of the package are connected via a wiring lead, parasitic inductances $L_{E1}$ to $L_{En}$ of several nH to several ten nH exist in respective chips.

When IGBT1 to IGBTn are driven without using any floating gate circuit of the 11th embodiment, the common side of the gate drive circuit is connected to the external emitter terminal of the package. Then, the effective gate potential between the emitter and gate of each chip changes under the influence of the above-described parasitic inductances $L_{E1}$ and $L_{En}$ upon turn-off operation.

In the 11th embodiment, however, in order to reduce the influence of the parasitic inductances $L_{E1}$ and $L_{En}$, a gate pulse signal from the pulse generator 70 is received by the arithmetic amplifiers $61_1$ to $61_n$, and the common sides of the arithmetic amplifiers $61_1$ to $61_n$ are directly connected to the emitters of the IGBT1 to IGBTn chips. This arrangement allows applying a predetermined gate voltage between the emitter and gate without changing the effective gate potential between the emitter and gate.

Since the gate resistances RG1 to RGn have a small resistance value about 1/10 the general value, charges in the gate input capacitance can be quickly removed.

As a result, unbalance by oscillation of the main current flowing through each chip can be quickly canceled to stabilize and unify the main current. Compared to driving by a gate resistance having a general value, a decrease in safe operation area and controllable current can be prevented to hardly destroy the device. Accordingly, the design margin can be widened to improve applicability.

As described above, according to the 11th embodiment, since the gate drive circuits of the insulated gate semiconductor devices float in units of $60_1$ to $60_n$ chips and are driven at a low impedance, the influence of the parasitic inductances $L_{E1}$ to $L_{En}$ by wiring between the emitters and gates in the package can be eliminated to quickly suppress oscillation of the main current and prevent destruction of the device.

Instead of driving the gate drive circuits $60_1$ to $60_n$ in units of chips, respective chips may be grouped and the chips of each group may be driven. Even with this arrangement, the present invention can be similarly practiced to improve current unbalance in comparison with the conventional drive method.

(12th Embodiment)

Figure 61:
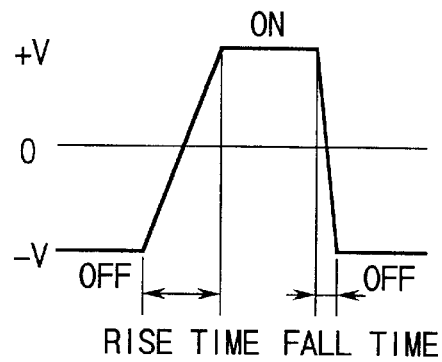
FIG. 61 is a waveform chart showing a gate pulse signal according to the 12th embodiment of the present invention.

FIG. 61 is a waveform chart showing a gate pulse signal output from a gate drive circuit applied to a semiconductor device according to the 12th embodiment of the present invention.

That is, the 12th embodiment is a modification of the 11th embodiment in which a pulse generator 70 has a function capable of individually setting the rise and fall times of the gate pulse signal.

As described above, the gate pulse signal generated by the pulse generator 70 is amplified by gate drive circuits $60_1$ to $60_n$ and applied to the gates of respective IGBTs.

For a smaller value of the gate resistance RG, the switching time is shorter and the switching loss is smaller. As the resistance of the gate resistance RG decreases, the rise and fall times shorten to increase the current change rate upon switching. This may destroy a freewheel diode (reflux diode) parallel-connected to the device upon turn-on operation.

The 12th embodiment solves this problem by setting the rise time of the gate signal upon turn-on operation long while keeping the fall time upon turn-off operation short, as shown in FIG. 61. Since gate driving is done with a low impedance in this manner, the same effects as in the 11th embodiment can be easily, reliably obtained upon turn-off operation.

Since the 12th embodiment can set the gate pulse signal more finely than the fifth embodiment as a digital circuit, gate driving can be further optimized. Since the gate signal can be applied as a low-impedance analog signal, the protective function and loss can be optimized to provide a basic arrangement for a future intelligent circuit.

(13th Embodiment)

Figure 62:
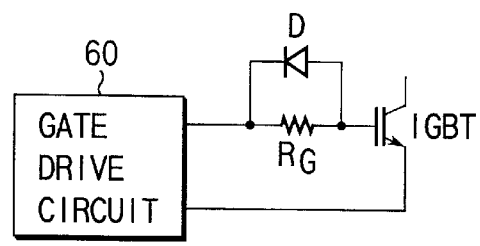
FIG. 62 is a circuit diagram showing a partial arrangement of a semiconductor device according to the 13th embodiment of the present invention.

FIG. 62 is a circuit diagram showing a partial arrangement of a semiconductor device according to the 13th embodiment of the present invention. In the arrangement of FIG. 60, a diode D is parallel-connected to a gate resistance RG in an opposite direction.

Upon turn-on operation, the gate resistance RG is series-connected to suppress the current change rate di/dt upon turn-on operation. Upon turn-off operation, a large amount of current can flow through the diode D at a low impedance to quickly remove charges in the gate input capacitance, similar to the 12th embodiment.

(14th Embodiment)

Figure 63:
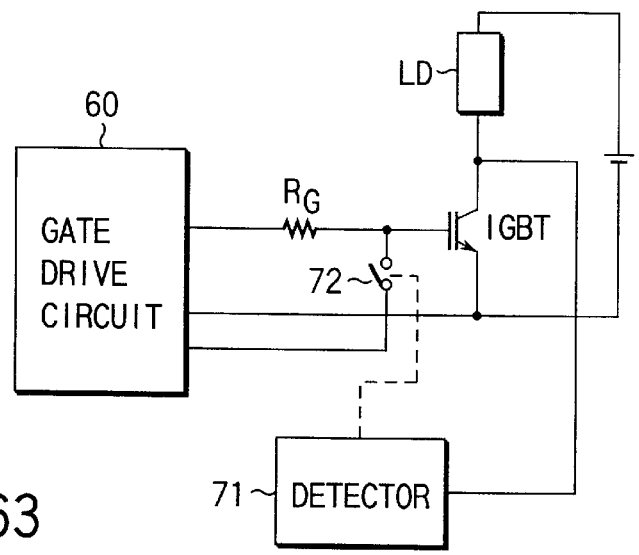
FIG. 63 is a circuit diagram showing a partial arrangement of a semiconductor device according to the 14th embodiment of the present invention.

FIG. 63 is a circuit diagram showing a partial arrangement of a semiconductor device according to the 14th embodiment of the present invention. A detector 71 for measuring the collector voltage of the IGBT, and a switching device 72 which is connected between a gate drive circuit 60 and gate in parallel with a gate resistance RG and controlled by the detector 71 are added to the arrangement of FIG. 60.

The detector 71 measures the emitter-collector (e-c) voltage, and if the measurement result exceeds a predetermined voltage, outputs an ON signal to the switching device 72.

The switching device 72 is connected to a negative power supply, and upon reception of the ON signal from the detector 71, turned on to decrease the impedance, connects the negative power supply and gate, and further flows a turn-off current. As the switching device 72, a MOSFET, transistor, or the like can be used.

According to the 14th embodiment, the impedance of gate driving can be more reliably decreased before the collector voltage $V_{CE}$ rises. Oscillation of the main current can be quickly suppressed to avoid current concentration in the device and destruction of the device.

At the same time, the gate voltage is also detected. When the e-c voltage is equal to or lower than a predetermined voltage, the switching device 72 need not be turned on, and general gate driving can attain the same effects.

(15th Embodiment)

The fourth to 14th embodiments mentioned above mainly concern the gate drive circuit. The following 15th to 22nd embodiments will mainly exemplify a semiconductor device module according to the present invention.

Figure 64:
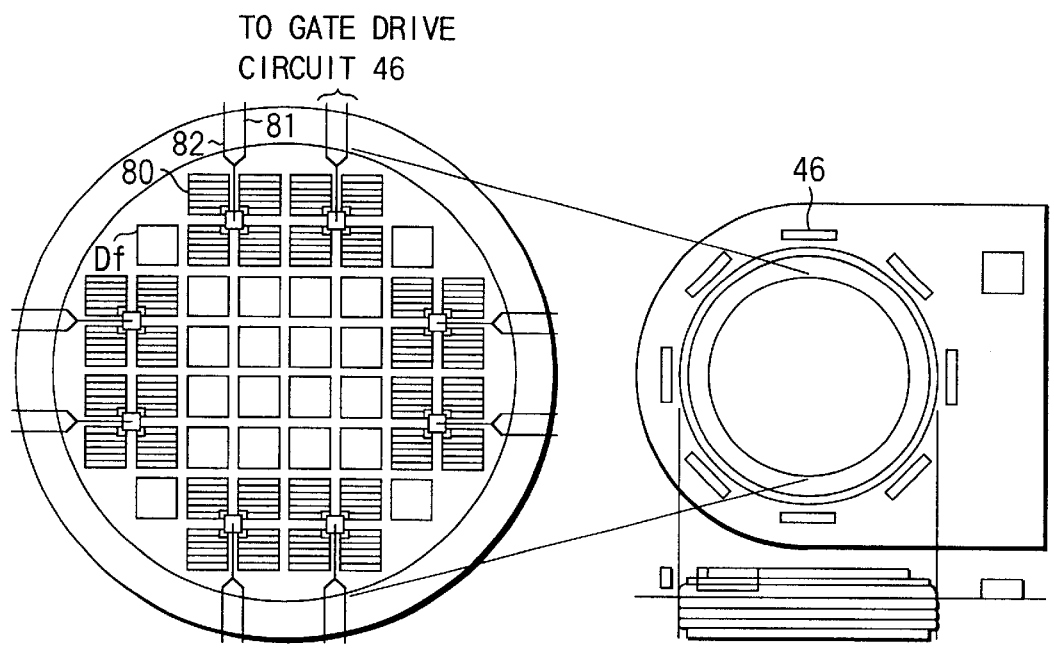
FIG. 64 is a plan view schematically showing the chip layout of a semiconductor device module according to the 15th embodiment of the present invention.

FIG. 64 is a plan view schematically showing the chip layout of a semiconductor device module according to the 15th embodiment of the present invention.

As shown in FIG. 64, IGBT chips 80 are grouped in units of four chips, and each group comprises gate and sense emitter wiring lines 81 and 82 to be connected to a peripheral gate drive circuit 46. Chips not grouped are chips for antiparallel diodes Df.

Figure 65A:
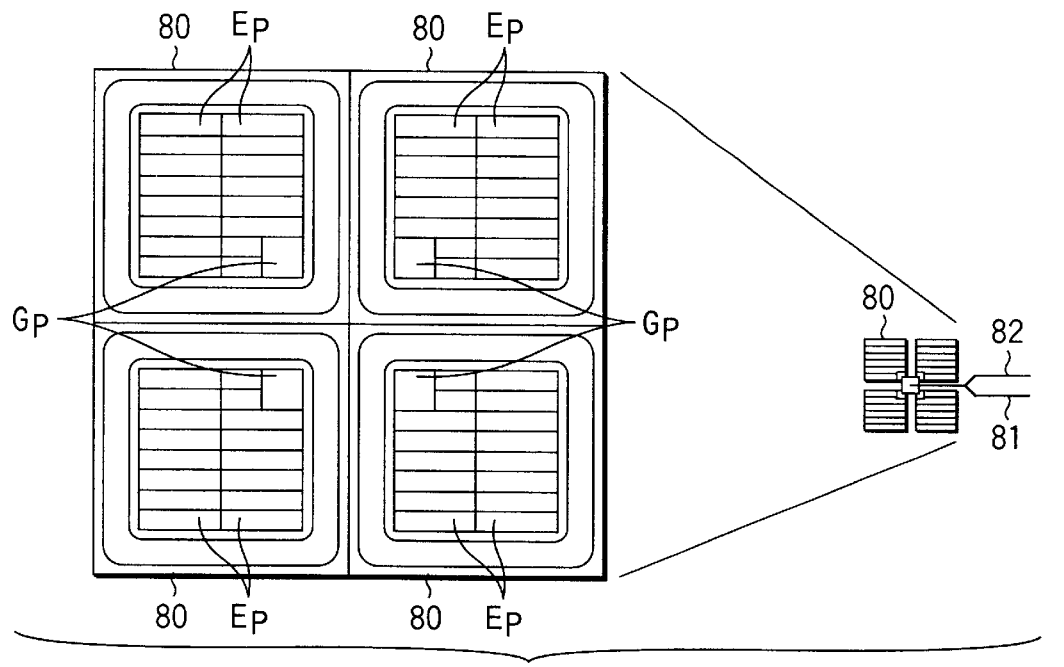
FIGS. 65A and 65B are plan views for explaining an IGBT chip in the 15th embodiment.
Figure 65B:
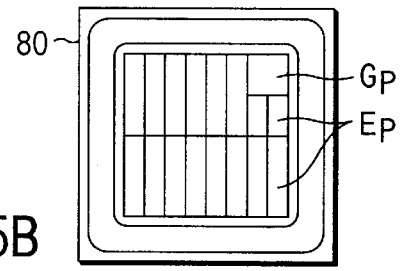

As the IGBT chips 80, two or more types of chips different in the position of a gate pad Gp are used, as shown in FIGS. 65A and 65B. In one group (four chips) of the IGBT chips 80, the gate pads Gp are laid out at the center and emitter pads Ep are laid out around the gate pads Gp with the longitudinal directions made to coincide each other, in order to symmetrically lay out respective chips and minimize the inductance of the gate wiring line 81. Note that the gate pads Gp may be arranged outside owing to limitations on the gate wiring line 81 or the like.

Figure 66A:
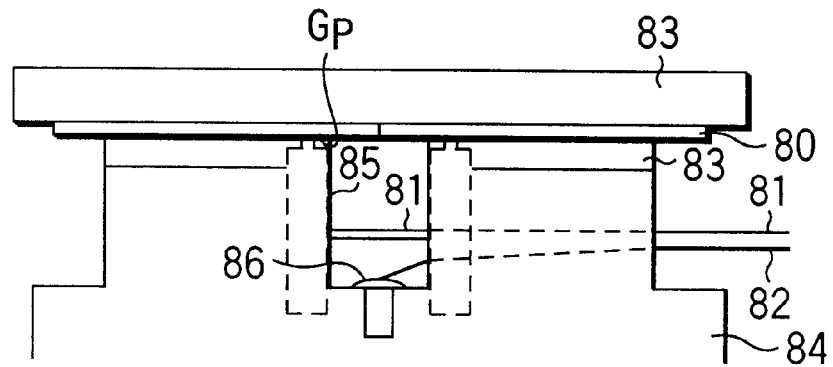
FIG. 66A is a schematic view for explaining the sectional structure of a wiring structure in the 15th embodiment.
Figure 66B:
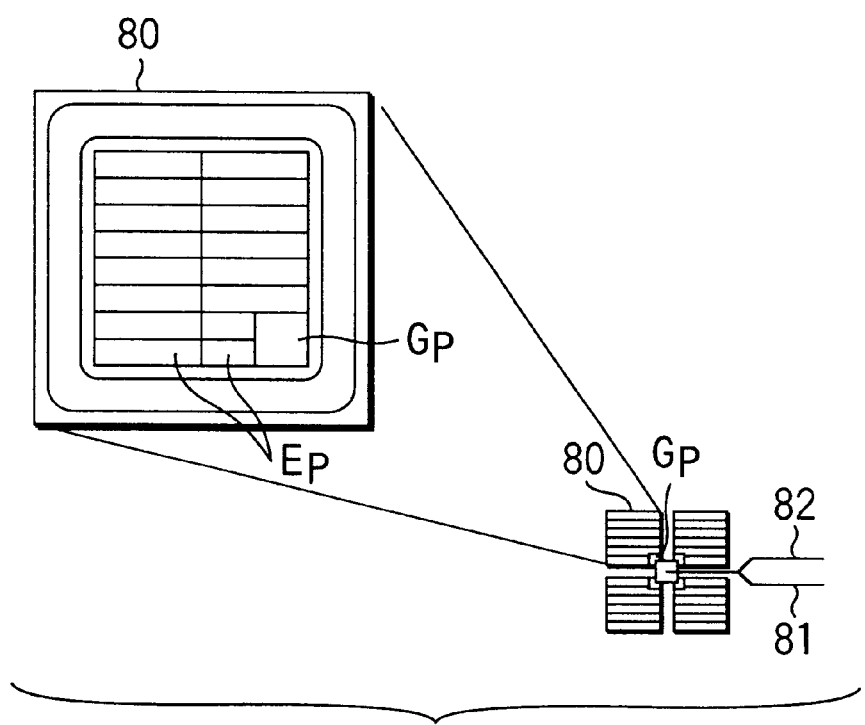
FIG. 66B is a plan view for explaining the arrangement of the IGBT chips in the 15th embodiment.
Figure 67A:
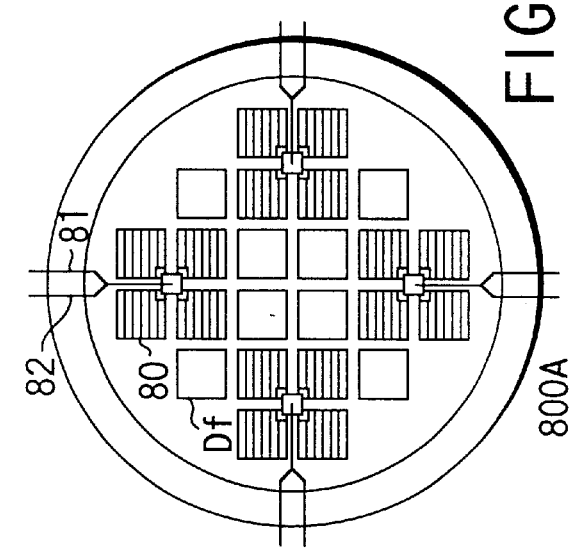
FIGS. 67A, 67B, 67C, and 67D are plan views each showing a modification of the chip layout in the 15th embodiment.
Figure 67B:
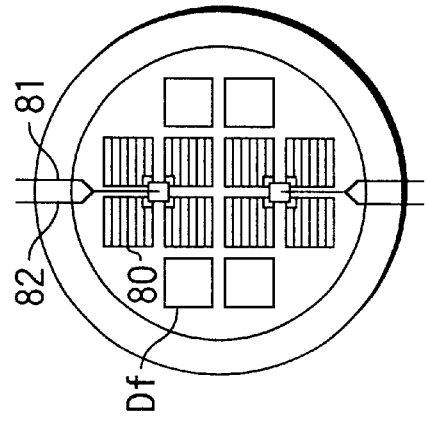
Figure 67C:
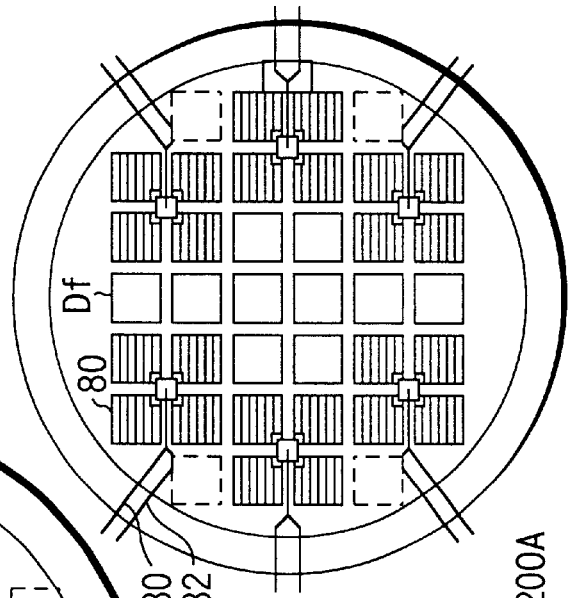
Figure 67D:
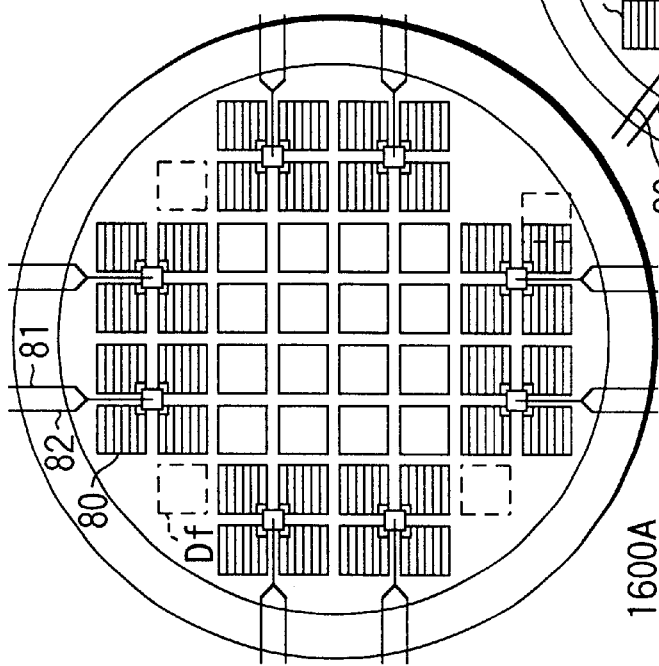

As for a detailed wiring structure, as shown in the sectional structure of FIG. 66A, a gate pin (conductive pin pressed by a spring) 85 attached to a copper emitter post 84 is in contact with the gate pad Gp of the IGBT chip 80 sandwiched between two molybdenum plates 83. The gate pin 85 is connected to the gate wiring line 81. FIG. 66B is a plan view for explaining the arrangement of the IGBT chips in the 15th embodiment.

The sense emitter wiring line 82 is extracted from the central position of the four chips 80 on the copper emitter post 84 via an emitter contact 86. The extraction position of the sense emitter wiring line 82 is desirably the center or near the center of the four chips 80 regardless of the position of the gate pad Gp.

According to this layout, two or more types of chips different in the position of the gate pad Gp are used as respective IGBT chips 80, and the chips are laid out point-symmetrically so as to collect, e.g., the gate pads Gp at the center. Hence, the length of the gate wiring line 81 can be minimized to minimize the gate inductance.

Figure 68:
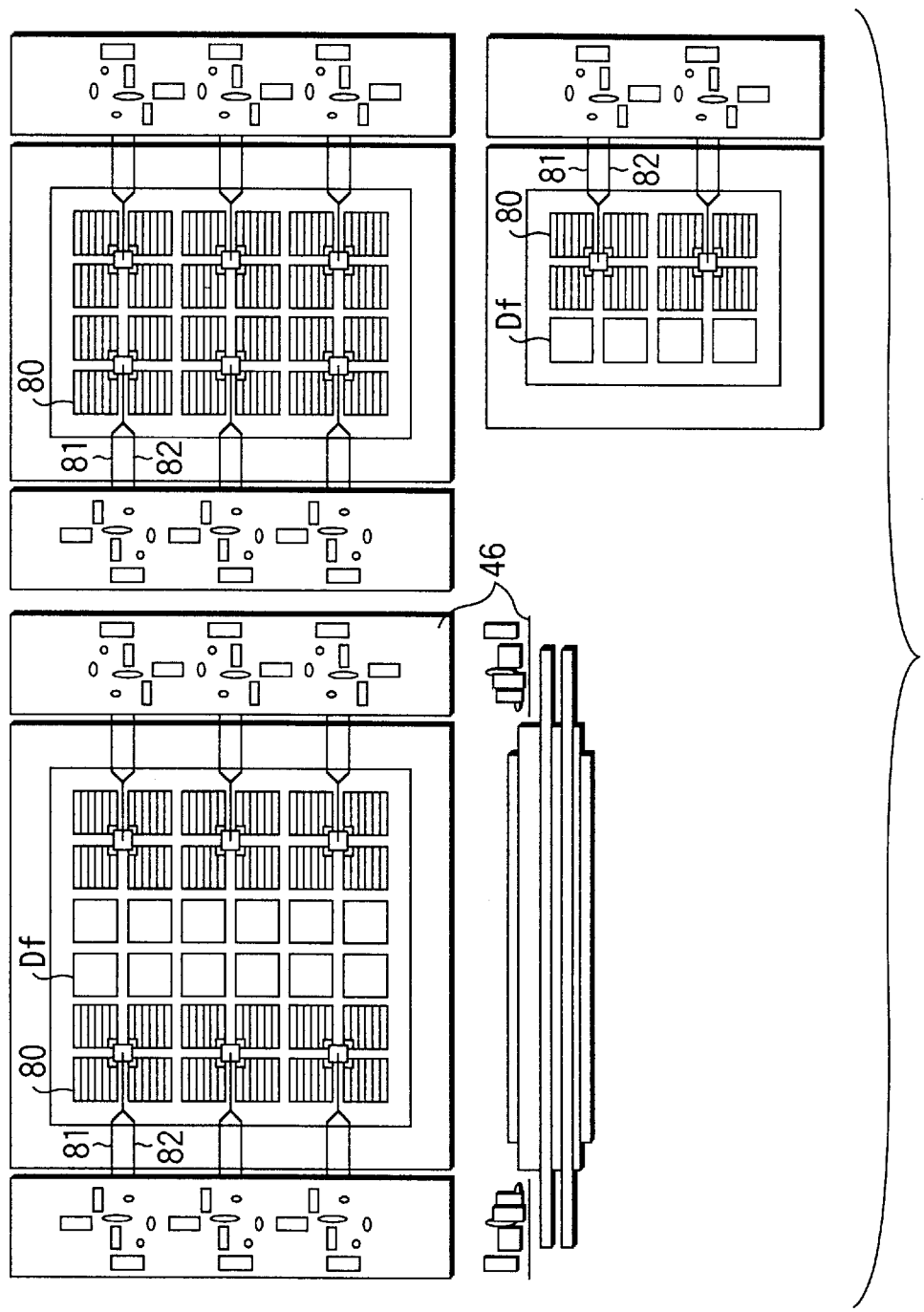
FIG. 68 is a plan view showing a modification of the module structure in the 15th embodiment.

The 15th embodiment can be variously modified in accordance with the cut-off current value, as shown in FIGS. 67A to 67D. The module structure is not limited to a circular shape and may be a square or rectangular shape, as shown in FIG. 68. The square or rectangular module structure can increase the density of the chip layout, compared to the circular module structure.

The number of grouped chips is 4 to 12 for a cold-welded package and 2 to 8 for a module package. For a chip area of 1 cm$^2$, the number of grouped chips is preferably directly proportional to the chip area.

(16th Embodiment)

Figure 69:
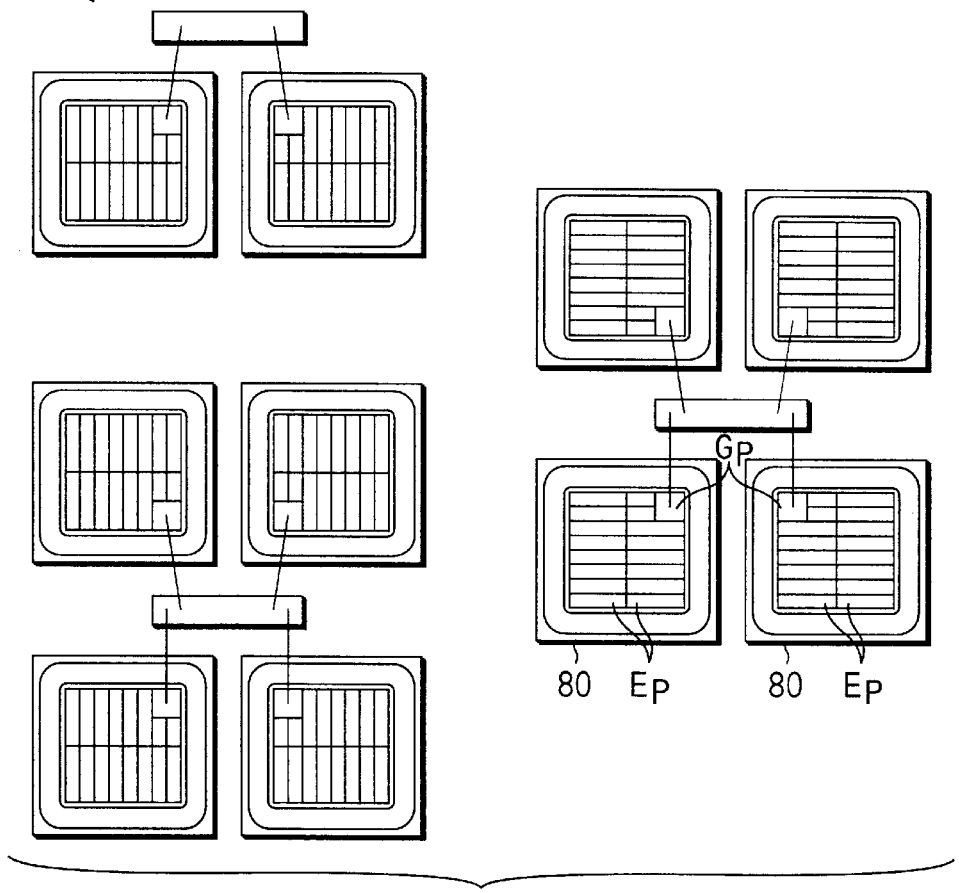
FIG. 69 is a plan view showing the chip layout of a semiconductor device module according to the 16th embodiment of the present invention.

FIG. 69 is a plan view showing the chip layout of a semiconductor device module according to the 16th embodiment of the present invention.

Figures 70A, 70B:
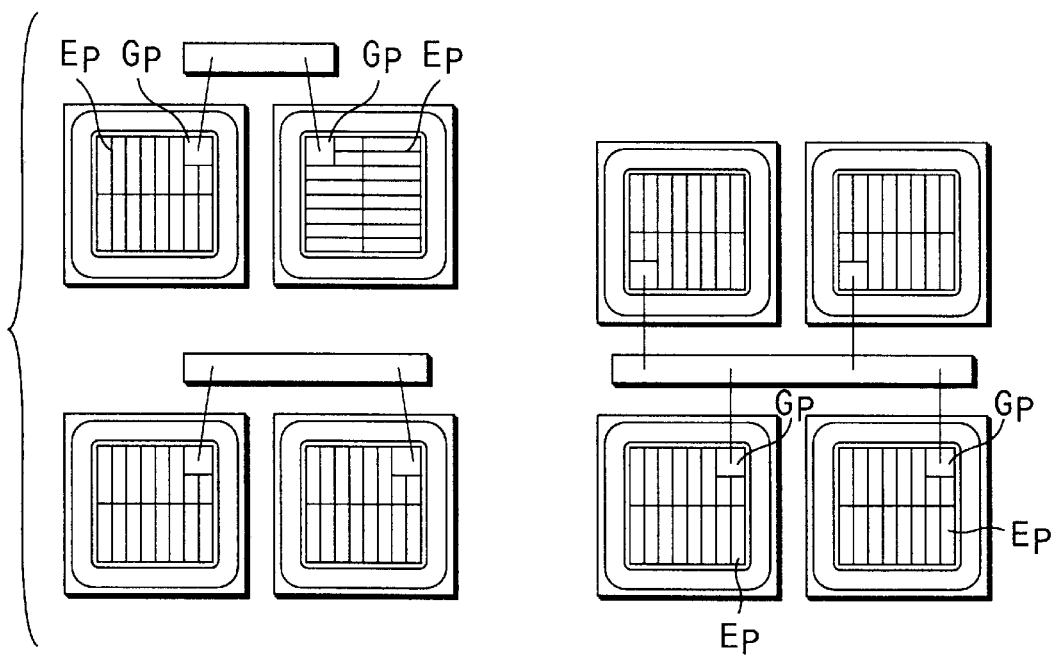
FIGS. 70A and 70B are plan views each showing a conventional layout for explaining problems to be solved by the 16th embodiment.

The 16th embodiment solves the conventional problem shown in FIG. 70A that if gate pads Gp are made close to each other, the longitudinal directions of emitter pads Ep shift from each other by 90° between chips not to reduce the inductance between emitters, and the conventional problem shown in FIG. 70B that if the longitudinal directions of the emitter pads Ep are aligned, the gate pads Gp of respective chips are distant from each other not to minimize the inductance between gates.

More specifically, in the 16th embodiment, two types of IGBT chips 80 having mirror-symmetrical gate and emitter pads Gp and Ep are used and properly laid out in order to minimize both the inductances of the emitter and gate, as shown in FIG. 69. In the layout shown in FIG. 69, the gate pads Gp of respective chips 80 are arranged close to each other.

This layout can minimize both the inductances of the emitter and gate.

The 16th embodiment can be modified as shown in FIGS. 71 to 77.

Figure 71:
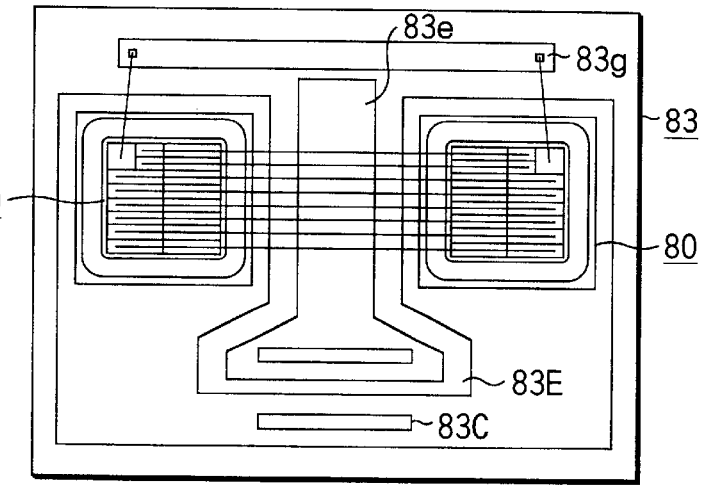
FIG. 71 is a plan view showing an application example in the 16th embodiment.

In an application example shown in FIG. 71, two types of IGBT chips 80 are mounted on a DBC board 83 or the like. Since the two types of chips are mounted, the distance of a gate wiring pattern 83g is short. Since a sense emitter 83e is arranged on an opposite side to a main emitter 83E via bonding, the influence of the emitter inductance on the effective gate resistance can be eliminated. This application example may be modified such that antiparallel diodes Df are inserted between the main emitter 83E and main collector 83C, as shown in FIG. 72.

Figure 73:
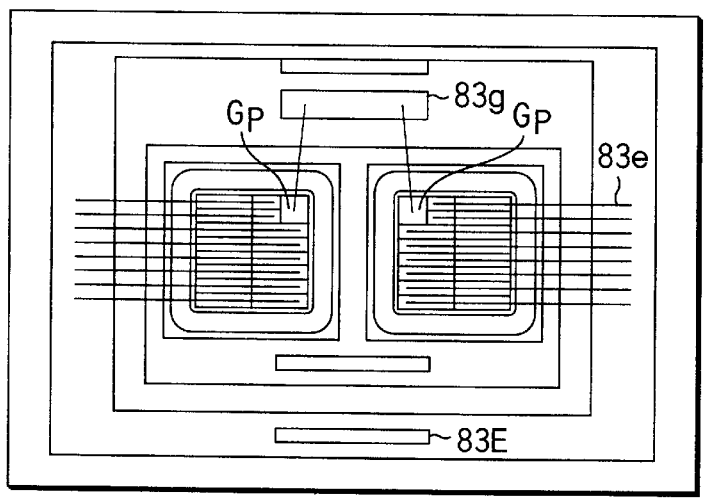
FIG. 73 is a plan view still another application example in the 16th embodiment.

In an application example shown in FIG. 73, the gate pads Gp are arranged close to each other to minimize the distance of the gate wiring pattern 83g, and ring-like emitter wiring lines 83e and 83E eliminate the influence of the emitter inductance on the sense emitter potential.

Figure 72:
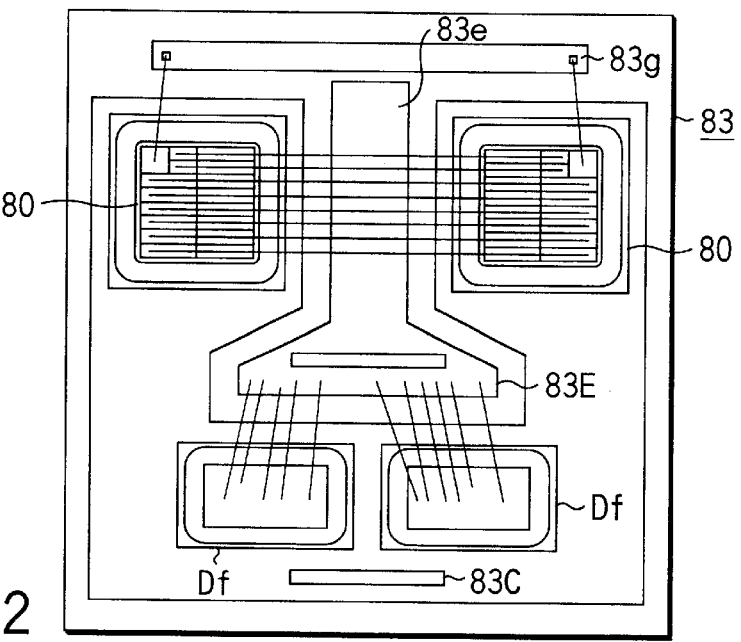
FIG. 72 is a plan view showing another application example in the 16th embodiment.
Figure 74:
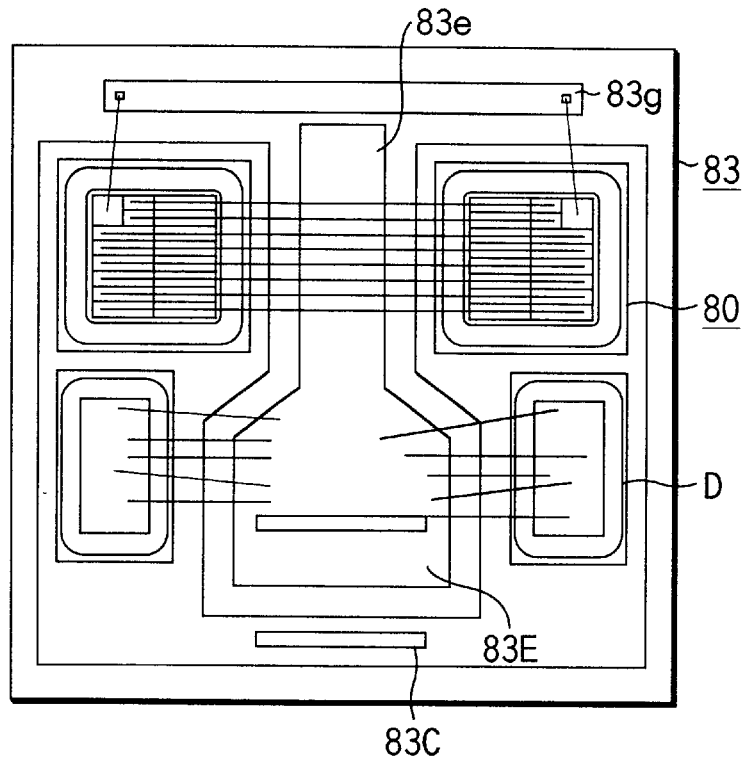
FIG. 74 is a plan view still another application example in the 16th embodiment.

An application example shown in FIG. 74 is a modification of the example shown in FIG. 72 in which a diode D is mounted.

Figure 75:
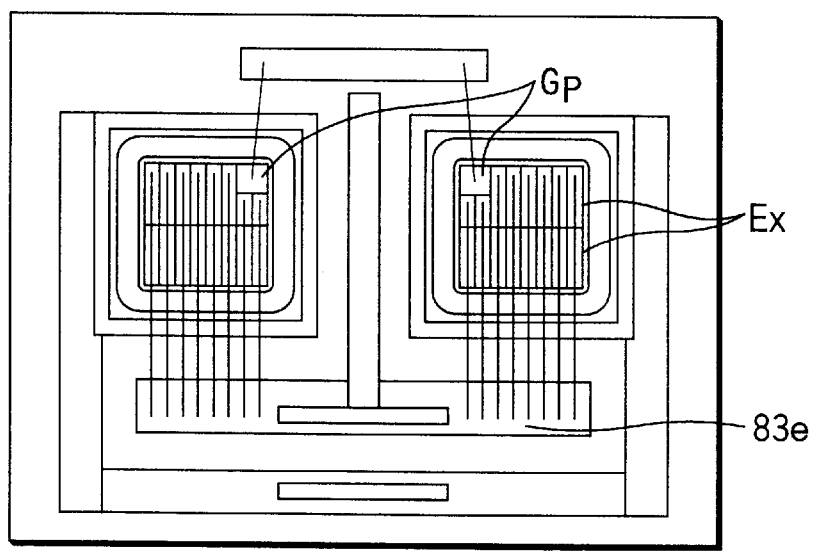
FIG. 75 is a plan view still another application example in the 16th embodiment.

In an application example shown in FIG. 75, the influence of the emitter inductance on the effective gate voltage is eliminated by a T-shaped sense emitter 83e and a chip layout in which the gate pads Gp are arranged close to each other and the longitudinal directions of the gate bonding and emitter pad Ep are made to coincide with each other.

Figure 76:
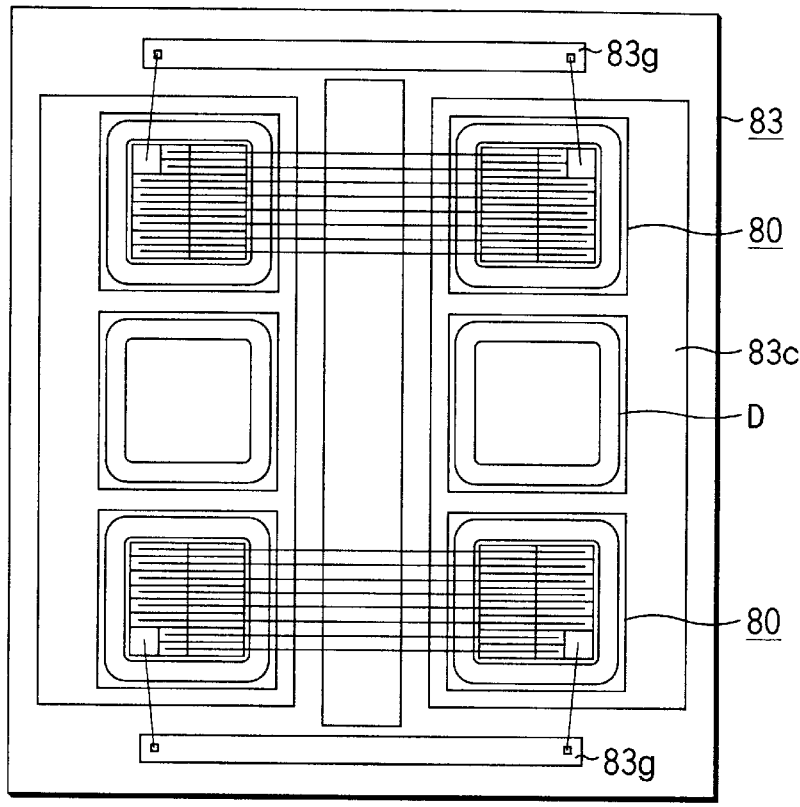
FIG. 76 is a plan view still another application example in the 16th embodiment.

In an application example shown in FIG. 76, the example shown in FIG. 71 is changed into a 4-chip layout, and the diode D is mounted on the main collector 83C between chips 80. This application example may be modified such that the gate wiring pattern 83g is formed like a ring so as to surround four chips or that the interval between chips 80 may be shortened by eliminating the diode D.

Figure 77:
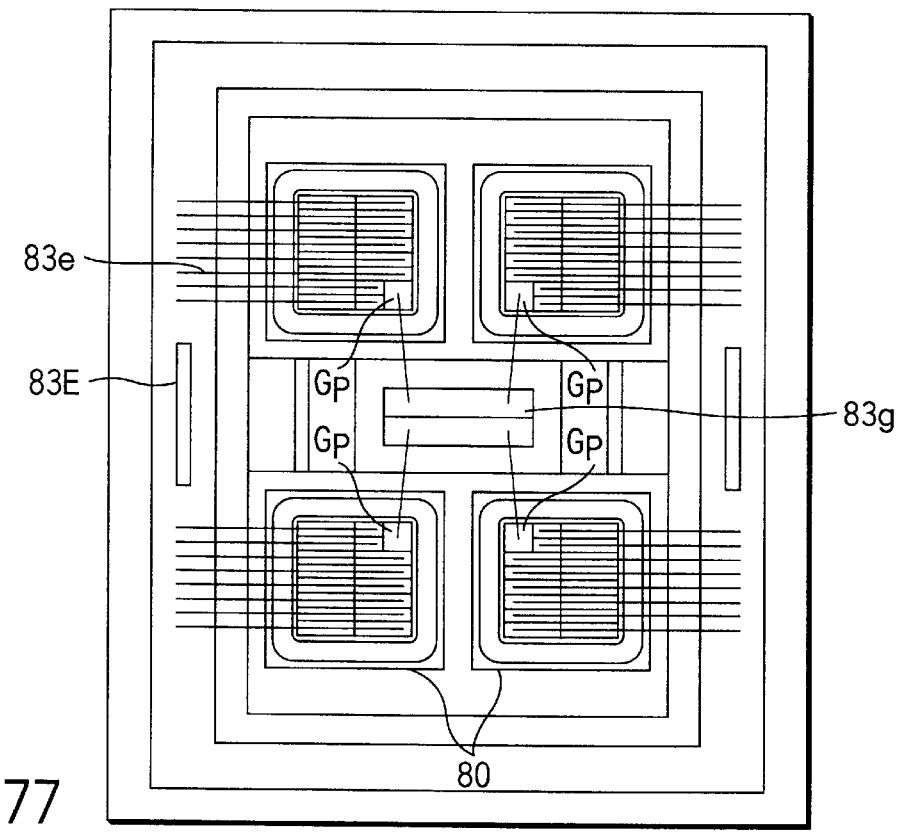
FIG. 77 is a plan view still another application example in the 16th embodiment.

In an application example shown in FIG. 77, four chips 80 are laid out so as to set their gate pads Gp at the center, the gate pads Gp are connected to the central gate wiring pattern 83g, and the emitter wiring lines 83e and 83E are formed like a ring so as to surround four chips 80. The same effects as described with reference to FIG. 73 can be attained.

(17th Embodiment)

Figure 78A:
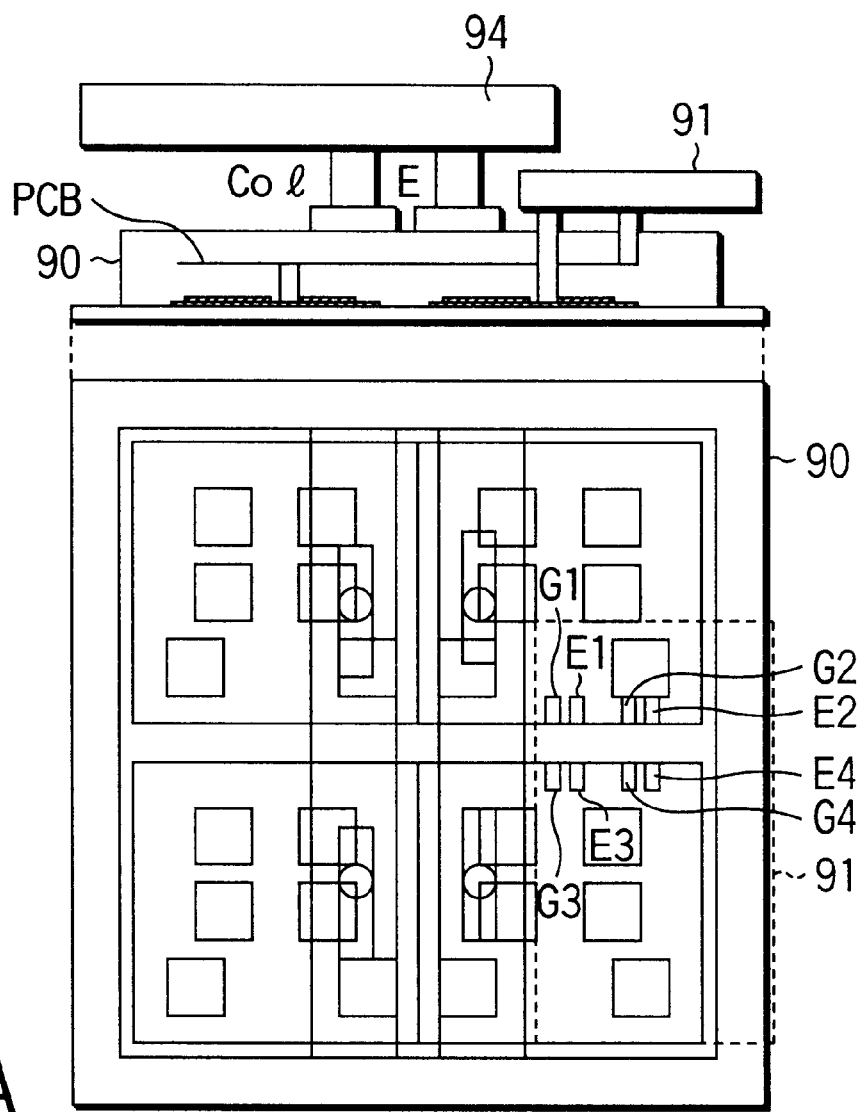
FIG. 78A is a schematic view showing the arrangement of a semiconductor device module according to the 17th embodiment of the present invention.
Figure 78B:
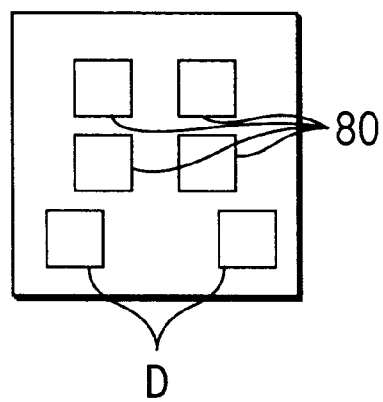
FIG. 78B is a plan view showing the module on which IGBT chips and diode chips; according to the 17th embodiment of the present invention.
Figure 79:
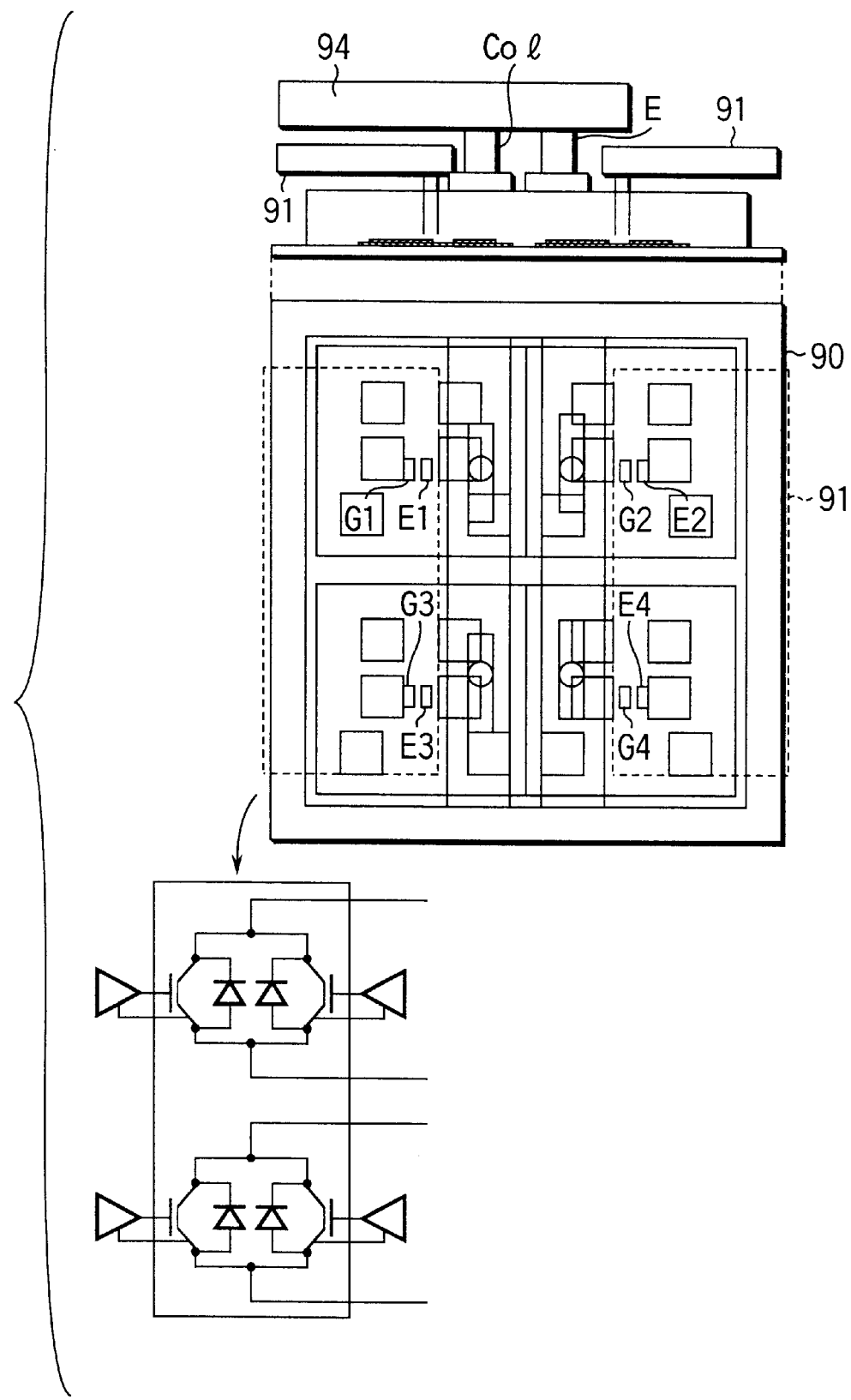
FIG. 79 is a schematic view showing the arrangement of the semiconductor device module in the 17th embodiment.

FIGS. 78A and 79 are diagrams showing the arrangement of a semiconductor device module according to the 17th embodiment of the present invention. FIG. 78B is a plan view showing the module on which IGBT chips and diode chips.

As shown in FIGS. 78A and 79, the 17th embodiment comprises a gate drive circuit 91, main collector terminal Col, and main emitter terminal E on a module main body 90 which incorporates an IGBT chip 80 and diode chip D.

Wiring lines extending from four pairs of gate and sense emitter terminals G1 to G4 and E1 to E4 are connected to a double-sided printed board PCB and independently connected to DBC boards with a low impedance. The gate drive circuit 91 is made up of four independent (floating in, e.g., FIG. 49) drive circuits. The gate drive circuit 91 may be mounted on a main circuit wiring board 94 in order to set the gate wiring line at a low impedance. The gate terminal may be extracted to the collector side (lower part in FIGS. 78A and 79) of the chip (to decrease the gate impedance at the slight sacrifice of heat dissipation). The gate drive circuit 91 itself (floating) may be effectively assembled in the package.

As for the arrangement direction of the DBC board, a method of arranging the diode chip D close to the main terminals Col and E is more effective for the inductance of the main circuit than the layout direction of the 17th embodiment.

In FIG. 79, the gate and sense emitter terminals G1 to G4 and E1 to E4 are extracted immediately above or near the DBC boards. In the structure shown in FIG. 79, the gate drive circuit 91 is divided but more effective for the impedance than the structure shown in FIG. 78A. The divided gate drive circuits 91 are connected by signal and power supply cables.

In any case, with this arrangement, the IGBT chip 80 can be arranged below the gate drive circuit 91 to reduce the gate inductance, thereby easily, reliably practicing the present invention.

The 17th embodiment may be modified as shown in FIGS. 80 to 83.

In an application example shown in FIG. 80, the IGBT chips 80 are collectively arranged immediately below the gate drive circuit 91 in one module 90, and the antiparallel diode chips Df are collectively arranged immediately below the main collector and emitter terminals Col and E.

In addition to the gate inductance reduction effect described above, the distance between the main terminal and diode can be shortened to reduce an inductance generated by a current flowing through the antiparallel diode upon turn-off operation, thereby preventing destruction of the diode.

Figure 80:
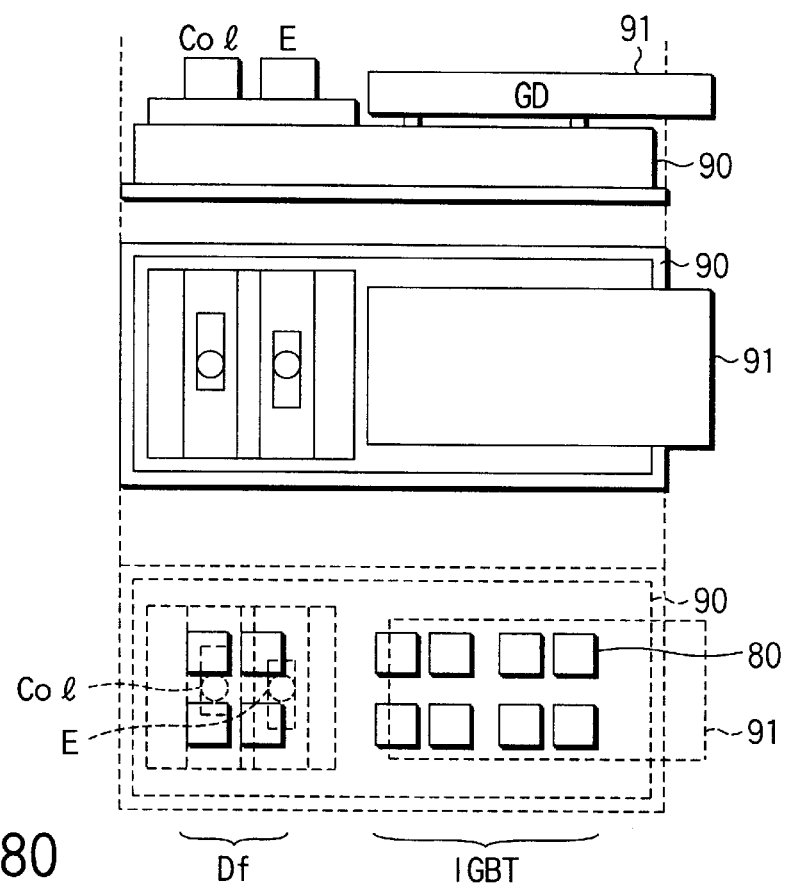
FIG. 80 is a schematic view showing an application example in the 17th embodiment.
Figure 81:
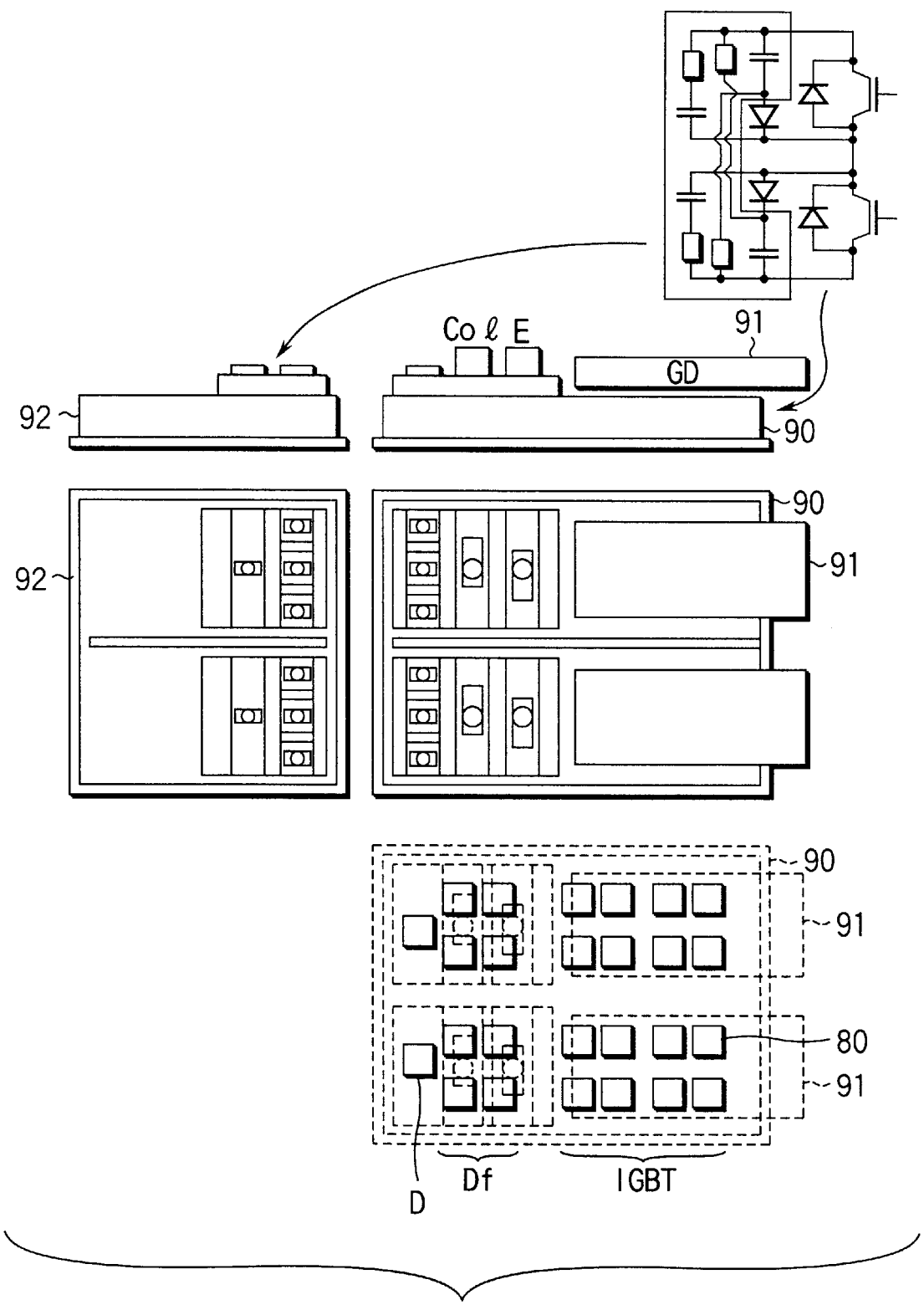
FIG. 81 is a schematic view showing another application example in the 17th embodiment.

An application example shown in FIG. 81 is a modification of the arrangement shown in FIG. 80 in which the snubber diode chip D of an RCD snubber circuit is arranged near the antiparallel diodes Df in one module 90. The remaining elements (resistance and capacitor) of the RCD snubber circuit are mounted on another snubber module 92. The snubber module 92 also incorporates an RC snubber circuit connected to an IGBT device in addition to the RCD snubber circuit. The snubber module and IGBT device module are electrically connected via terminals of the same level, and may be mounted on a heat sink 93, as shown in FIG. 82.

If the snubber module 92 incorporates only a CR snubber, one or two capacitors C may replace the wiring line between the snubber and IGBT, and only the resistance R may be set in the snubber module 92 to reduce the inductance.

With this arrangement, since the snubber diode chips D of the RCD snubber circuit are also collected, the parasitic inductance can be reduced to enhance the effects of the snubber circuit. Moreover, the semiconductor device module 90 made up of the IGBT and diode and the snubber module 92 made up of the resistance R and capacitor C can be easily manufactured as separate products.

Figure 82:
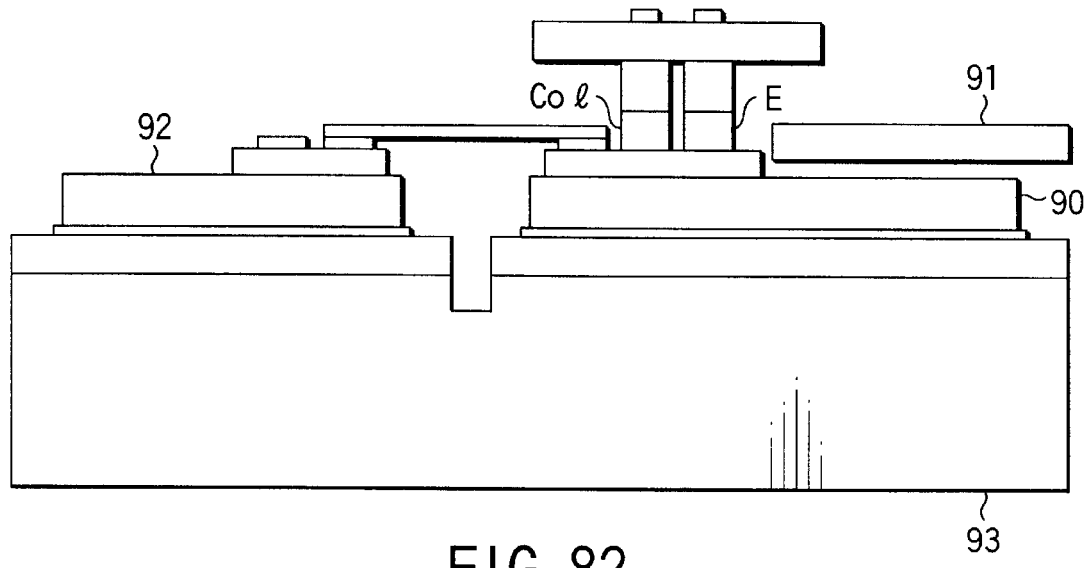
FIG. 82 is a sectional view showing still another application example in the 17th embodiment.
Figure 83:
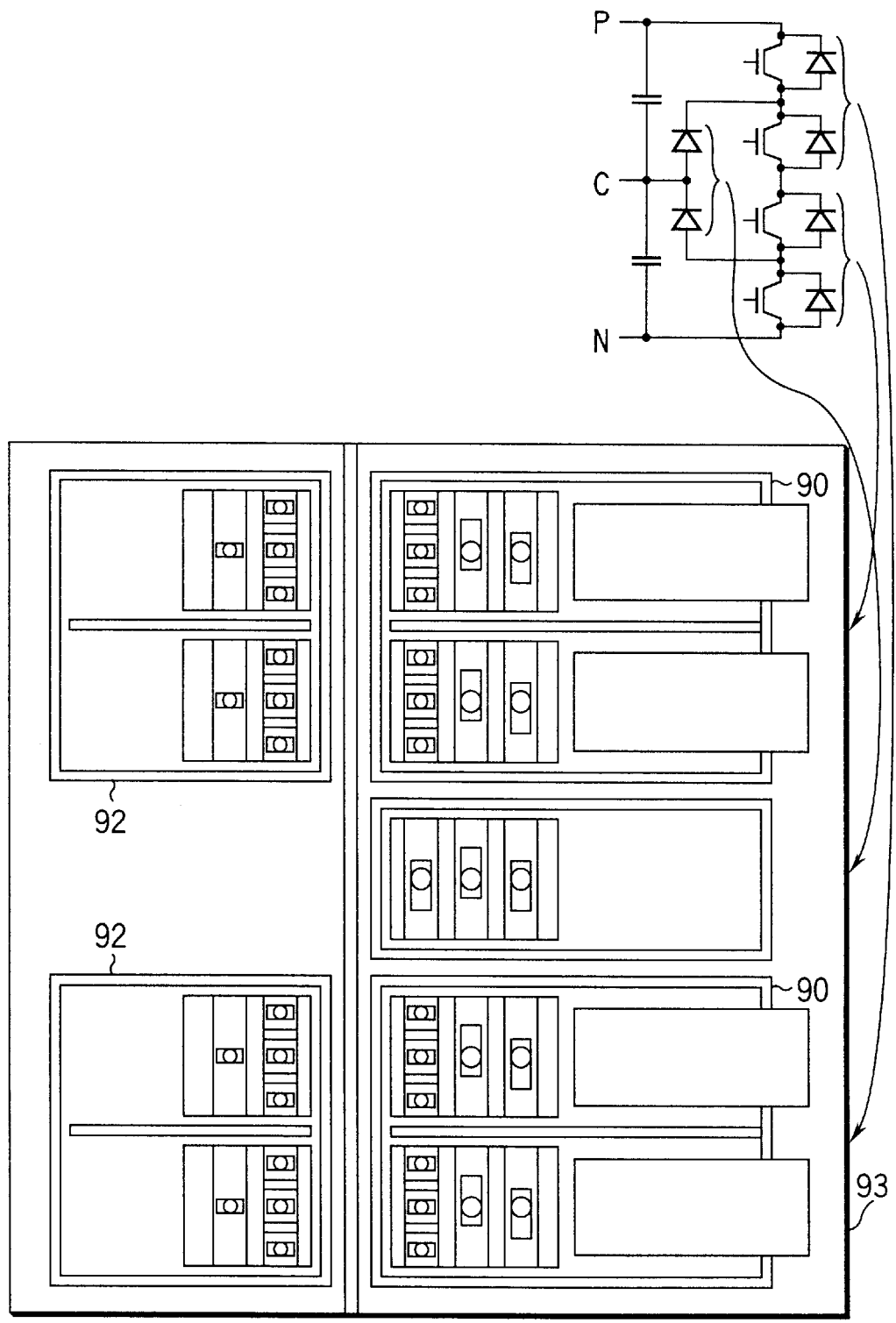
FIG. 83 is a schematic view showing still another application example in the 17th embodiment.

An application example shown in FIG. 83 is a modification of the arrangement shown in FIG. 81 or 82 in which the diode chip D module 93 is separately arranged in parallel with the series module 90 for two switching devices. This arrangement can realize a 3-level inverter, in addition to the above-mentioned effects.

(18th Embodiment)

Figure 84:
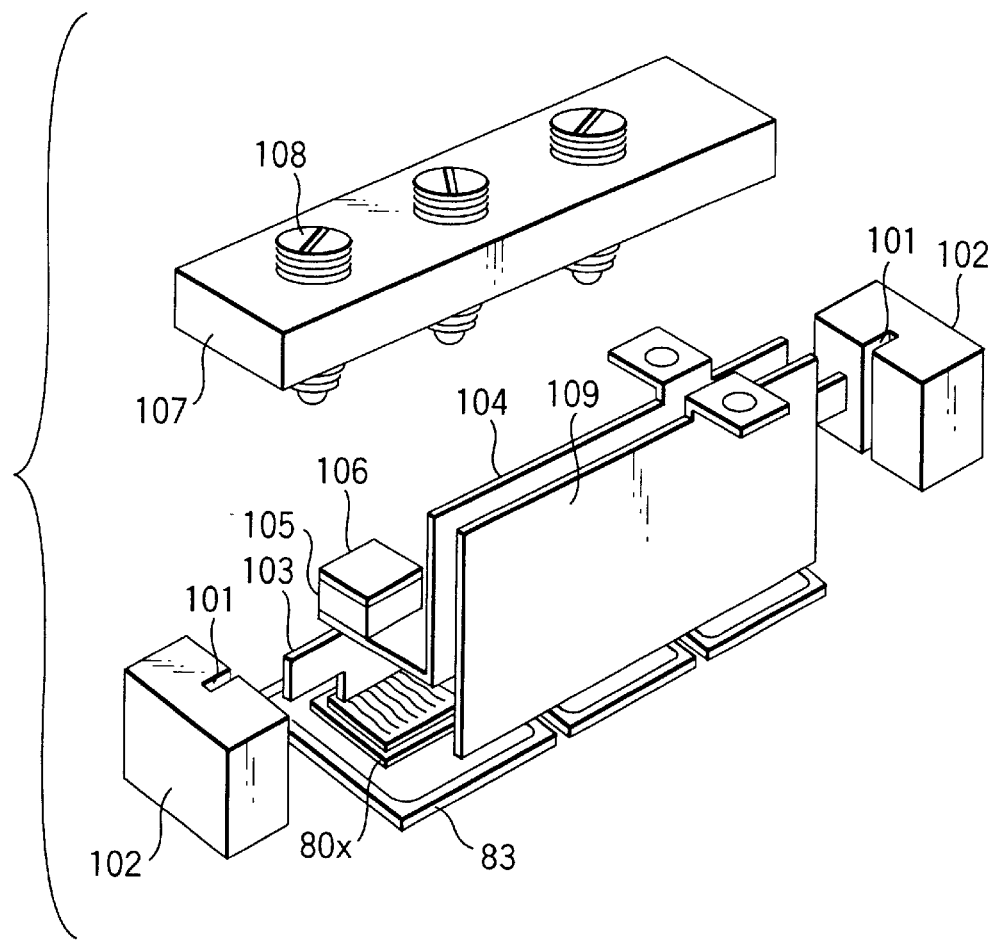
FIG. 84 is a perspective view showing the arrangement of a semiconductor device module according to the 18th embodiment of the present invention.
Figure 85:
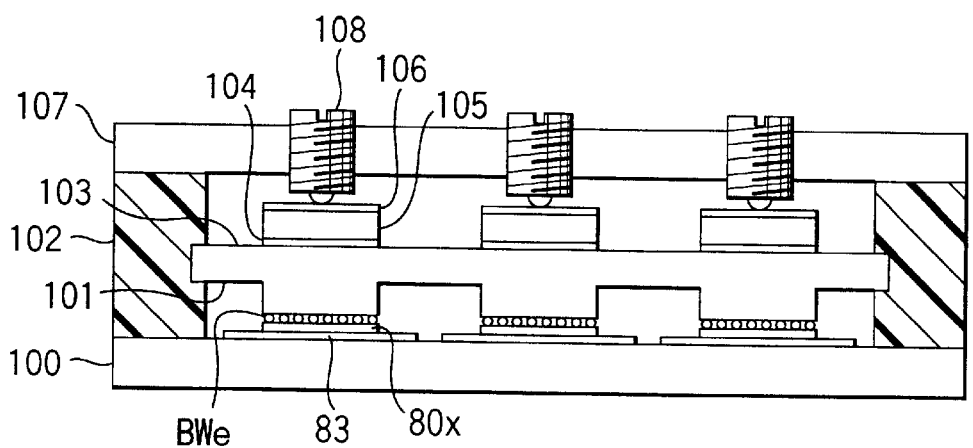
FIG. 85 is a sectional view showing the arrangement of the semiconductor device module in the 18th embodiment.
Figure 86:
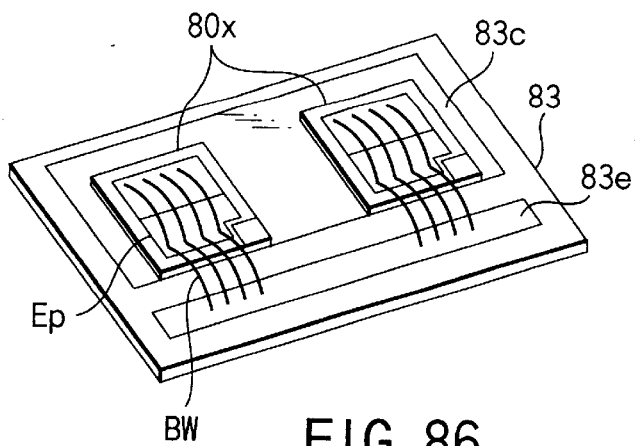
FIG. 86 is a perspective view showing a conventional arrangement for explaining problems to be solved by the 18th embodiment.

FIG. 84 is a perspective view showing the arrangement of a semiconductor device module according to the 18th embodiment of the present invention. FIG. 85 is a sectional view showing the arrangement of the semiconductor device module.

The 18th embodiment solves problem (1) that the internal inductance by wire bonding is difficult to reduce and problem (2) that a collector and emitter are opened upon destruction to fail in multiple series connection in a semiconductor device module constituted by connecting an emitter pad Ep of one type of IGBT chip 80x soldered onto a DBC board 83 having a copper pattern of a main collector 83C to a copper pattern of a main emitter 83E by a bonding wire BW.

That is, in the 18th embodiment, as shown in FIGS. 84 and 85, the copper pattern of the main emitter 83E and its bonding wire BW are omitted, and the emitter pads Ep are connected by bonding wires BWe on the IGBT chip 80x soldered onto the DBC board 83 mounted on a conductive base 100.

More specifically, two insulating guides 102 each having a groove 101 along the vertical direction are mounted on the conductive base 100 to sandwich the DBC board 83 while making their grooves 101 face each other.

Figure 87:
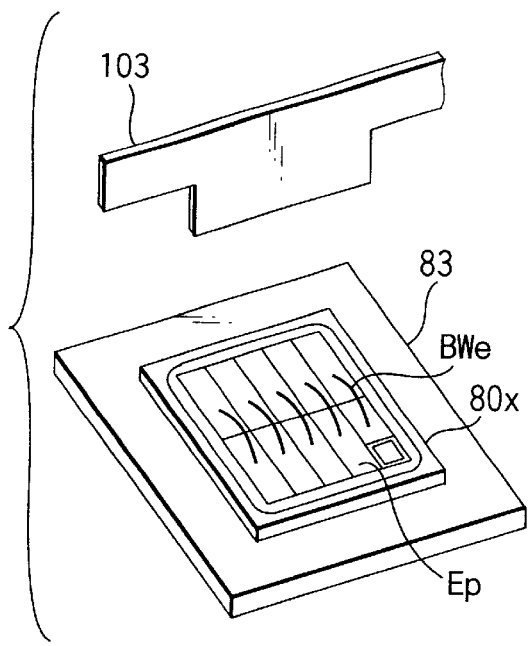
FIG. 87 is a perspective view for explaining a press structure in the 18th embodiment.

Each insulating guide 102 holds in the groove 101 a press electrode 103 made of a copper bar with its lower distal end sharpened to 90° or less. As shown in FIG. 87, the press electrode 103 is forcibly pressed against the bonding wire BWe on the emitter pad Ep.

An insulator 105 and metal piece 106 are stacked on the press electrode 103 via the lower portion of a plate-like emitter electrode 104 having an almost L sectional shape.

A metal press screw attaching plate 107 having a tap is fixed onto each insulating guide 102 so as to cover the metal piece 106.

Figure 88:
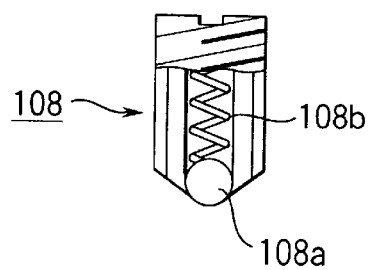
FIG. 88 is a sectional view showing the structure of a press screw in the 18th embodiment.

The press screw attaching plate 107 permanently holds each press screw 108 screwed in the corresponding tap. As shown in FIG. 88, the press screw 108 has a mechanism of pushing out a ball 108*a* by a spring 108*b* and is held by the press screw attaching plate 107 by a threaded portion formed on an outer surface.

The press screw 108 is fastened in a right-handed screw direction to be screwed below the press screw attaching plate 107, and the ball 108*a* at the lower end presses the press electrode 103 downward via the metal piece 106, insulator 105, and emitter electrode 104.

Then, the distal end of the press electrode 103 presses the bonding wire BWe to electrically connect the emitter electrode 104 and emitter pad Ep. Note that eight 500-$\mu$m diameter aluminum wires WBe were pressed parallel to form a module by a press force of 10 kg/chip, and a current of 250A could flow stably.

On the DBC board 83, a plate-like collector electrode 109 stands by soldering so as to serve as a bus parallel to the emitter electrode 104.

In this arrangement, the inductance of the bonding wire BW can be eliminated from connection between the emitter electrode 104 and emitter pad Ep. At the same time, since the emitter electrode 104 and collector electrode 109 are formed as parallel buses, the internal inductance can be reduced to further reduce the surge voltage upon turn-off operation of switching.

Even if the chip 80*x* is destroyed, the sharp press electrode 103 directly presses the bonding wire BWe to short-circuit the emitter and collector without opening them, unlike the prior art. In a module having this press mechanism, multiple IGBT devices can be series-connected to greatly widen the application range.

The press mechanism can be assembled in one module together with the above-mentioned gate drive circuit 46 and the like. The press mechanism (spring mechanism) can be further simplified at low cost by using a belleville spring, leaf spring, elastic resin, or the like. Although not shown, the gate electrode and the gate wiring line of the semiconductor chip may be connected using a printed board.

Figure 89:
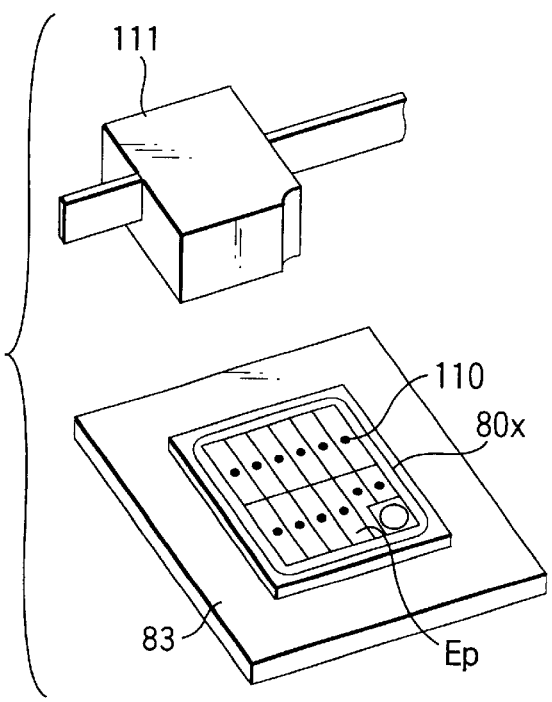
FIG. 89 is a perspective view showing a modification of the 18th embodiment.

The 18th embodiment can be modified into an arrangement in which an aluminum ball 110 replaces the bonding wire Bwe and a press electrode 111 made of a copper block presses the aluminum ball 110 instead of the press electrode 103, as shown in FIG. 89. Even with this arrangement, the present invention can be similarly practiced to obtain the same effects. If necessary, the press electrode 111 may press the aluminum ball 110 via a molybdenum plate.

(19th Embodiment)

Figure 90:
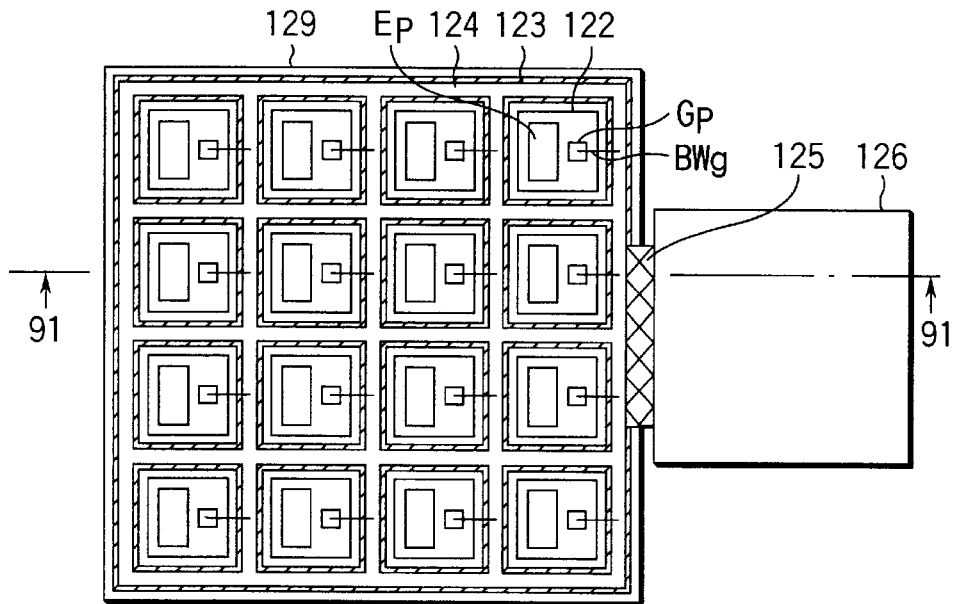
FIG. 90 is a plan view showing the arrangement of a semiconductor device module and gate drive circuit according to the 19th embodiment of the present invention.
Figure 91:
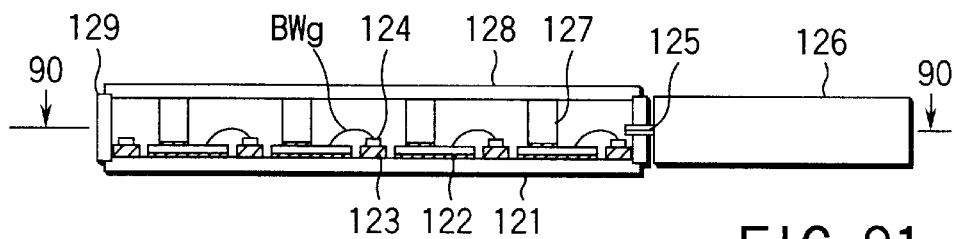
FIG. 91 is a sectional view taken along the line 79—79 in FIG. 90.
Figure 92:
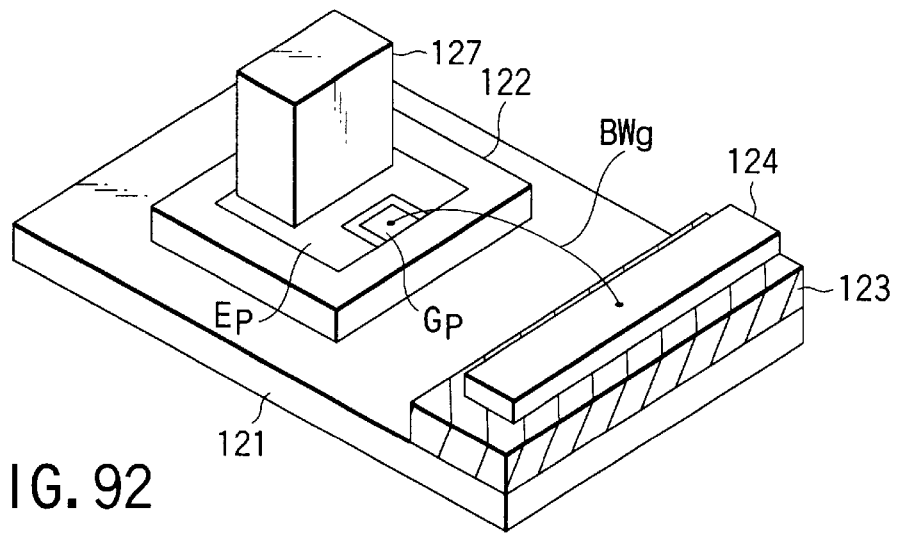
FIG. 92 is a perspective view showing connection between respective chips in the 19th embodiment.

FIG. 90 is a plan view showing the arrangement of a semiconductor device module and gate drive circuit according to the 19th embodiment of the present invention. FIG. 91 is a sectional view taken along the line 79—79 in FIG. 90. FIG. 92 is a perspective view showing connection between respective chips.

In this semiconductor device module, 16 IGBT chips 122 are arranged on a collector electrode board 121 to bring their collector pads in contact with the collector electrode board 121. Note that a molybdenum plate may be interposed as a thermal buffer member between the IGBT chip 122 and collector electrode board 121.

An insulating board 123 made of a grating-like plastic or ceramic is fixed on the collector electrode board 121 between respective IGBT chips 122. A gate wiring pattern 124 is printed on the insulating board 123. A gate pad Gp of each IGBT chip 122 is connected to the gate wiring pattern 124 via a bonding wire BWg, and the gate wiring pattern 124 is connected to a gate drive circuit 126 via a connection terminal 125.

An emitter pad Ep of each IGBT chip 122 is connected to an emitter electrode board 128 via a connection metal block 127. The emitter and collector electrode boards 128 and 121 are held by an envelope 129 to form a semiconductor device module.

In this arrangement, the gate wiring pattern 124 is formed at the gap of the chip layout via the insulating board 123, and the gate wiring pattern 124 and gate pad Gp are bonded. Hence, the resistances and inductances of the gates of all the chips 122 can be reduced to uniformly operate many chips 122.

The 19th embodiment adopts a flat package having main electrodes on a pair of upper and lower surfaces. However, the present invention is not limited to this, and the collector and emitter wiring patterns may be formed on the same ceramic board.

(20th Embodiment)

Figure 93:
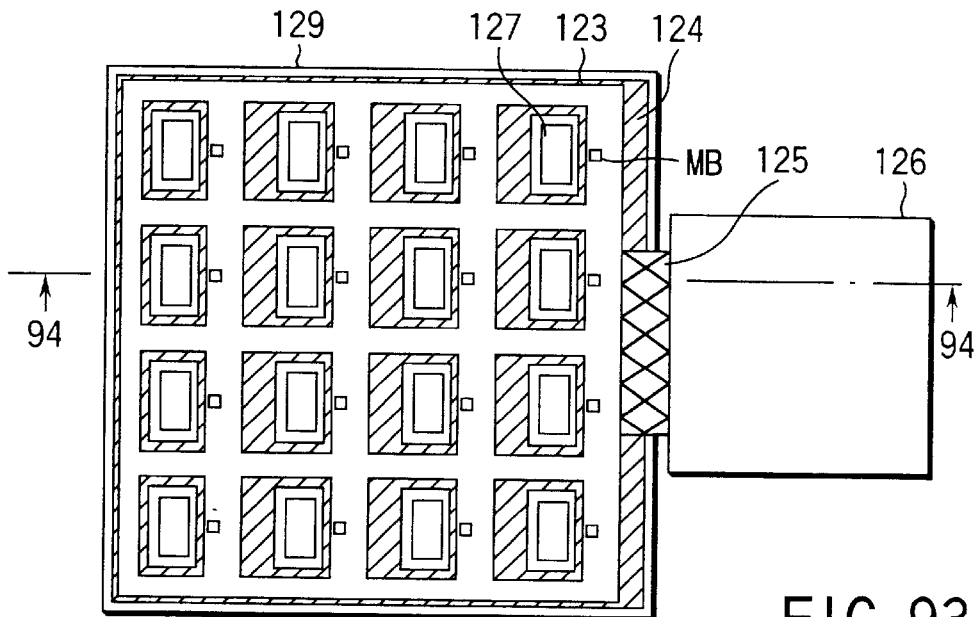
FIG. 93 is a plan view showing the arrangement of a semiconductor device module and gate drive circuit according to the 20th embodiment of the present invention.
Figure 94:
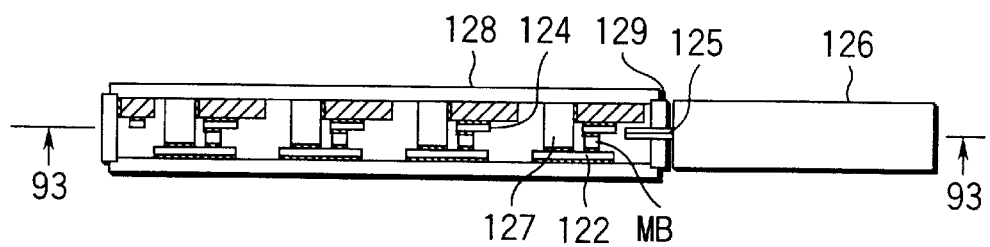
FIG. 94 is a sectional view taken along the line 82—82 in FIG. 93.
Figure 95:
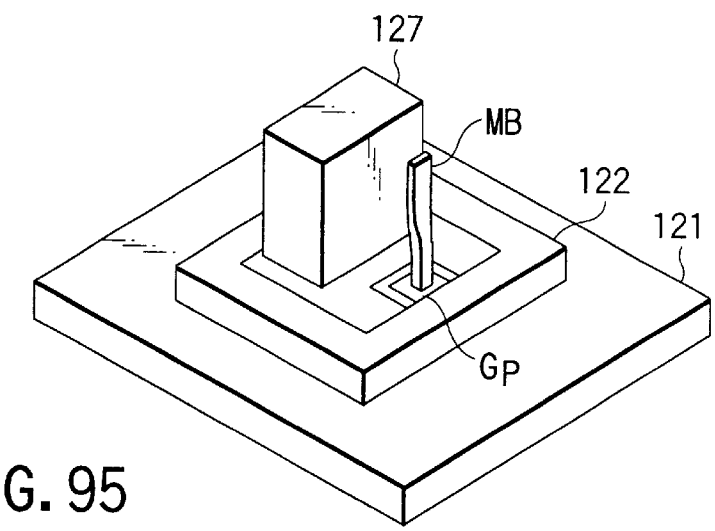
FIG. 95 is a perspective view showing connection between respective chips in the 20th embodiment.

FIG. 93 is a plan view showing the arrangement of a semiconductor device module and gate drive circuit according to the 20th embodiment of the present invention. FIG. 94 is a sectional view taken along the line 82—82 in FIG. 93. FIG. 95 is a perspective view showing connection between respective chips.

The 20th embodiment is a modification of the 19th embodiment in which an insulating board 123 having a gate wiring pattern 124 printed thereon is fixed to an emitter electrode board 128 above an IGBT chip 122, and the gate wiring pattern 124 and a gate pad Gp of the IGBT chip 122 are connected via a metal block MB or metal pin. The metal block MB or metal pin is fixed to the printed insulating board 123 by soldering or the like, which facilitates mounting.

Even with this arrangement, the same effects as in the 19th embodiment can be obtained.

(21st Embodiment)

Figure 96:
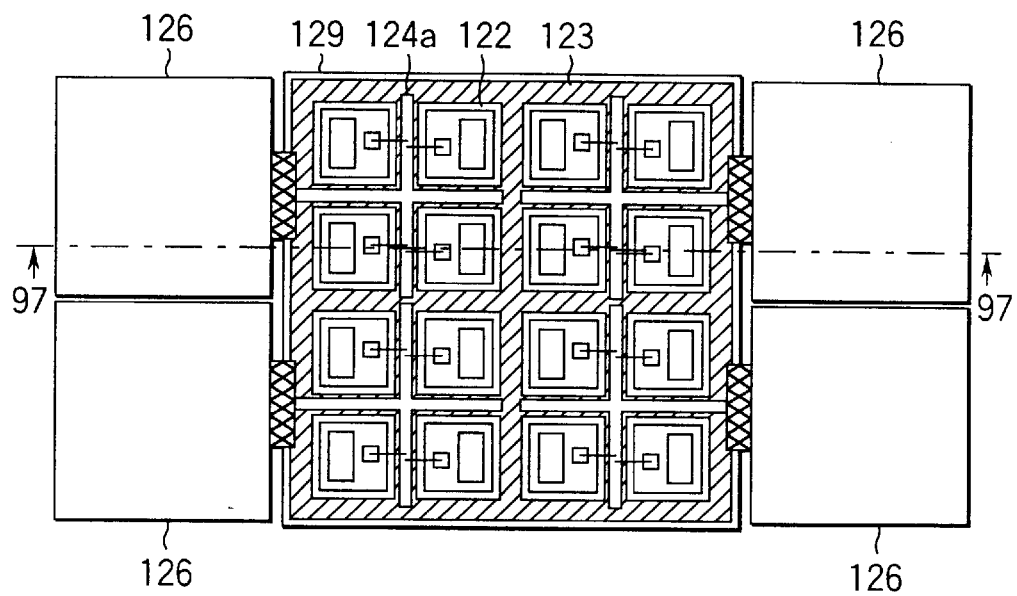
FIG. 96 is a plan view showing the arrangement of a semiconductor device module and gate drive circuit according to the 21st embodiment of the present invention.
Figure 97:
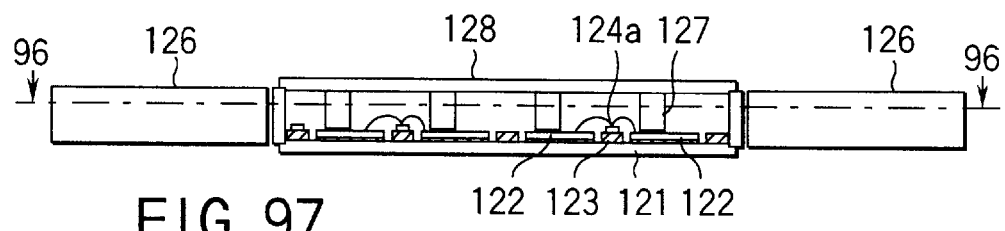
FIG. 97 is a sectional view taken along the line 85—85 in FIG. 96.

FIG. 96 is a plan view showing the arrangement of a semiconductor device module and gate drive circuit according to the 21st embodiment of the present invention. FIG. 97 is a sectional view taken along the line 85—85 in FIG. 96.

In the 21st embodiment, four IGBT chips 122 are combined into one group. Gate wiring patterns 124*a* having a substantially cross shape are printed on an insulating board 123 in units of groups, and respectively connected to different gate drive circuits 126.

Figure 98:
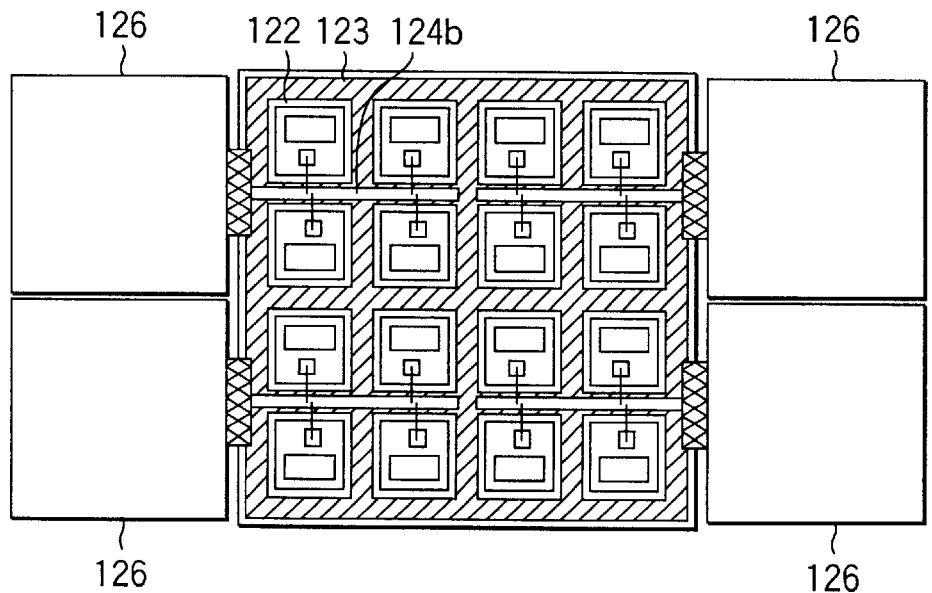
FIG. 98 is a plan view showing a modification of the 21st embodiment.
Figure 99:
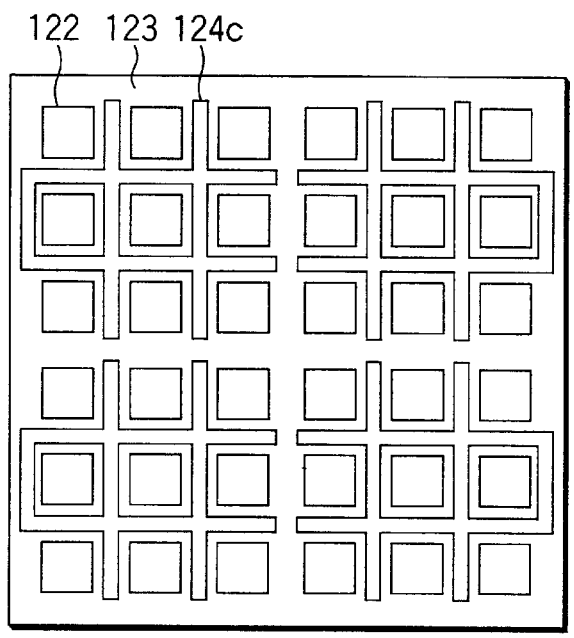
FIG. 99 is a plan view showing another modification of the 21st embodiment.
Figure 100:
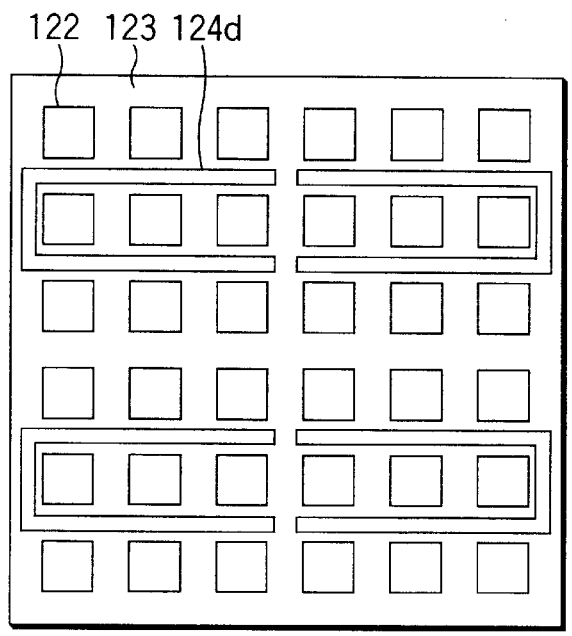
FIG. 100 is a plan view showing still another modification of the 21st embodiment.

In addition to the effects of the 19th embodiment, this arrangement allows divisionally controlling many chips 122 in units of several (about four to nine) chips to more uniformly drive the chips 122. Note that even if the gate wiring pattern 124*a* is modified into an almost linear gate wiring pattern 124*b*, as shown in FIG. 98, the 21st embodiment can attain the same effects. Similarly, even if 36 IGBT chips 122 are divisionally controlled while being divided into four groups in units of nine chips, as shown in FIG. 99 or 100, the same effects as in the 21st embodiment can be attained.

(22nd Embodiment)

Figure 101:
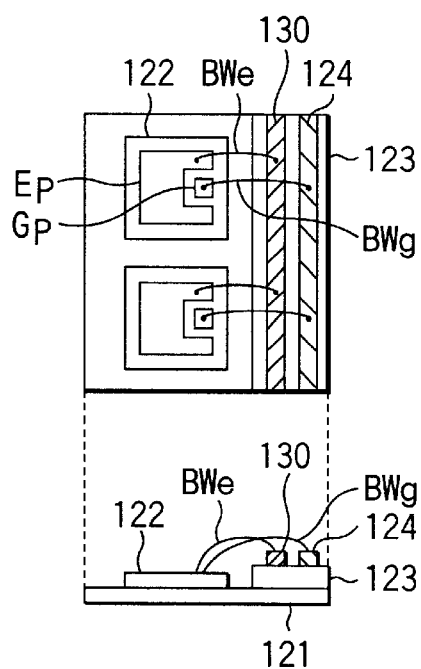
FIG. 101 is a schematic view showing a partial arrangement of a semiconductor device module according to the 22nd embodiment of the present invention.

FIG. 101 is a schematic view showing a partial arrangement of a semiconductor device module according to the 22nd embodiment of the present invention.

The 22nd embodiment is a modification of the 19th to 21st embodiments. More specifically, as shown in FIG. 101, a control emitter wiring pattern 130 (sense emitter wiring pattern) is formed on an insulating board 123 together with a gate wiring pattern 124.

In addition to the effects of the applied embodiments, this arrangement allows accurately extracting the emitter potentials of all chips and making the emitter potentials of respective chips 122 uniform.

Since the gate and control emitter wiring patterns 124 and 130 are parallel-formed, the (mutual) inductances of currents flowing in different directions can be reduced. Similarly, since bonding wires BWg and BWe to gate and emitter pads Gp and Ep are formed parallel, the transinductances can be reduced.

Figure 102:
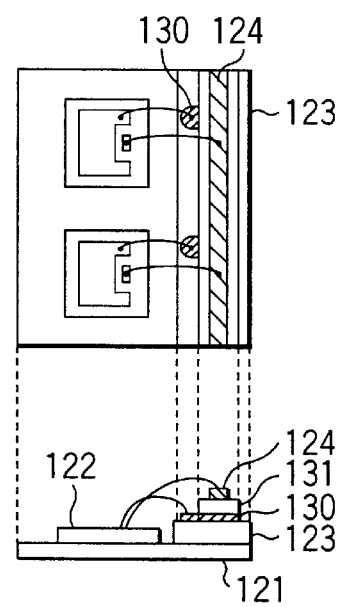
FIG. 102 is a schematic view showing a modification of the 22nd embodiment.

Note that even with a multilayered wiring structure in which an insulating layer 131 is interposed between the gate and control wiring patterns 124 and 130, as shown in FIG. 102, the 22nd embodiment can attain the same effects and make the module more compact. Either of the gate and control wiring patterns 124 and 130 may be formed on a lower layer (or upper layer).

Figure 103:
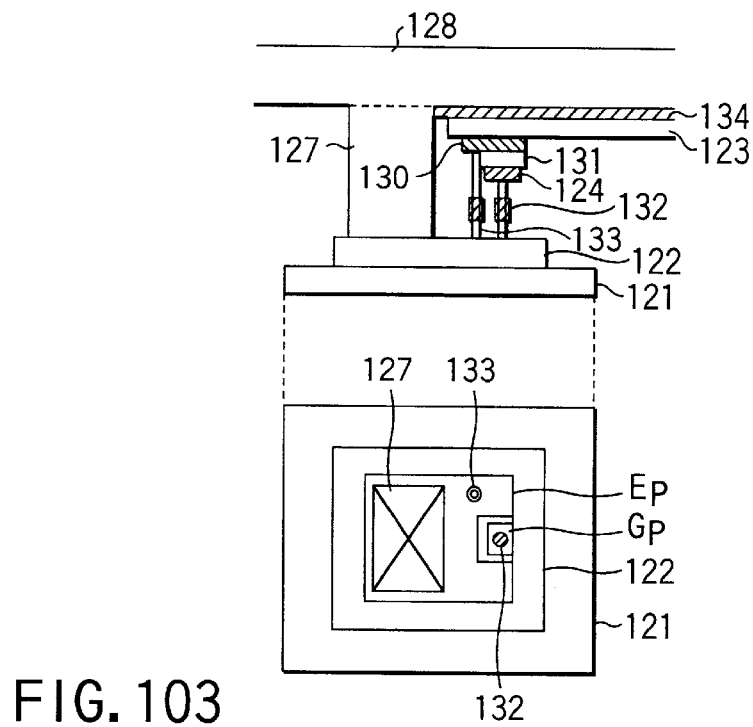
FIG. 103 is a schematic view showing another modification of the 22nd embodiment.

This multilayered structure is not limited to wire bonding and may be modified to a structure in which a conductive gate pin 132 to be pressed by a spring is interposed between the gate wiring pattern 124 and gate pad Gp, and an emitter pin 133 to be similarly pressed is interposed between the control wiring pattern 130 and emitter pad Ep, as shown in FIG. 103.

Alternatively, a conductive member not to be pressed may replace the gate and emitter pins 132 and 133, and a conductive elastic sheet 134 may be interposed between the insulating board 123 and emitter electrode board 128.

When the 22nd embodiment is applied to the arrangements shown in FIGS. 96, 98, and 100, no closed loop exists on gate wiring patterns 124a, 124b, and 124d and the control emitter wiring pattern 130, and thus the gate and control emitter wiring lines can flow currents equal in magnitude in opposite directions, in addition to the above effects. As a result, the g-e voltages of respective chips can be made uniform even with a large gate current.

(23rd Embodiment)

The above-described embodiments concern a drive method of the technique according to the present invention in which the voltage rise rate dv/dt is kept substantially constant upon turn-off operation. Next, a drive method of the technique according to the present invention in which the voltage rise rate dv/dt is decreased while the voltage rises will be explained as the 23rd embodiment. The 23rd embodiment is mainly directed to a drive method, and can adopt the semiconductor device modules and gate drive circuits according to the fourth to 22nd embodiments so long as the gate resistance Rg and gate charge Qg satisfy predetermined numerical conditions.

That is, the 23rd embodiment uses a combination of an avalanche phenomenon that has conventionally been avoided as a cause of latch-up, a small-value gate resistance Rg in the present invention, and stop of electron injection upon turn-off operation.

Figure 104:
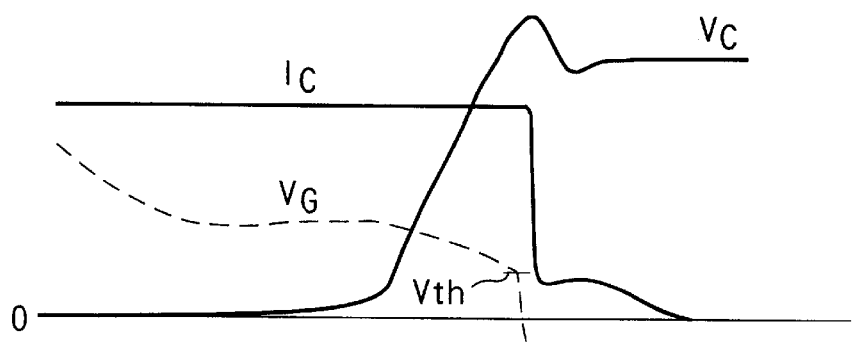
FIG. 104 is a waveform chart showing a conventional drive method in the 22nd embodiment of the present invention.
Figure 105:
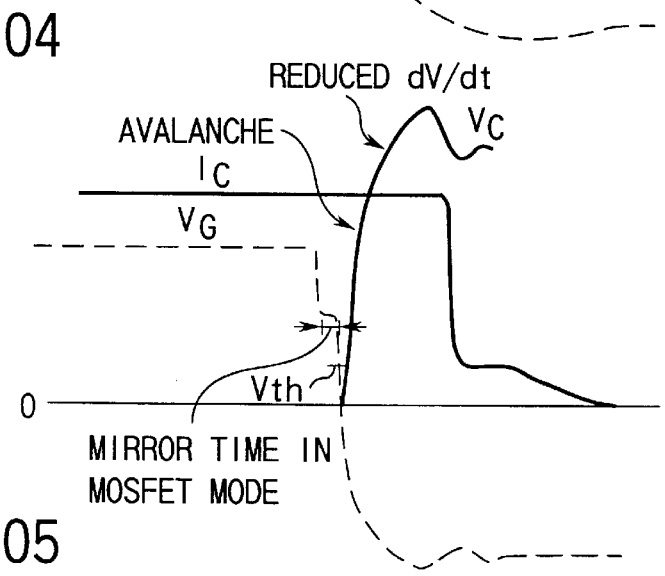
FIG. 105 is a waveform chart showing a drive method according to the 22nd embodiment of the present invention.
Figure 107:
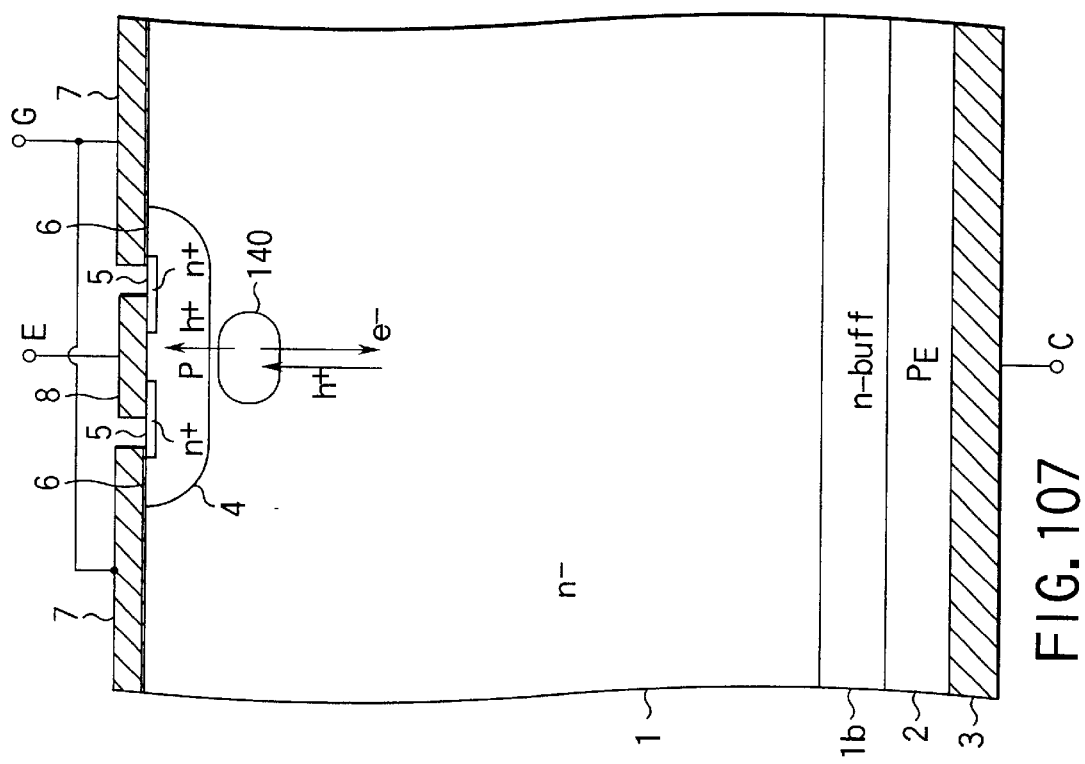
FIG. 107 is a sectional view for explaining a drive avalanche phenomenon in the 22nd embodiment.
Figure 106:
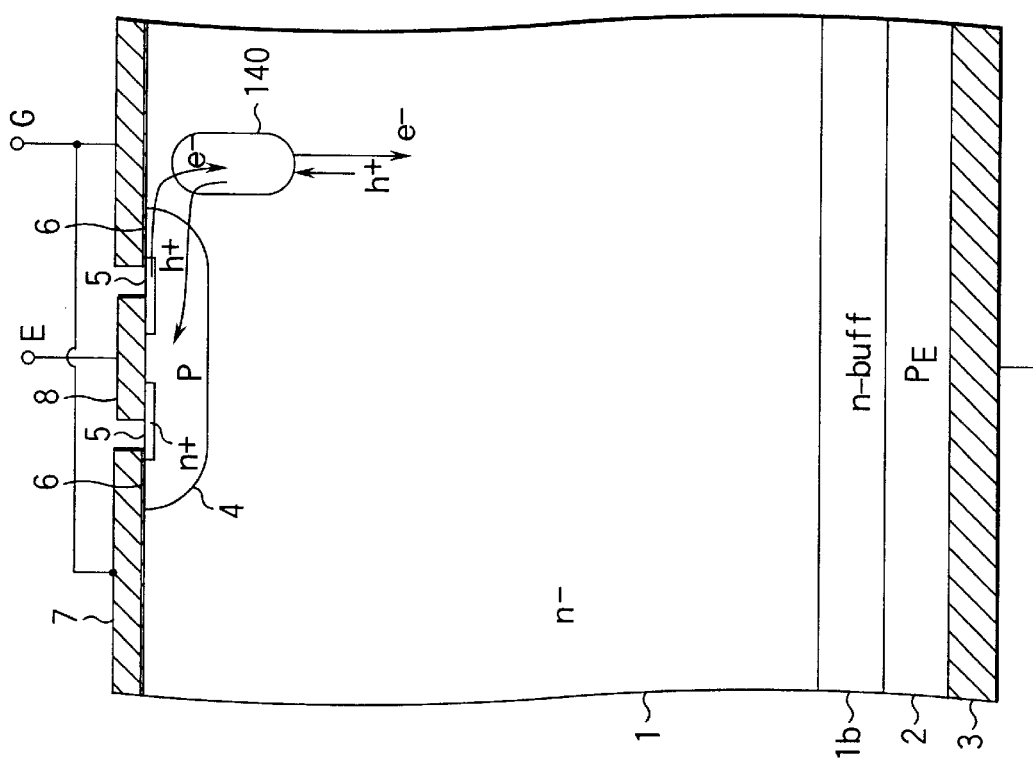
FIG. 106 is a sectional view for explaining a conventional avalanche phenomenon in the 22nd embodiment.

More specifically, unlike conventional turn-off operation (gate resistance Rg: large) shown in FIG. 104, the small-value gate resistance Rg steeply raises the collector voltage Vc, as shown in FIG. 105. By stopping electron injection upon turn-off operation, the avalanche phenomenon generation region (to be referred to as an impact ionization region 140) is moved from an n-type base layer 1 near a gate oxide film 6 in the prior art shown in FIG. 106 to the n-type base layer 1 immediately below a p-type base layer 4 positioned between two n-type source layers 5, as shown in FIG. 107. Accordingly, the voltage rise rate dv/dt upon generation of the impact ionization region 140 can be decreased.

In other words, the small-value gate resistance Rg steeply increases dv/dt of the collector voltage Vc at the start of turn-off operation. By stopping electron injection, the impact ionization region 140 is generated in the n-type base layer 1 immediately below the p-type base layer 4. The forward current of electrons e generated in the impact ionization region 140 decreases dv/dt during turn-off operation, thereby reducing the overshoot of the collector voltage Vc.

Figure 108:
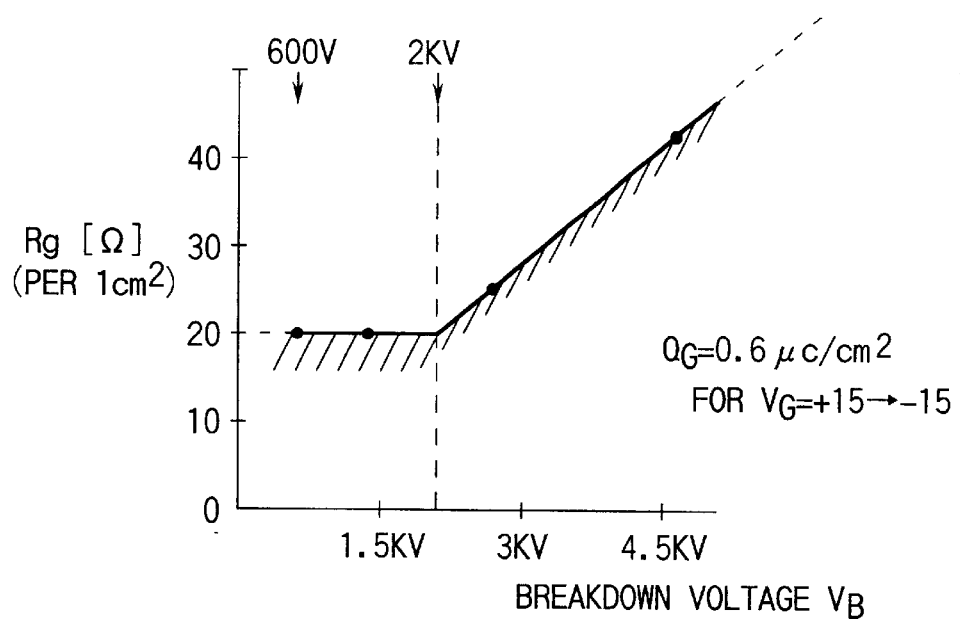
FIG. 108 is a graph showing the gate resistance value for each device resistance in the 22nd embodiment.

In this case, the voltage difference vgpp in gate voltage between the ON and OFF states is set to 30V (=+15V to −15V), and the gate charge Qg per effective device area of 1 cm$^2$ for the IGBT device is set to 0.6($\mu$C/cm$^2$). Under these conditions, as shown in FIG. 108, the resistance value of the gate resistance Rg is always 20Ω or less for a device having a breakdown voltage of 2 kV or less, and is almost (resistance value/107) Ω or less for a device having a breakdown voltage than 2 kV and up to 4.5 kV (e.g., 42Ω or less for a device having a breakdown voltage of 4.5 kV). In this way, the gate resistance Rg has a small resistance value enough not to exceed an upper limit value for each resistance $V_B$.

Figure 109:
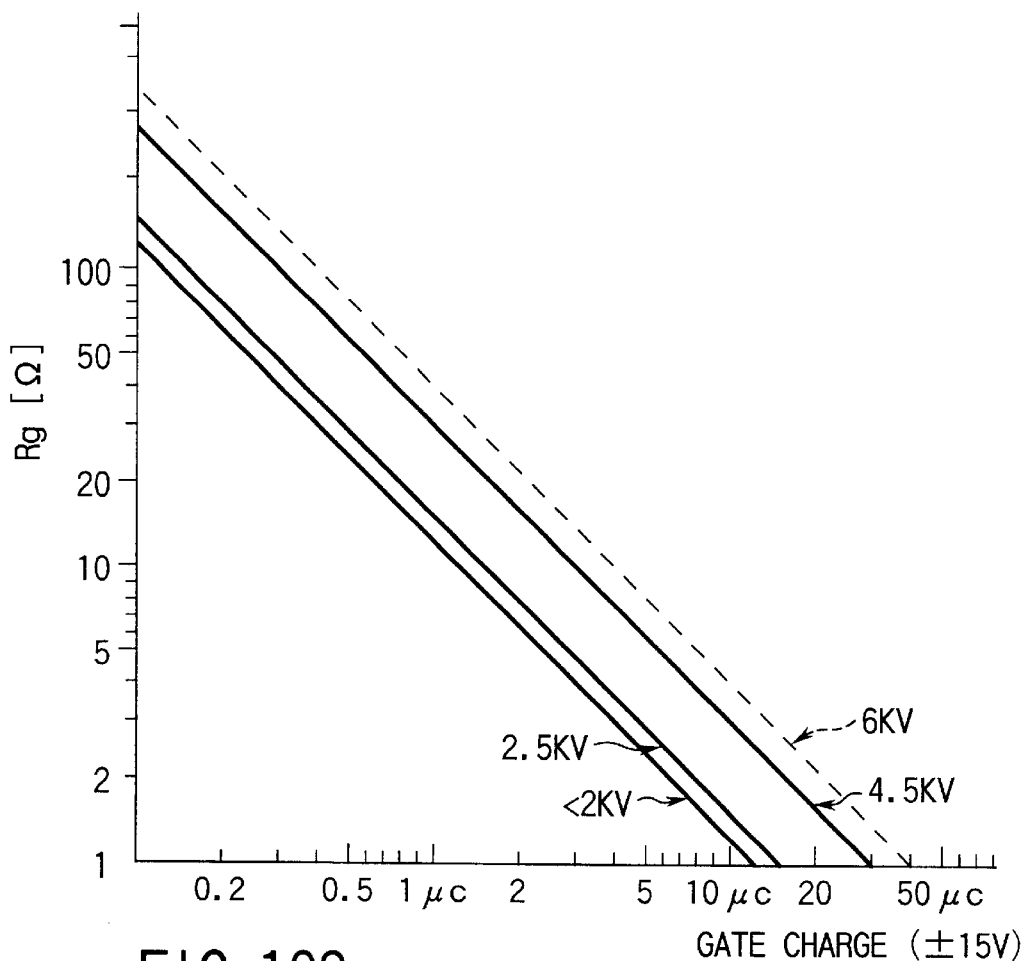
FIG. 109 is a graph showing the gate resistance value for each gate charge in the 22nd embodiment.

Note that the value of the gate resistance Rg must decrease as the gate charge Qg increases, as shown in FIG. 109.

The gate resistance Rg has a value of 20Ω or less for a gate charge per voltage difference Vgpp of 1V (Qg/Vgpp)= 0.02($\mu$C/cm$^2$).

The effective device area means the area of a switching device region out of the area of the switching device region and the area of a peripheral high-breakdown voltage guard ring region on the device chip.

Figure 110:
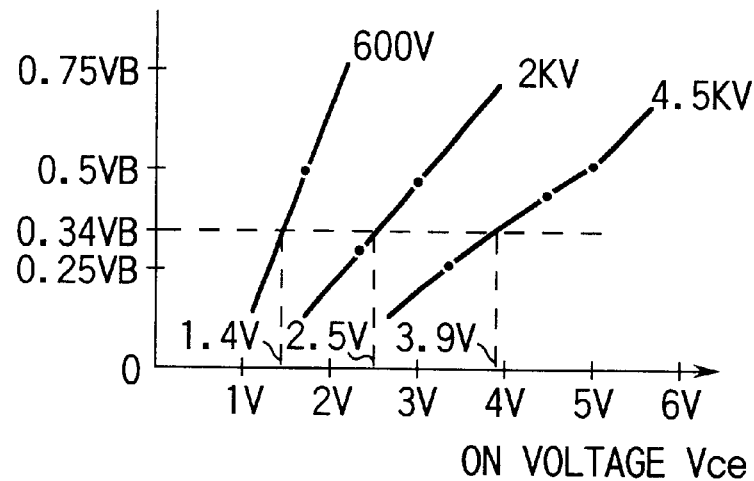
FIG. 110 is a graph showing application conditions in the 22nd embodiment.
Figure 111:
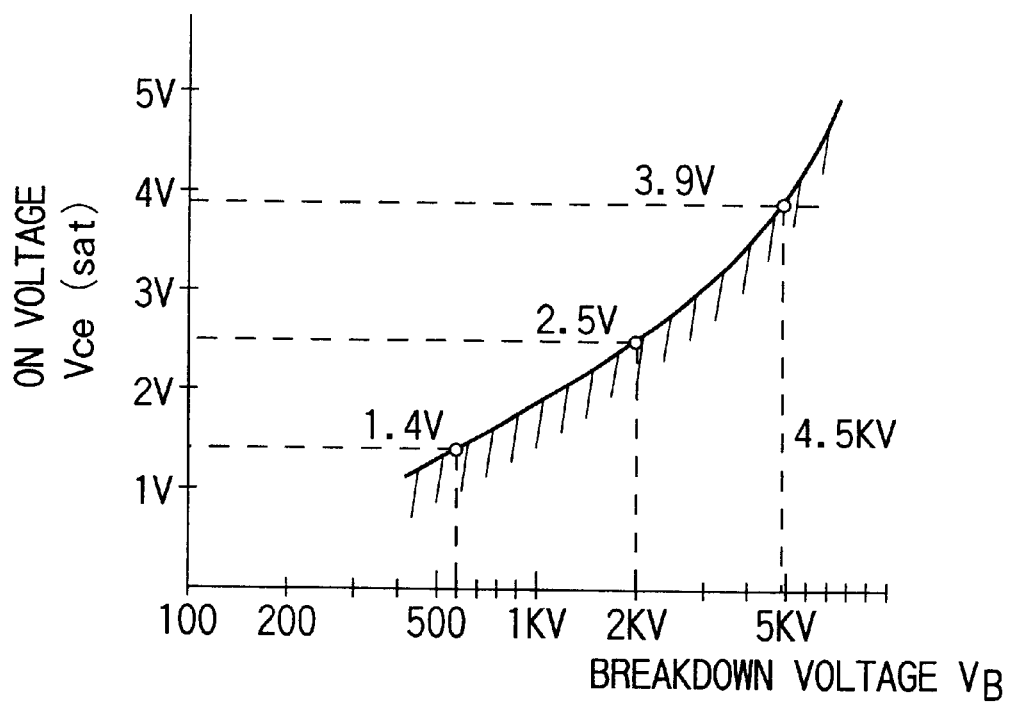
FIG. 111 is a graph showing other application conditions in the 22nd embodiment.

As shown in FIGS. 110 and 111, an IGBT device applicable to this drive method must have an ON voltage of 3.9V or less at 50 A/cm$^2$ for a device having a breakdown voltage $V_B$=4.5 kV, an ON voltage of 2.5V or less at 70 A/cm$^2$ for a device having a breakdown voltage $V_B$=2 kV, and an ON voltage of 1.4V or less at 150 A/cm$^2$ for a device having a breakdown voltage $V_B$=600V. If the IGBT device does not satisfy these conditions, latch-up by the avalanche phenomenon may occur to destruct the IGBT device.

As a condition for preventing latch-up, as shown in FIG. 110, the gate voltage Vg must be decreased to the threshold voltage Vth or less before the voltage between collector and emitter electrodes 3 and 8 increases 34% or more the breakdown voltage $V_B$ upon turn-off operation.

The total length of a wiring path for gate driving is preferably 20 cm or less, and more preferably 10 cm or less in order to reduce the inductance. Note that the wiring path for gate driving means a wiring path extending from the gate pad Gp of the IGBT chip to the gate resistance Rg, the output device of the gate drive circuit 46, the output capacitor, and the gate sense emitter.

The mirror time in the MOSFET mode is preferably set as follows in accordance with the breakdown voltage $V_B$ in terms of the operation reliability.

That is, the mirror time in the MOSFET mode is 1 $\mu$s or less for a device having a breakdown voltage $V_B$=4.5 kV, 0.5 $\mu$s or less for a device having a breakdown voltage $V_B$=2.5 kV, 0.4 $\mu$s or less for a device having a breakdown voltage $V_B$=2.0 kV, and 0.15 $\mu$s or less for a device having a breakdown voltage $V_B$=600V. A mirror time of 0.15 $\mu$s or less is especially effective for a device having a breakdown voltage $V_B$=600V.

A method of driving this semiconductor device will be explained.

Assume that a gate resistance Rg and IGBT device which satisfy the above conditions are used, and the IGBT device is in the ON state.

Turn-off operation is done to shift the IGBT device from the ON state to the OFF state.

As shown in FIG. 105, the small-value gate resistance Rg steeply increases the collector voltage Vc upon turn-off operation.

In turning off the IGBT device, the voltage of the control electrode is decreased to the threshold voltage Vth of the bipolar semiconductor device or less to stop electron injection before the voltage between the collector and emitter electrodes 3 and 8 increases 34% or more the breakdown voltage $V_B$.

By stopping electron injection, as shown in FIG. 107, the impact ionization region 140 can be generated in the n-type base layer 1 immediately below the p-type base layer 4 positioned between two n-type source layers 5, unlike the prior art. At this time, electrons are generated in the impact ionization region 140, and the forward current of these electrons decreases dv/dt.

That is, according to the drive method of generating the avalanche phenomenon after stopping electron injection during turn-off operation, the impact ionization region 140 can be formed during turn-off operation to decrease dv/dt of the collector Vc, which is steep at the start of turn-off operation, and to reduce the overshoot of the collector voltage Vc. A decrease in dv/dt can substantially widen the SOA (Safe Operation Area).

As described above, according to the 23rd embodiment, the gate and the gate drive circuit 46 for supplying a drive signal to the gate sandwich the gate resistance Rg having a resistance value of 20Ω or less or (breakdown voltage $V_B/107$)Ω or less per effective area of 1 cm² for the bipolar semiconductor device. Although dv/dt of the high-voltage main voltage (collector voltage) is steep, dv/dt is decreased by decreasing the gate voltage to the threshold voltage Vth of the bipolar semiconductor device or less, and forming the impact ionization region 140 by the avalanche phenomenon during turn-off operation while preventing latch-up before the voltage between main electrodes increases 34% or more the resistance $V_B$ in turning on the bipolar semiconductor device. Therefore, the overshoot of the collector voltage Vc can be reduced.

Further, when the semiconductor device comprises a gate resistance having a resistance value of 20Ω or less for a gate charge per voltage difference Vgpp of 1V (Qg/Vgpp)=0.02 ($\mu$(C/cm²), even if the power supply system of the gate drive circuit is changed not to fall within the range of +15V to −15V, the above effects can be easily, reliably obtained.

The 23rd embodiment is particularly effective for four types of semiconductor devices which are difficult to uniformly drive by the prior art: (1) a module having chips arranged parallel inside the device, (2) a module having a four or more parallel chips, (3) a module having two or more insulating boards such as DBC boards, and (4) a semiconductor device having cold-welded modules arranged parallel.

(Other Embodiments)

The respective embodiments have exemplified turn-off operation, but the present invention is not limited to this. When the bipolar semiconductor device is turned on so as to flow the main current Ic between main electrodes, the drive method of increasing the voltage of the control electrode to the current saturation gate voltage (Vth+Ic/gm) or more may be executed before the voltage between the main electrodes decreases ½. Also in this case, current variations and vibrations between chips in the package can be suppressed, and shared voltages in series connection can be made uniform, in addition to the effects of the present invention upon turn-off operation.

The above embodiments have exemplified the planar device, but the same effects can also be obtained for a trench gate device. The present invention can be applied to devices such as a large-capacity MOSFET, BSIT (Bipolar mode SIT), and BJT (Bipolar Junction Transistor) in addition to the IGBT and IEGT. Further, the present invention can also be applied to another material such as SiC in addition to silicon.

The present invention can be variously modified within the spirit and scope of the invention.

As has been described above, the present invention can provide a semiconductor device capable of improving the stability of the current density and preventing current concentration, oscillation, and the like to improve reliability, and a drive method and drive apparatus.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A drive apparatus for a plurality of power devices, wherein the plurality of power devices are turned on about the same time in order to provide current to an object and each of the plurality of power devices has high- and low-voltage main electrodes and a control electrode, comprising a circuit for decreasing a voltage of the control electrode of each of said plurality of power devices to a voltage which is not higher than a threshold voltage of each of the plurality of power devices before a voltage between the high- and low-voltage main electrodes enters an overshoot region in case where each of the power devices is to be turned off.

2. An apparatus according to claim 1, wherein said circuit decreases the voltage of the control electrode to a voltage which is not higher than the threshold voltage before a main current flowing between the high- and low-voltage main electrodes enters in a fall time region in a case where the power device is to be turned off.

3. An apparatus according to claim 1, wherein said circuit terminates a mirror time appearing on a voltage waveform of the control electrode before a main current flowing between the high- and low-voltage main electrodes shifts to a fall time.

4. An apparatus according to claim 1, wherein said circuit decreases the voltage of the control electrode to not higher than the threshold voltage of the power device before the voltage between the high- and low-voltage main electrodes increases to ⅕ a voltage between the high- and low-voltage main electrodes in an OFF state in a case where the power device is to be turned off.

5. An apparatus according to claim 1, wherein said circuit terminates a mirror time appeared on a voltage waveform of the control electrode before the voltage between the high- and low-voltage main electrodes increases to ⅕ a voltage between the high- and low-voltage main electrodes in an OFF state in a case where the power device is to be turned off.

6. An apparatus according to claim 1, wherein said circuit controls a maximum value of a current flowing through the control electrode so as to exceed 0.04 times a main current flowing between the high- and low-voltage main electrodes in a case where the power device is to be turned off.

7. An apparatus according to claim 1, further comprising a gate resistance which is arranged between the control electrode and said circuit and has a resistance value not more than Vgpp/0.04/Ic where Vgpp is a voltage difference in gate voltage between ON and OFF states and Ic is a main current flowing between the high- and low-voltage main electrodes in the ON state.

8. An apparatus according to claim 1, wherein said circuit controls a maximum value of a current flowing through the control electrode so as to exceed $(Vbk/316)^{-2}$ times a main current flowing between the high- and low-voltage main electrodes in a case where the power device is to be turned off, where Vbk is a breakdown voltage between the high- and low-voltage main electrodes.

9. An apparatus according to claim 1, further comprising a gate resistance which is arranged between the control electrode and said circuit and has a resistance value not more than $Vgpp/(Vbk/316)^{-2}/Ic$ where Vbk is a breakdown voltage between the high- and low-voltage main electrodes, Vgpp is a voltage difference in gate voltage between ON and OFF states, and Ic is a main current flowing between the high- and low-voltage main electrodes in the ON state.

10. An apparatus according to claim 1, wherein when gm represents a transconductance of the power device, Vth represents a threshold voltage, and Ic represents a main current flowing between the high- and low-voltage main electrodes in a case where the power device is to be turned off, said circuit increases a voltage of the control electrode to a voltage which is not less than (Vth+Ic/gm) before the voltage between the high- and low-voltage main electrodes decreases ½.

11. An apparatus according to claim 1, further comprising a diode connected between the high- and low-voltage main electrodes of the power device, the diode being anti-parallel-connected to the high- and low-voltage main electrodes of the power device;

and in which a length of a current path between the high- and low-voltage main electrodes through said diode is shorter than a length of a current path between the high- and low-voltage main electrodes of the power device.

12. An apparatus according to claim 1, wherein when VB represents a breakdown voltage of the power device, said circuit decreases a voltage of the control electrode to a voltage which is not higher than a threshold voltage of the power device before the voltage between the high- and low-voltage main electrodes increases to a voltage which is not less than 34% VB in a case where the power device is to be turned off.

13. A drive apparatus for a plurality of power devices, wherein the plurality of power devices are turned on about the same time to provide current to an object and each of the plurality of power devices has high- and low-voltage main electrodes and a control electrode, wherein the drive apparatus controls a maximum value of a current flowing through the control electrode of each of said plurality of power devices so as to exceed $(Vbk/316)^{-2}$ times a main current flowing between the high- and low-voltage main electrodes in a case where each of the plurality of power devices is to be turned off, where Vbk is a breakdown voltage between the high- and low-voltage main electrodes.

14. A drive apparatus for a plurality of power devices, wherein the plurality of power devices are turned on about the same time to provide current to an object and each of which has high- and low-voltage main electrodes and a control electrode, the plurality of power devices being parallel-connected to each other, the drive apparatus comprising gate drive circuits which are respectively arranged in a plurality of device units respectively including at least one of the plurality of power devices, and supply drive signals to the control electrodes of the power devices in corresponding device units, and each of the gate drive circuits decreases a voltage of the control electrode of each of the plurality of power devices in the device unit corresponding thereto to a voltage which is not higher than a threshold voltage of each of the plurality of power devices in the device unit corresponding thereto before a voltage between the high- and low-voltage main electrodes enters an overshoot region in case where each of the power devices in the device unit corresponding thereto is to be turned off.

15. An apparatus according to claim 14, further comprising:

gate electrode portions which are respectively arranged in the plurality of device units and connected to the control electrodes of the power devices in the plurality of device units;

emitter electrode portions which are respectively arranged in the plurality of device units and connected to the low-voltage main electrodes of the power devices in the plurality of device units;

collector electrode portions which are respectively arranged in the plurality of device units and connected to the high-voltage main electrodes of the power devices in the plurality of device units;

a high-voltage terminal commonly connected to said collector electrode portions; and a low-voltage terminal commonly connected to said emitter electrode portions.

16. An apparatus according to claim 14, wherein the plurality of device units are DC-separated from each other.

17. An apparatus according to 16, wherein the plurality of device units respectively comprises a photocoupler for DC-separating from other device units.

18. An apparatus according to claim 14, wherein positions of pads for the control electrodes of the plurality of power devices included in the plurality of device units are different from each other.

19. An apparatus according to claim 14, wherein the plurality of device units and said gate drive circuits are respectively formed on board modules.

20. A drive apparatus according to claim 14, wherein each of the plurality of device units includes a plurality of power devices.

21. A drive apparatus for a plurality of power devices, wherein the plurality of power devices are turned on about the same time to provide current to an object and each of which has high- and low-voltage main electrodes and a control electrode, the plurality of power devices being parallel-connected to each other, the drive apparatus comprising gate drive circuits which are respectively arranged in a plurality of device units respectively including at least one of the plurality of power devices, and supply drive signals to the control electrodes of the power devices in corresponding device units, the respective drive circuit decreases a voltage of the control electrodes in a corresponding device unit to a voltage which is not higher than a threshold voltage of the power device before a voltage between the high- and low-voltage main electrodes enters an overshoot region in a case where the power device is to be turned off.

* * * * *